(12) United States Patent
Nakao

(10) Patent No.: US 6,331,846 B1
(45) Date of Patent: Dec. 18, 2001

(54) DIFFERENTIAL AMPLIFIER, OPERATIONAL AMPLIFIER EMPLOYING THE SAME, AND LIQUID CRYSTAL DRIVING CIRCUIT INCORPORATING THE OPERATIONAL AMPLIFIER

(75) Inventor: Tomoaki Nakao, Yamatokoriyama (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/291,282

(22) Filed: Apr. 14, 1999

(30) Foreign Application Priority Data

Apr. 17, 1998 (JP) .................................. 10-108273

(51) Int. Cl.[7] .................................................. G09G 3/36
(52) U.S. Cl. .............................................. 345/96; 330/252
(58) Field of Search .................................. 345/96, 91, 90, 345/88, 87, 104; 330/252, 258

(56) References Cited

U.S. PATENT DOCUMENTS

| | | | |
|---|---|---|---|
| 3,586,988 | * 6/1971 | Weekes | 330/253 |
| 3,594,654 | * 7/1971 | Hasenbalg | 330/258 |
| 3,754,193 | * 8/1973 | Reinhard | 330/261 |
| 4,088,962 | * 5/1978 | Trilling | 330/261 |
| 5,095,282 | * 3/1992 | Dayton | 330/69 |
| 5,293,169 | * 3/1994 | Baumgartner et al. | 341/172 |
| 5,337,091 | * 8/1994 | Harford et al. | 348/737 |
| 5,706,024 | * 1/1998 | Park | 345/96 |
| 5,724,057 | * 3/1998 | Kimura et al. | 345/96 |
| 5,892,494 | * 4/1999 | Kimura et al. | 345/96 |
| 5,894,284 | * 4/1999 | Garrity et al. | 341/172 |
| 6,140,876 | * 10/2000 | Yero | 330/253 |

* cited by examiner

*Primary Examiner*—Richard Hjerpe
*Assistant Examiner*—Ronald Laneau

(57) ABSTRACT

An incidental offset voltage caused by discrepancies in material and workmanship can be averaged by (1) using two input transistors of a differential amplifier alternately, and (2) switching output signals from both the input transistors through two switches provided to an output end. Consequently, a downsized, less-power-consuming, highly-reliable differential amplifier which is insensitive to an incidental offset voltage caused by discrepancies in material and workmanship can be provided. Also, by employing such a differential amplifier, a less-power-consuming and highly reliable operational amplifier and a liquid crystal driving circuit capable of showing display of an upgraded quality can be realized.

33 Claims, 46 Drawing Sheets

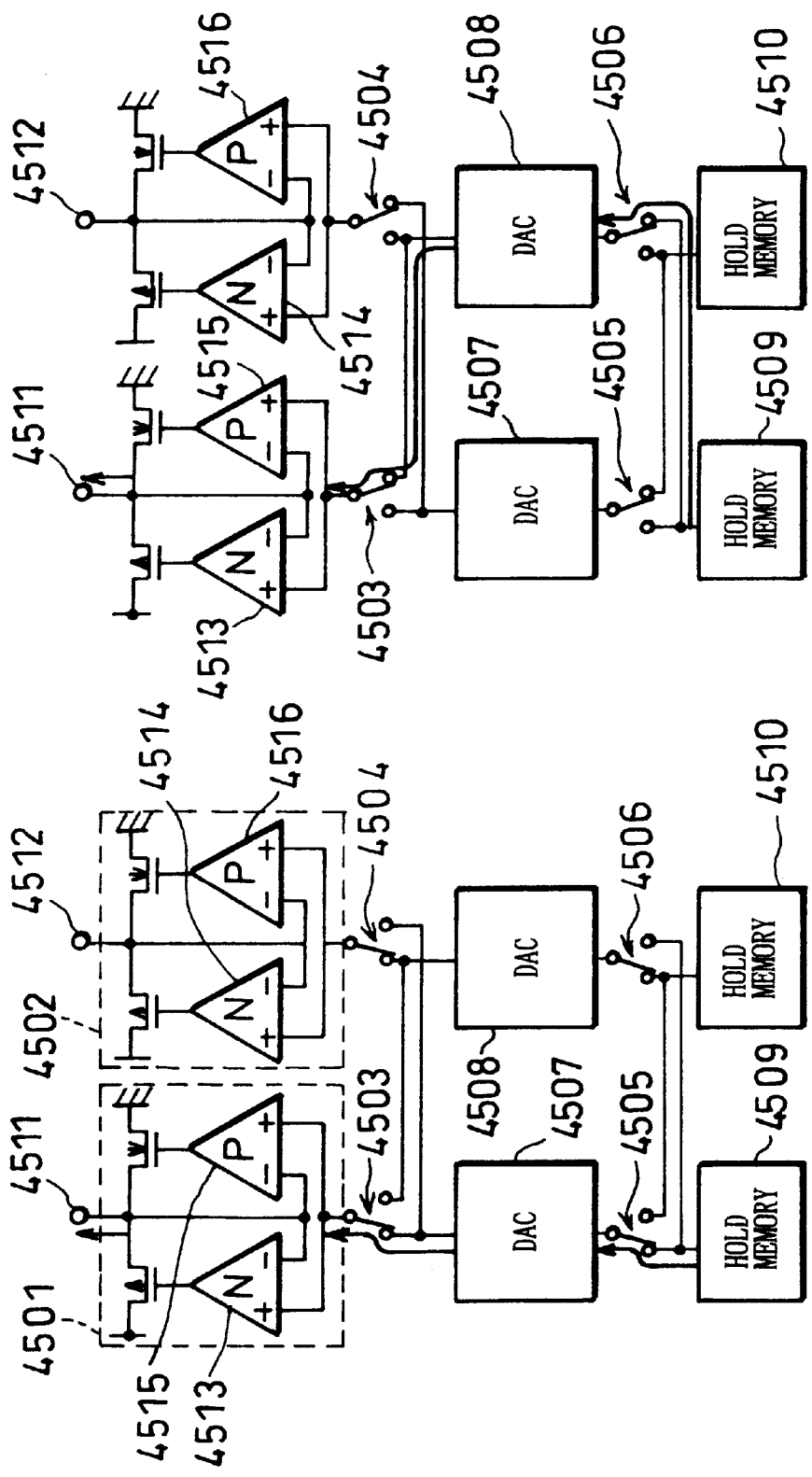

DIFFERENTIAL AMPLIFIER, OPERATIONAL AMPLIFIER EMPLOYING THE SAME, AND LIQUID CRYSTAL DRIVING CIRCUIT INCORPORATING THE OPERATIONAL AMPLIFIER

FIELD OF THE INVENTION

The present invention relates to a downsized less-power-consuming differential amplifier which is insensitive to an incidental offset voltage caused by discrepancies in material and workmanship. The present invention also relates to an operational amplifier employing such a differential amplifier and a liquid crystal driving circuit incorporating such an operational amplifier.

BACKGROUND OF THE INVENTION

FIG. 37 is a block diagram of an example of a conventional TFT liquid crystal display representing liquid crystal displays of an active matrix method. Numeral 3801 denotes a TFT liquid crystal panel, numeral 3802 denotes a source driver IC having a plurality of source drivers, numeral 3803 denotes a gate driver IC having a plurality of gate drivers, numeral 3804 denotes a controller, and numeral 3805 denotes a liquid crystal driving power source (power source circuit).

The controller 3804 sends a vertical synchronizing signal to the gate driver IC 3803, and a horizontal synchronizing signal to both the source driver IC 3802 and gate driver IC 3803. Display data inputted from the outside are entered into the source driver IC 3802 through the controller 3804 in the form of a digital signal. The source driver IC 3802 latches the input display data in a time-sharing method. Then, the source driver IC 3802 converts the digital signal to an analog signal in sync with the horizontal synchronizing signal from the controller 3804 and outputs the analog voltage from a liquid crystal driving output terminal to be used for gradation display.

FIG. 38 shows an arrangement of the TFT liquid crystal panel. Numeral 3901 denotes a pixel electrode, numeral 3902 denotes a pixel capacitance, numeral 3903 denotes a TFT (switching element), numeral 3904 denotes a source signal line, numeral 3905 denotes a gate signal line, and numeral 3906 denotes a counter electrode.

The source signal line 3904 is supplied with a gradation display voltage from the source driver IC 3802, which varies in response to brightness of a display pixel. The gate signal line 3905 is supplied with a scanning signal from the gate driver IC 3803, whereby vertically aligned TFTs 3903 are successively turned ON. Through the TFT 3903 which stays ON, a voltage supplied to the source signal line 294 is applied to the pixel electrode 3901 connected to the drain of that particular TFT 3903. The applied voltage is accumulated in the pixel capacitance 3902 between the TFT 3903 and counter electrode 3906, in response to which light transmittance of the liquid crystal varies. Accordingly, display in accordance with the variance of the light transmittance is shown.

Examples of a liquid crystal driving waveform are shown in FIGS. 39 and 40. Numerals 4001 and 4101 represent driving waveforms of the source driver, numerals 4002 and 4102 represent driving waveforms of the source driver, and numerals 4003 and 4103 indicate potentials of the counter electrode, and numerals 4004 and 4104 represent voltage waveforms of the pixel electrode.

A voltage applied to the liquid crystal material is a potential difference between the pixel electrode 3901 and counter electrode 3906, which is indicated as a shaded portion in the drawings. The liquid crystal panel has to be driven by an alternating voltage to ensure long-term reliability. FIG. 39 shows a case where the TFT 3903 is turned ON by an output from the gate driver when an output voltage of the source driver is higher than a voltage of the counter electrode. Thus, a positive voltage with respect to the counter electrode 3906 is applied to the pixel electrode 3901.

FIG. 41 shows an example of a polarity alignment on the liquid crystal panel 3801 to obtain an alternating driving voltage. This example is based on so-called dot-inverting driving, and positive polarities and negative polarities are aligned vertically and horizontally in an alternating sequence on one screen (frame), and each polarity is inverted per frame. According to this method, in the source driver IC 3802, when odd-numbered output terminals output positive voltages, even-numbered output terminals output negative voltages. Conversely, when the odd-numbered output terminals output negative voltages, even-numbered output terminals output positive voltages.

FIG. 42 shows an example driving waveform of the source driver by dot-inverting driving. In the drawing, numeral 4301 represents an output voltage waveform of the odd-numbered output terminals, numeral 4302 represents an output voltage waveform of the even-numbered output terminal, and numeral 4303 represents a voltage of the counter electrode 3906. As shown in the drawing, the odd-numbered output terminal and even-numbered terminal constantly output voltages of opposite polarities with respect to the counter electrode 3906.

FIG. 43 shows a block diagram of an example arrangement of the source driver IC 3802. The display data (R,G,B) inputted in the form of a digital signal is time-shared based on an operation of a shift register 4403, stored into a sampling memory 4404, and transferred collectively to a hold memory 4405 at the timing of a horizontal synchronizing signal. The shift register 4403 is designed to operate based on a start pulse and a clock (CK). The data in the hold memory 4405 are converted to an analog voltage by a digital-to-analog converter (DAC) 4407 through a level shifter 4406, and outputted as a gray scale display driving voltage (liquid crystal driving voltage) from an output circuit 4408 through a liquid crystal driving output terminal.

FIGS. 44(*a*) and 44(*b*) show a block diagram and an operation of an example output circuit of a source driver IC which carries out dot-inverting driving in accordance with a prior art (first prior art). In these drawings, blocks denoted by numerals 4405, 4407 and 4408 in FIG. 43 are illustrated as 2-output terminal circuits.

In these drawings, numeral 4501 denotes a voltage follower which is an output circuit employing an operational amplifier to drive the odd-numbered output terminal, numeral 4502 denotes a voltage follower which is an output circuit employing an operational amplifier identical with the one used for the output circuit 4501 to drive the even-numbered output terminal, numerals 4503, 4504, 4505, and 4506 denote output alternating switches which switch the polarity of the output voltage of a liquid crystal driving output, numeral 4507 denotes a digital-to-analog converter which converts a digital signal of a positive voltage to an analog signal, numeral 4508 denotes another digital-to-analog converter which converts a digital signal of a negative voltage to an analog signal, numerals 4509 and 4510 denote hold memories which withhold display data, numeral 4511 denotes an odd-numbered output terminal, and numeral 4512 denotes an even-numbered output terminal.

Numeral 4513 in the operational amplifier 4501 and numeral 4514 in the operational amplifier 4502 denote operational amplifiers with N-channel MOS inputs, and numeral 4515 in the operational amplifier 4501 and numeral 4516 in the operational amplifier 4502 denote operational amplifiers with P-channel MOS inputs.

The following will explain a method of alternating the liquid crystal driving waveforms by the above-arranged circuits.

When the output alternating switches 4503 through 4506 are in the state shown in FIG. 44(a), the display data for the odd-numbered output terminal 4511 stored in the hold memory 4509 are inputted to the positive digital-to-analog converter 4507. The resulting analog voltage is outputted to the liquid crystal panel 3801 from the odd-numbered output terminal 4511 through the voltage follower 4501. The output voltage thus obtained is used as a positive liquid crystal driving voltage.

In contrast, when the output alternating switches 4503 through 4506 are in the state shown in FIG. 44(b), the display data for the odd-numbered output terminal 4511 stored in the hold memory 4509 are inputted to the negative digital-to-analog converter 4508. The resulting analog voltage is outputted to the liquid crystal panel 3801 from the odd-numbered output terminal 4511 through the voltage follower 4501. The output voltage thus obtained is used as a negative liquid crystal driving voltage.

A polarity of the driving voltage of the even-numbered output terminal 4512 is opposite to that of the odd-numbered output terminal 4511. More specifically, when the output alternating switches 4503 through 4506 are in the state shown in FIG. 44(a), the display data for the even-numbered output terminal 4512 stored in the hold memory 4510 are inputted into the negative digital-to-analog converter 4508, and the resulting analog voltage is outputted to the liquid crystal panel 3801 from the even-numbered output terminal 4512 through the voltage follower 4502. The output voltage thus obtained is used as a negative liquid crystal driving voltage.

In contrast, when the output alternating switches 4503 through 4506 are in the state shown in FIG. 44(b), the display data for the even-numbered output terminal 4512 stored in the hold memory 4510 are inputted into the positive digital-to-analog converter 4507, and the resulting analog voltage is outputted to the liquid crystal panel 3801 from the even-numbered output terminal 4512 through the voltage follower 4502. The output voltage thus obtained is used as a positive liquid crystal driving voltage. Of all these actions, FIGS. 44(a) and 44(b) show the flow of a signal for the odd-numbered output terminal. By switching the state of FIG. 44(a) to the state of FIG. 44(b) and vice versa alternately per frame using the output alternating switches 4503 through 4506, a driving waveform necessary to drive the liquid crystal panel 3801 is converted to an alternating waveform.

In the circuit diagram shown in FIGS. 44(a) and 44(b), one output terminal is constantly driven by the same operational amplifier whether an output voltage is positive or negative. Generally, as one of the essential requirements, the output terminal of the liquid crystal driving circuit must have an output dynamic range for a full range of an operating power source voltage. Assume that the above-arranged circuits are incorporated in an enhancement mode MOS transistor employed in a general LSI. Then, to eliminate an operation disable area caused by a threshold voltage, the output circuit 4501 must have two operational amplifier 4513 with the N-channel MOS input and the operational amplifier 4515 with the P-channel MOS input. Thus, the circuit is upsized undesirably, thereby increasing a chip size of the LSI incorporating the same. Further, having two operational amplifiers for each output increases power consumption.

FIGS. 45(a) and 45(b) show a block diagram and an operation of an example output circuit of a source driver IC which carries out dot-inverting driving in accordance with another prior art (second prior art). In these drawings, blocks denoted by numerals 4405, 4407 and 4408 in FIG. 43 are illustrated as 2-output terminal circuits.

In these drawings, numeral 4601 denotes a voltage follower employing an operational amplifier with an N-channel MOS transistor input, numeral 4602 denotes a voltage follower employing an operational amplifier with a P-channel MOS transistor input, numerals 4603, 4604, 4605, and 4606 denote output alternating switches which switch a polarity of the output voltage of a liquid crystal driving output, numeral 4607 denotes a digital-to-analog converter which converts a digital signal of a positive voltage to an analog signal, numeral 4608 denotes another digital-to-analog converter which converts a digital signal of a negative voltage to an analog signal, numerals 4609 and 4610 denote hold memories for withholding display data, numeral 4611 denotes an odd-numbered output terminal, and numeral 4612 denotes an even-numbered output terminal.

The output voltage of FIGS. 45(a) and 45(b) is converted to an alternating voltage by the output alternating switches 4603 through 4606 in the same manner as the case in FIGS. 44(a) and 44(b) except for the following point. That is, an output from the positive digital-to-analog converter 4607 is sent directly to the operational amplifier 4601 with the N-channel MOS transistor input, while an output from the negative digital-to-analog converter 4608 is sent directly to the operational amplifier 4602 with the P-channel MOS transistor input, so that an output from each operational amplifier is sent to a desired output terminal through the switches 4603 and 4604.

Since the positive digital-to-analog converter 4607 outputs the half or more of the operating power source voltage, a circuit with an N-channel input circuit alone is used satisfactorily as the operational amplifier. Likewise, since the negative digital-to-analog converter 4608 outputs not more than half the operating power source voltage, a circuit with a P-channel input alone is used satisfactorily as the operational amplifier. According to the arrangement shown in FIGS. 45(a) and 45(b), the number of the operational amplifiers for each output terminal can be reduced to half compared with the arrangement shown in FIGS. 44(a) and 44(b), thereby making it possible to downsize the chip and save power consumption.

However, according to the arrangement shown in FIGS. 45(a) and 45(b), different operational amplifiers are used to drive an output of different polarities. To be more specific, the liquid crystal driving output terminal of FIGS. 45(a) and 45(b) is driven by the operational amplifier 4601 when it outputs a positive voltage (see FIG. 45(a)), while the same is driven by the operational amplifier 4602 when it outputs a negative voltage (see FIG. 45(b)). So, the following will explain a case where the operational amplifiers 4601 and 4602 have an incidental offset voltage caused by discrepancies in material and workmanship and the like.

FIG. 46 shows a liquid crystal driving voltage waveform in a case where the operational amplifier 4601 has an incidental offset voltage A and the operational amplifier 4602 has an incidental offset voltage B. As can be seen in the drawing, a deviation of the positive output voltage and a deviation of the negative output voltage from an expected value voltage are different. Thus, a component equal to a difference between two deviations (=(A−B)/2) remains as an error voltage in an average voltage of the driving voltages applied to the liquid crystal display pixel. The error voltage occurs incidentally for each driving output terminal, and results in a difference in applied voltages among the pixels of the liquid crystal display, thereby causing irregularities on display.

For purposes of comparison, a liquid crystal driving voltage waveform shaped by the arrangement shown in FIGS. 44(*a*) and 44(*b*) is illustrated in FIG. 47. According to the arrangement shown in FIGS. 44(*a*) and 44(*b*), each of the positive voltage and negative voltage is driven by a single output circuit, and for this reason, a deviation from the expected value voltage is the same. The deviations in the form of positive and negative voltages applied to the pixel are oriented to directions such that cancel out each other. Thus, according to the arrangement shown in FIGS. 44(*a*) and 44(*b*), differences in deviations among the liquid crystal driving output terminals average on the display pixel, thereby causing no problem for display.

According to the first prior art shown in FIGS. 44(*a*) and 44(*b*), an output terminal is constantly driven by the same operational amplifier whether the output voltage is positive or negative. Generally, as one of the essential requirements, the output terminal of the liquid crystal driving circuit must have an output dynamic range for a full range of an operating power source voltage.

However, in case that the first prior art is adopted for an enhancement mode MOS transistor used for a typical LSI, as shown in FIGS. 44(*a*) and 44(*b*), in order to eliminate an operation disable area caused by a threshold voltage, one output circuit 4501 must include two operational amplifiers: the operational amplifier 4513 with the N-channel MOS input and the operational amplifier 4515 with the P-channel MOS input. As a result, the circuit is undesirably upsized, and when it is fabricated into an LSI, the chip is upsized accordingly. Further, since the two operational amplifiers are necessary for each output circuit, there arises a problem that the circuit consumes more power.

In contrast, according to the second prior art, different operational amplifiers are used to drive the positive voltage and negative voltage. Thus, if the operational amplifiers have an incidental offset voltage caused by discrepancies in material and workmanship, deviations from the expected value voltage differ between the positive voltage and negative voltage. Hence, a component equal to a difference between two deviations remains as an error voltage in an average voltage of the driving voltages which will be applied to the liquid crystal display pixel. Since the error voltage occurs incidentally for each driving output terminal, it results in a difference in applied voltages between the pixels, thereby causing irregularities on display.

SUMMARY OF THE INVENTION

It is therefore an object of the present invention to provide (1) a reliable, downsized, and less-power-consuming differential amplifier which is insensitive to an incidental offset voltage caused by discrepancies in material and workmanship, (2) an operational amplifier employing the same, and (3) a liquid crystal driving circuit incorporating such an operational amplifier.

A differential amplifier of the present invention is a differential circuit for amplifying two kinds of input signals including a common mode input signal and a differential mode input signal, and to fulfill the above and other objects, it is characterized by being provided with:

first and second amplifiers for amplifying the two kinds of input signals; and a control section for selectively switching the two kinds of input signals to be inputted to the first and second amplifiers, the control section also outputting the commonmode input signal amplified by one of the first and second amplifiers as a differential mode output signal and the differential mode input signal amplified by the other amplifier as a common mode output signal.

According to the above arrangement, input ends of the common mode input signal and differential mode input signal are selectively switched by the control section. To be more specific, the control section operates in such a manner that, when the common mode input signal is inputted to one of the first and second amplifiers, the differential mode input signal is inputted to the other amplifier.

The common mode input signal and differential mode input signal are amplified by the above amplifiers and outputted as output signals, during which the first and second amplifiers are controlled by the control section as follows. That is, an amplified common mode input signal is outputted as a differential mode output signal from one of the first and second amplifiers, while an amplified differential mode input signal is outputted as a common mode output signal from the other amplifier.

Incidentally, the first and second amplifiers ideally have the identical characteristics. But when discrepancies in material and workmanship cause a difference between the first and second amplifiers, an offset voltage is produced in the output signal. Such an offset can formulate a model on the assumption that a constant voltage source is connected to one of the input signals.

However, according to the above arrangement, as has been explained, the common mode input signal and differential mode input signal are selectively switched by the control section, and the common mode input signal amplified by one of the first and second amplifiers is outputted as the differential mode output signal while the differential mode input signal amplified by the other amplifier is outputted as the common mode output signal. Consequently, an offset voltage produced in the common mode output signal and an offset voltage produced in the differential mode output signal are opposite in polarities and equal in absolute value. Hence, an offset component can be eliminated from an average voltage of these two offset voltages, thereby realizing a highly reliable differential amplifier.

For example, in case that each of said first and second amplifiers includes one input MOS transistor, the input MOS transistors of the first and second amplifiers forming a pair of source-coupled input MOS transistors, the gate of each of the input MOS transistors receives the two kinds of input signals. Further, the drain of each of the input MOS transistors is connected to a load element used as a load. The load element can be a resistor, but it is preferable that each of the load elements is composed of a MOS transistor. Finally, the MOS transistors of the load elements are connected to each other to form a current mirror structure.

According to the above arrangement, even there are characteristic discrepancies in the load elements, a current passing through each input MOS transistor is constantly the same due to the current mirror structure. Consequently, the common mode input signal and differential mode input signal are amplified by the same amplification degree, thereby shaping a symmetrical output waveform.

Since the above-arranged differential amplifier is highly reliable regardless of its small size, it can be used suitably in diversified fields. For example, it can be employed, as an input circuit, in an operational amplifier employing a differential amplifier.

Further, in such a case, in addition to the input circuit and an output circuit, it is preferable to additionally provide a power source. The power source outputs a voltage higher than a ground potential and lower than an operating power source potential of the operational amplifier, to the source of the MOS transistor in the output stage having the same channel as that of the input circuit.

According to the above arrangement, in case that an N-channel MOS is employed as an input transistor in the input circuit, for example, when used as an enhancement mode transistor used in a general LSI, it does not operate on an input voltage near the GND potential because of the threshold voltage characteristics. For this reason, when the present circuit is used as a voltage follower, it is substantially operated on an output voltage in the higher potential side, and the output transistor does not have to be connected to GND. If a voltage of the power source is set lower than the operating power source potential, when a current passes through the operational amplifier from the load, a potential difference in the current path can be reduced by a voltage of the power source compared with a case where the power source is omitted. Consequently, power generated by a current passing through the power source can be used to activate the other circuit portions, thereby making it possible to reduce a power consumption of the entire circuit.

On the other hand, in case that a P-channel MOS is employed as an input transistor in the input circuit, for example, when used as an enhancement mode transistor used in a general LSI, it does not operate on an input voltage near the power source potential because of the threshold voltage characteristics. For this reason, when the present circuit is used as a voltage follower, it is substantially operated on an output voltage in the lower potential side, and the output transistor does not have to be connected to the operating power source potential. If a voltage of the power source is set lower than the operating power source potential, when a current passes through the load from the operational amplifier, the power can be supplied from a power source set lower than the operating power source potential, thereby making it possible to reduce power consumption when driving the load.

As has been discussed, when used as a voltage follower, the present circuit can save the power consumption by connecting the source of the MOS transistor in the output stage to the power source which outputs a voltage higher than the ground potential and lower than the power source potential.

Incidentally, since the above-arranged operational amplifier is insensitive to an incidental offset voltage regardless of its small size and power consumption, it can be used suitably in diversified fields. The most preferable example would be a circuit which involves a large number of highly reliable operational amplifiers, such as a liquid crystal driving circuit. In other words, to fulfill the above and other objects, a liquid crystal driving circuit of the present invention is characterized by being furnished with:

an operational amplifier, having a CMOS structure including the above-arranged differential amplifier as an input circuit, for amplifying an input liquid crystal driving voltage; and an output alternating switching section for converting an amplified liquid crystal driving voltage to an alternating voltage by switching a polarity of the amplified liquid crystal driving voltage with a switching action of an output from the operational amplifier.

According to the above arrangement, a liquid crystal driving voltage inputted to the differential amplifier in the operational amplifier is amplified and outputted to the output alternating switching section. Then, the polarity of the amplified liquid crystal driving voltage is switched by the output alternating switching section, whereby the liquid crystal driving voltage is converted to an alternating voltage.

Generally, as one of the essential requirements, the output terminal of the liquid crystal driving circuit must have an output dynamic range for a full range of an operating power source voltage. When used as an enhancement mode MOS transistor used in a general LSI, one output circuit must have both an amplifier with an N-channel MOS input and an amplifier with a P-channel MOS input to eliminate an operation disable area caused by the threshold voltage. This undesirably upsizes the circuit, thereby increasing a chip size when incorporated into an LSI. Moreover, since each output is provided with two operational amplifiers, the power consumption of the entire circuit is increased.

However, according to the above arrangement, an amplified liquid crystal driving voltage is outputted from the operation amplifier of the CMOS structure having the differential amplifier of the present invention as an input circuit, and the polarity of the amplified liquid crystal driving voltage is switched by the output alternating switching section, thereby converting the liquid crystal driving voltage to an alternating voltage. Consequently, a high-quality liquid crystal display can be realized without using the output operational amplifier of a full dynamic range, and compared with an output circuit of a full dynamic range, a compact, inexpensive liquid crystal driving circuit can be provided. By employing such a liquid crystal driving circuit, a low power consuming liquid crystal display can be assembled.

Moreover, unlike the conventional case, it is not necessary to provide both the amplifier with an N-channel MOS input and the amplifier with a P-channel MOS input to each output circuit. Thus, the circuit size can be decreased, and when incorporated into an LSI, the chip size can be maintained. Further, in regard to the amplifier, since only one circuit is necessary for each output circuit, the power consumption of the entire circuit can be reduced to half compared with a case where two circuits are necessary.

Further, when used for a circuit required to have a high driving performance, such as a liquid crystal driving circuit, it is preferable that the above-arranged operational amplifier is provided with a power source which outputs a voltage lower than an operating power source of the operational amplifier. In this case, the operational amplifier starts to operate as a voltage follower when a voltage equal to a voltage applied to the source of the MOS transistor in the output stage is inputted to the differential amplifier. Thus, when a current passes from the operational amplifier to the load, the power is supplied to the load from the power source. Consequently, it has become possible to provide a liquid crystal driving circuit capable of further saving the power consumption when driving the load.

Also, instead of providing the power source, the liquid crystal driving circuit may be arranged in the following manner. That is, the liquid crystal driving circuit includes a switching section for selectively switching between a liquid crystal driving voltage and a counter electrode voltage applied to a counter electrode of a liquid crystal panel to be supplied to the differential amplifier of the operational amplifier;

the counter electrode voltage is applied to a source of the MOS transistor in the output stage; and the output alternating switching section converts the amplified liquid crystal driving voltage to an alternating voltage by switching the polarity of the amplified liquid crystal driving voltage in such a manner that, when the counter electrode voltage is inputted to the differential amplifier by the switching section, charges migrate between adjacent load capacitances in the liquid crystal panel and the counter electrode voltage, and when the liquid crystal driving voltage is inputted to the differential amplifier by the switching section, the charges migrate between the adjacent load capacitances and an operating power source of the operational amplifier.

According to the above arrangement, the operational amplifier starts to operate as a voltage follower when the counter electrode voltage is inputted to the differential amplifier by the switching action of the switching section, whereby a counter electrode voltage is outputted. Hence, the charges are charged/released as the charges migrate between the counter electrode voltage and two adjacent load capacitances of the liquid crystal panel. The charges migrate (charged/released) in directions such that cancel out each other when considered as the directions along which the counter electrode voltage is inputted and outputted. Hence, no power is consumed with a transient current. Also, when the charges are stabilized, a voltage of the load capacitance is used as the counter electrode voltage.

On the other hand, when the liquid crystal driving voltage is inputted to the differential amplifier by the switching action of the switching section, the charges are charged/released in such a manner that the charges migrate between the adjacent load capacitances and the operating power source of the operational amplifier.

Also, according to the above arrangement, since the counter electrode is used, an existing power source can be used commonly. In other words, since no additional power source is necessary, the space can be further saved.

As has been discussed above, the power stored in the load capacitance can be collected temporarily to a voltage source having the counter electrode voltage, so that it can be used for the other circuits or used for the liquid crystal driving circuit itself later, thereby realizing a low-power-consuming liquid crystal display.

For a fuller understanding of the nature and advantages of the invention, reference should be made to the ensuing detailed description taken in conjunction with the accompanying drawings.

BRIEF DESCRIPTION OF THE DRAWINGS

FIGS. 44(*a*) and 44(*b*) are block diagrams showing source driver IC output circuits which carry out dot-inverting driving of the first prior art;

DESCRIPTION OF THE EMBODIMENTS

The following description will describe example embodiments of the present invention.

Figure 1:
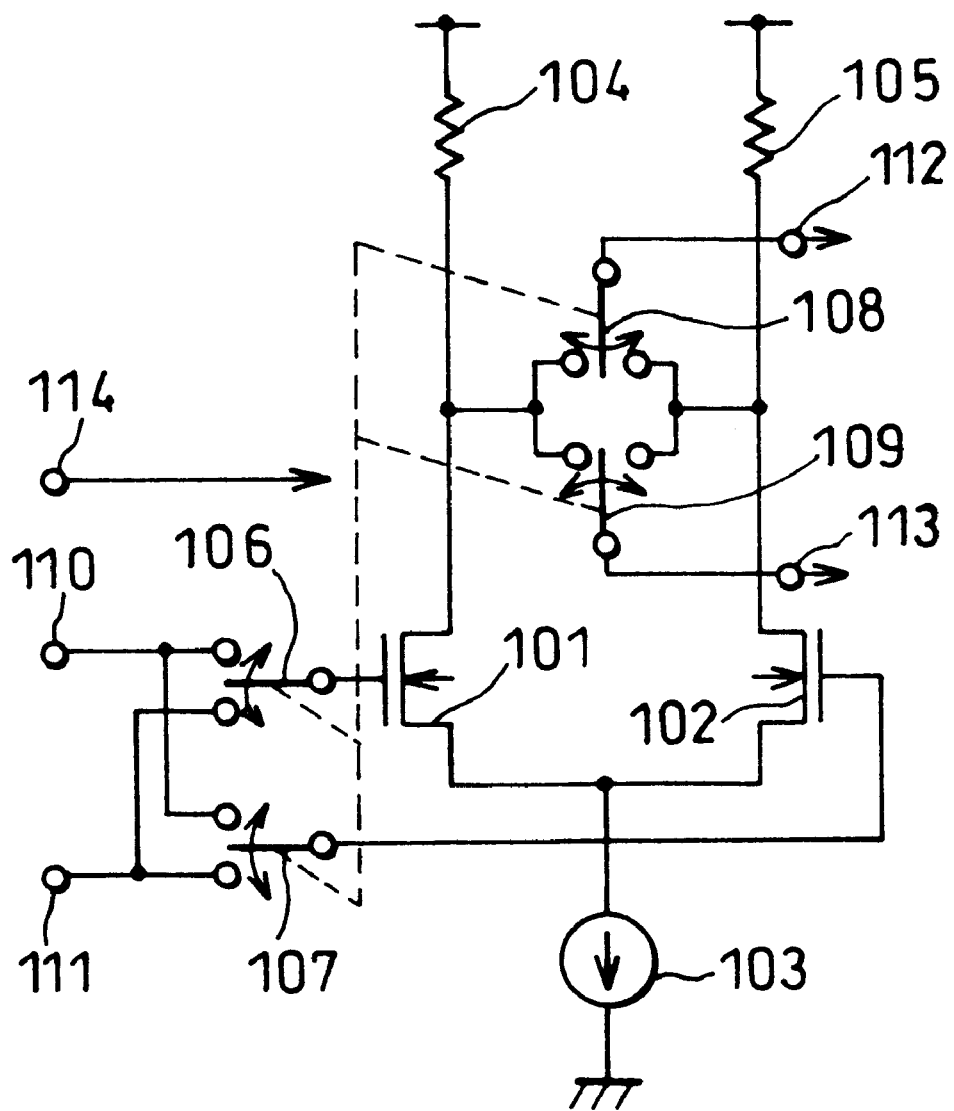
FIG. 1 is a circuit diagram depicting an arrangement of a differential amplifier in accordance with a first embodiment of the present invention, and a case where N-channel MOS transistors are used as input transistors.

FIG. 1 shows a differential amplifier in accordance with a first embodiment of the present invention. FIG. 1 shows a case where N-channel MOS transistors are used as input transistors.

In the drawing, numerals 101 and 102 denote input transistors of N-channel MOS, numeral 103 denotes a constant current source for supplying an operating current to the differential amplifier, numeral 104 denotes a load resistor (resistor element) of the input transistor 101, numeral 105 denotes a load resistor (resistor element) of the input transistor 102, numerals 106 and 107 denote switches which switch input signals, numerals 108 and 109 denote switches which switch output signals, numeral 110 denotes a common mode input terminal, numeral 111 denotes a differential mode input terminal, numeral 112 denotes a common mode output terminal, numeral 113 denotes a differential mode output terminal, and numeral 114 denotes a switching signal input terminal which switches the switches 106 through 109 simultaneously.

The input transistor 101 and load resistor 104 constitute an amplifier set forth in claim 1, and the input transistor 102 and load resistor 105 constitute another amplifier set forth in claim 1. Also, the switches 106 through 109 constitute control means set forth in claim 1.

Figure 2:
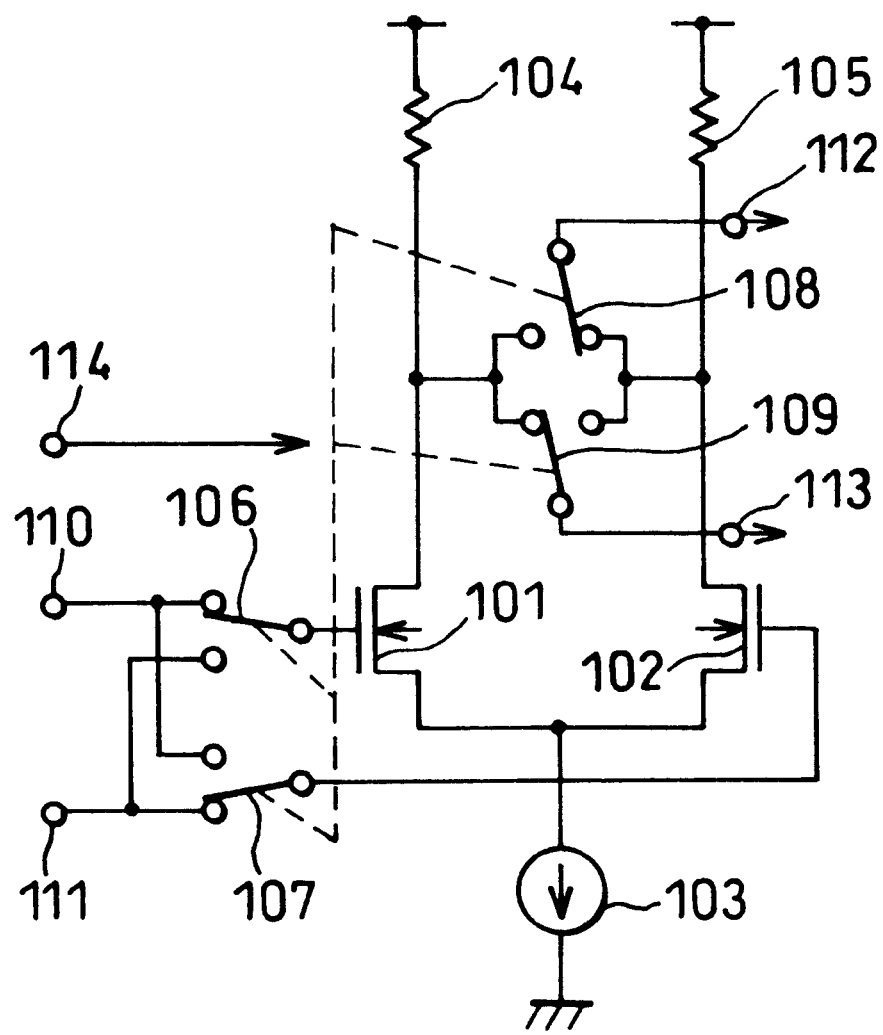
FIG. 2 is a view explaining an operation of the differential amplifier.
Figure 3:
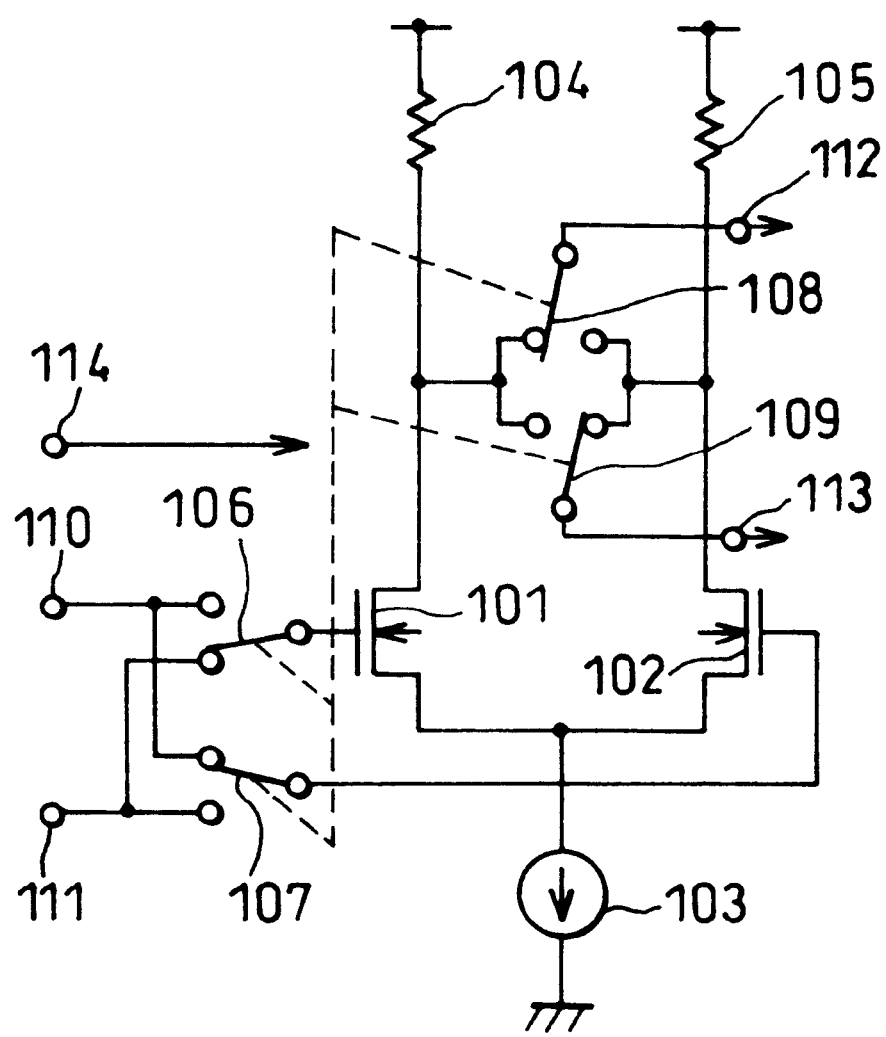
FIG. 3 is a view explaining another operation of the differential amplifier.

FIG. 2 shows an operating state of the circuit of FIG. 1, and FIG. 3 shows another operating state of the circuit of FIG. 1. The following will explain an operation of the differential amplifier with reference to FIGS. 2 and 3.

In the state shown in FIG. 2, the common mode input terminal 110 is connected to the gate of the input transistor 101 through the switch 106, and a differential mode output signal is outputted from the differential mode output terminal 113 through the switch 109 by the load resistor 104 connected to the drain of the input transistor 101. On the other hand, the differential mode input terminal 111 is connected to the gate of the input transistor 102 through the switch 107, and a common mode output signal is outputted from the common mode output terminal 112 through the switch 108 by the load resistor 105 connected to the drain of the input transistor 102. In other words, a common mode input signal is amplified by the input transistor 101 and load resistor 104, while a differential mode input signal is amplified by the input transistor 102 and load transistor 105.

Contrary, in the state shown in FIG. 3, the common mode input terminal 110 is connected to the gate of the input transistor 102 through the switch 107, and a differential mode output signal is outputted from the differential mode output terminal 113 through the switch 109 by the load resistor 105 connected to the drain of the input transistor 102. On the other hand, the differential mode input terminal 111 is connected to the gate of the input transistor 101 through the switch 106, and a common mode output signal is outputted from the common mode output terminal 112 through the switch 108 by the load resistor 104 connected to the drain of the input transistor 101. In other words, a common mode input signal is amplified by the input transistor 102 and load resistor 105, while a differential mode input signal is amplified by the input transistor 101 and load transistor 104.

As has been explained, in the states respectively shown in FIGS. 2 and 3, the amplifier for the common mode input signal and the amplifier for the differential mode input signal are switched to one from the other.

Figure 4:
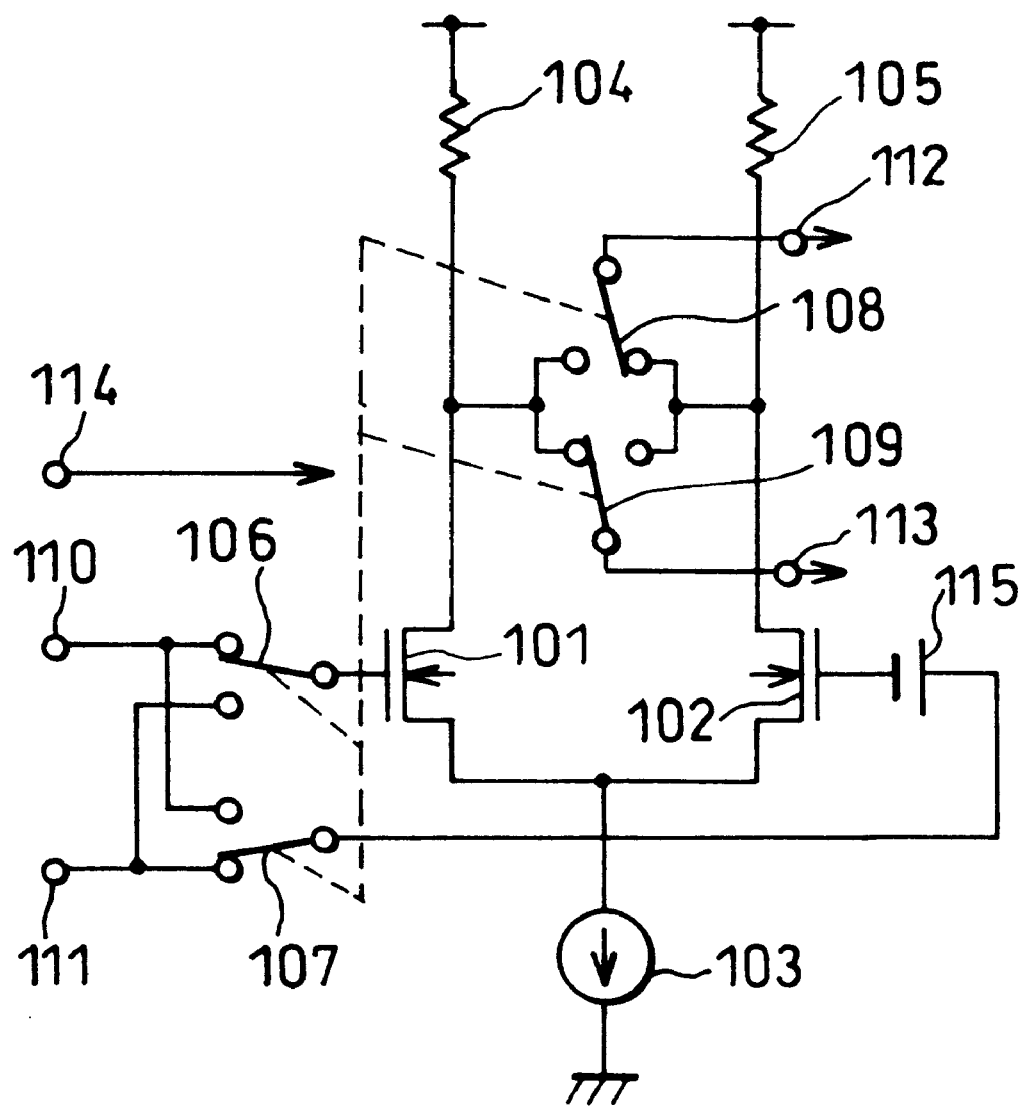
FIG. 4 is a view explaining an operation when discrepancies in material and workmanship cause incidental characteristic discrepancies somewhere between transistors and/or load resistors forming the differential amplifier of FIG. 2.
Figure 5:
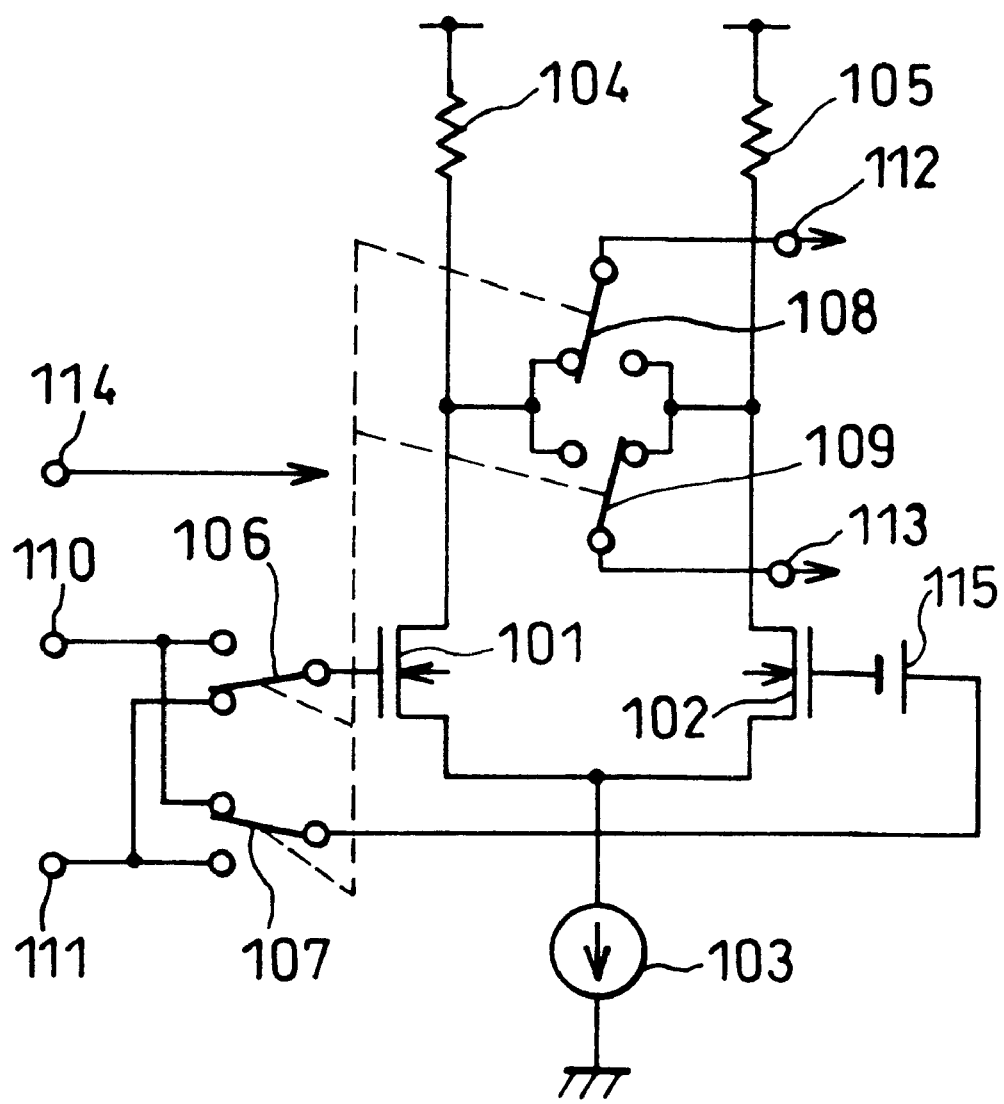
FIG. 5 is a view explaining an operation when discrepancies in material and workmanship cause incidental characteristic discrepancies somewhere between transistors and/or load resistors forming the differential amplifier of FIG. 3.

The following will explain, with reference to FIGS. 4 and 5, a case where discrepancies in material and workmanship cause incidental characteristic discrepancies somewhere between the input transistors 101 and 102 and/or load resistors 104 and 105 which constitute the differential amplifier.

When a difference is produced between two elements in the differential amplifier, which ideally have the identical characteristics, an actual output voltage differs from an ideal output voltage, thereby causing an offset voltage. Such a difference can formulate a model as illustrated in FIGS. 4 and 5 on the assumption that a constant voltage source is connected to one of the input terminals. In the drawings, numeral 115 denotes a constant voltage source as a model formulated from the offset voltage of the differential amplifier. The switch elements shown in FIG. 4 are in the same state as that shown in FIG. 2, and the switch elements shown in FIG. 5 are in the same state as that shown in FIG. 3.

In FIG. 4, the constant voltage source 115 is connected to the differential mode input terminal 111 through the switch 107. On the other hand, in FIG. 5, the constant voltage source 115 is connected to the common mode input terminal 110 through the switch 107. Since the present differential amplifier uses the switches 106 through 109 in this manner, an offset voltage caused by incidental discrepancies of the differential amplifier can be switched between the states where the offset voltage is switched to the side of the differential mode input terminal 111 and to the side of the common mode input terminal 110. The offset voltages caused at the common mode output terminal 110 and differential mode output terminal 111 under these two states have opposite signs and an identical absolute value.

As has been discussed, even if the operational amplifier has an incidental offset voltage caused by the discrepancies in material and workmanship, a deviation from the expected value voltage is the same when outputting a positive voltage and a negative voltage. Hence, a component equal to a difference between two deviations does not remain as an error voltage in an average voltage of the driving voltages applied to the liquid crystal display pixel. Consequently, when the above-arranged operational amplifier is used as the liquid crystal driving circuit, the incidental offset voltage does not come out as a difference in an applied voltage between the pixels of the liquid crystal display, thereby eliminating irregular display in a reliable manner.

Figure 6:
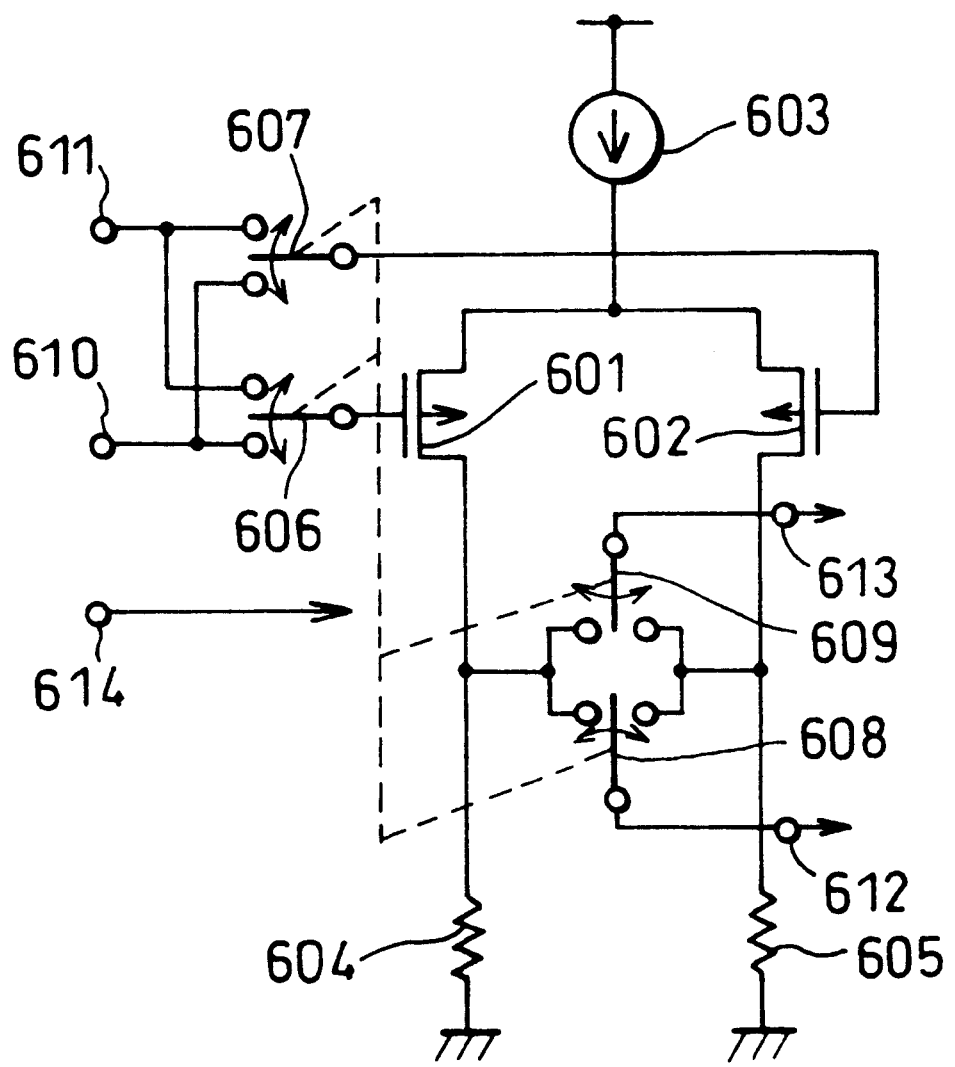
FIG. 6 is a circuit diagram showing an arrangement of a differential amplifier in accordance with a second embodiment of the present invention, and a case where P-channel MOS transistors are used as input transistors.

FIG. 6 shows a differential amplifier in accordance with a second embodiment of the present invention. FIG. 6 shows a case where P-channel MOS transistors are used as input transistors.

In the drawing, numerals 601 and 602 denote input transistors of P-channel MOS, numeral 603 denotes a constant current source which supplies an operating current to the present differential amplifier, numeral 604 denotes a load resistor (resistor element) of the input transistor 601, numeral 605 denotes a load resistor (resistor element) of the input transistor 602, numerals 606 and 607 denote switches which switch input signals, numerals 608 and 609 denote switches which switch output signals, numeral 610 denotes a common mode input terminal, numeral 611 denotes a differential mode input terminal, numeral 612 denotes a common mode output terminal, numeral 613 denotes a differential mode output terminal, and numeral 614 denotes a switching signal input terminal which receives a signal that switches the switches 606 through 609 simultaneously.

Figure 7:
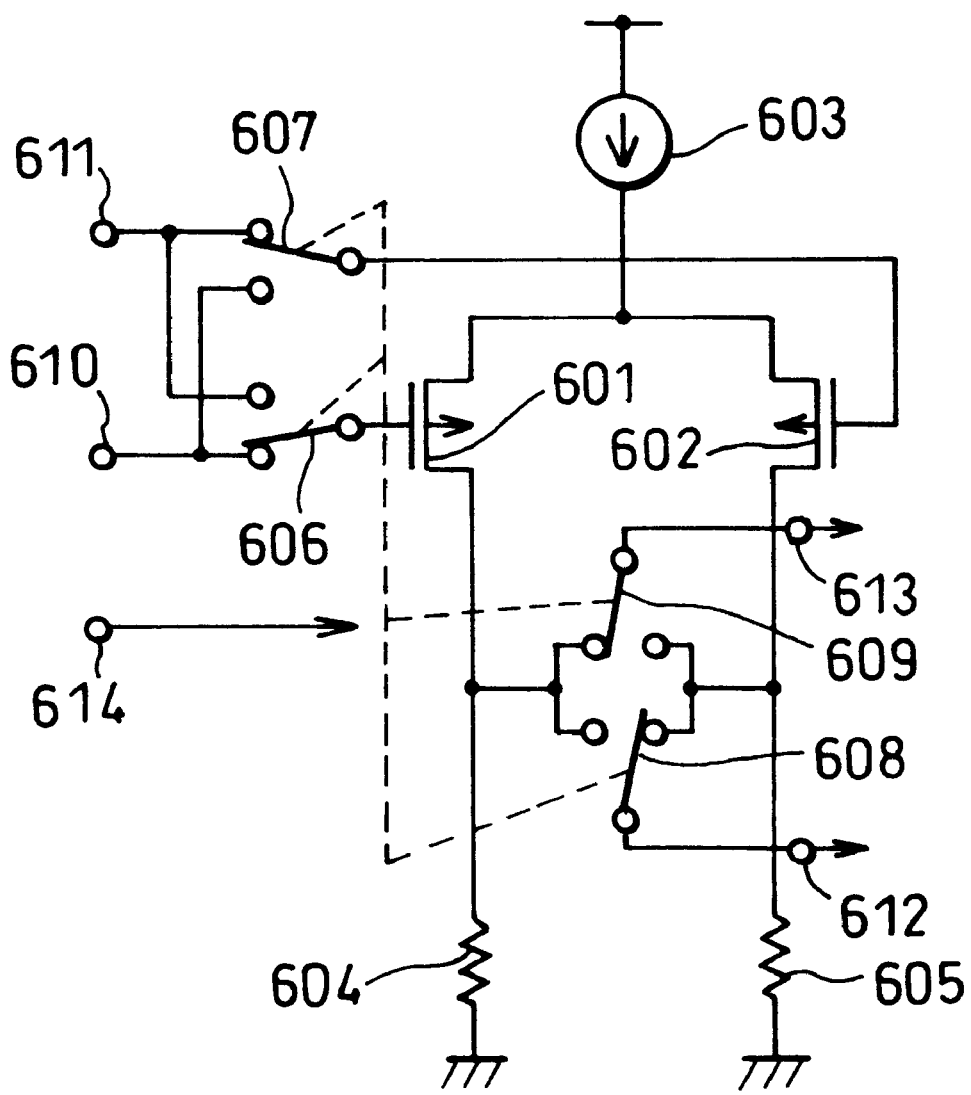
FIG. 7 is a view explaining an operation of the differential amplifier of FIG. 6.
Figure 8:
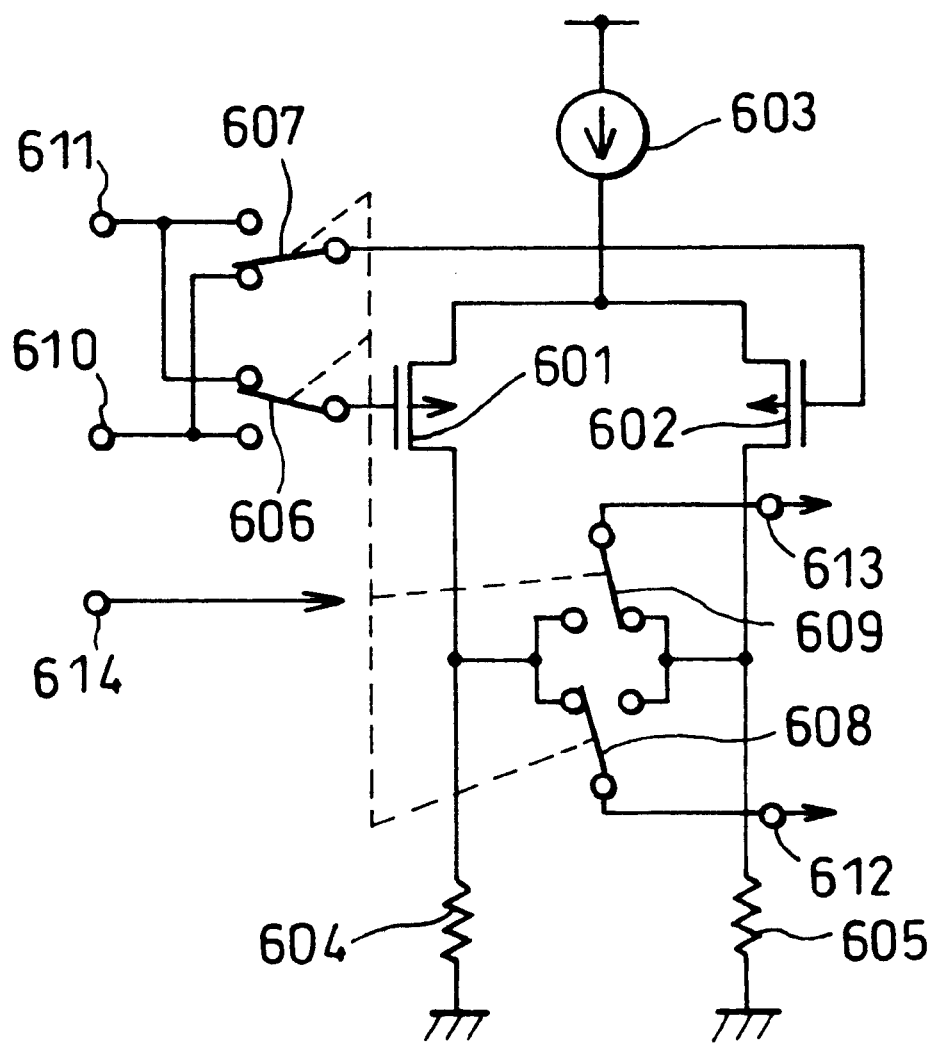
FIG. 8 is a view explaining another operation of the differential amplifier of FIG. 6.

The following will explain an operation of the differential amplifier of FIG. 6 with reference to FIGS. 7 and 8.

In the state shown in FIG. 7, the common mode input terminal 610 is connected to the gate of the input transistor 601 through the switch 606, and a differential mode output signal is outputted from the differential mode output terminal 613 through the switch 609 by the load resistor 604 connected to the drain of the input transistor 601. On the other hand, the differential mode input terminal 611 is connected to the gate of the input transistor 602 through the switch 607, and a common mode output signal is outputted from the common mode output terminal 612 through the switch 608 by the load resistor 605 connected to the drain of the input transistor 602. In other words, a common mode input signal is amplified by the input transistor 601 and load resistor 604, while a differential mode input signal is amplified by the input transistor 602 and load resistor 605.

Contrary, in the state shown in FIG. 8, the common mode input terminal 610 is connected to the gate of the input transistor 602 through the switch 607, and a differential mode output signal is outputted from the differential mode output terminal 613 through the switch 609 by the load resistor 605 connected to the drain of the input transistor 602. On the other hand, the differential mode input terminal 611 is connected to the gate of the input transistor 601 through the switch 606, and a common mode output signal is outputted from the common mode output terminal 612 through the switch 608 by the load resistor 604 connected to the drain of the input transistor 601. In other words, a common mode input signal is amplified by the input transistor 602 and load resistor 605, while a differential mode input signal is amplified by the input transistor 601 and load resistor 604.

As has been described, in the states shown in FIGS. 7 and 8, the amplifier for the common mode input signal and the amplifier for the differential mode input signal are switched one from the other.

Figure 9:
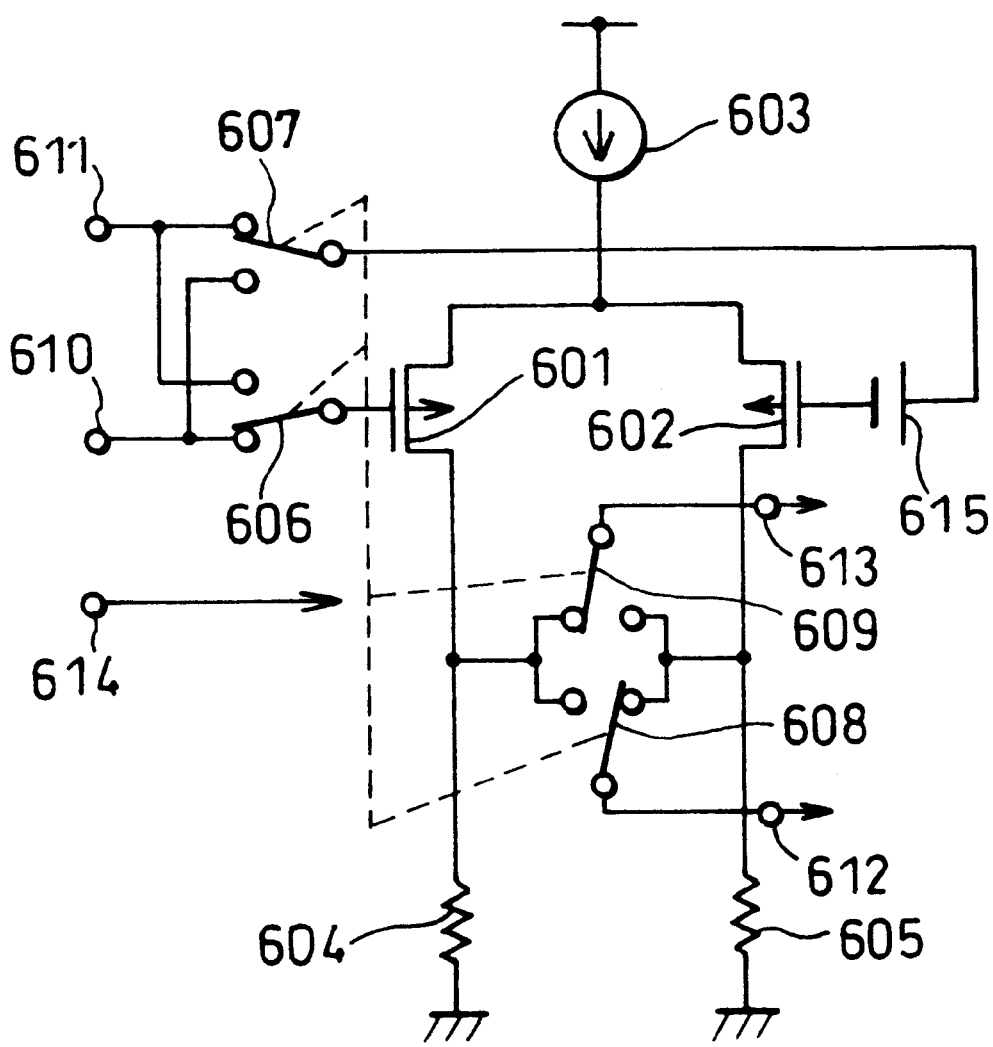
FIG. 9 is a view explaining an operation when discrepancies in material and workmanship cause incidental characteristic discrepancies between transistors and/or load resistors forming the differential amplifier of FIG. 7.
Figure 10:
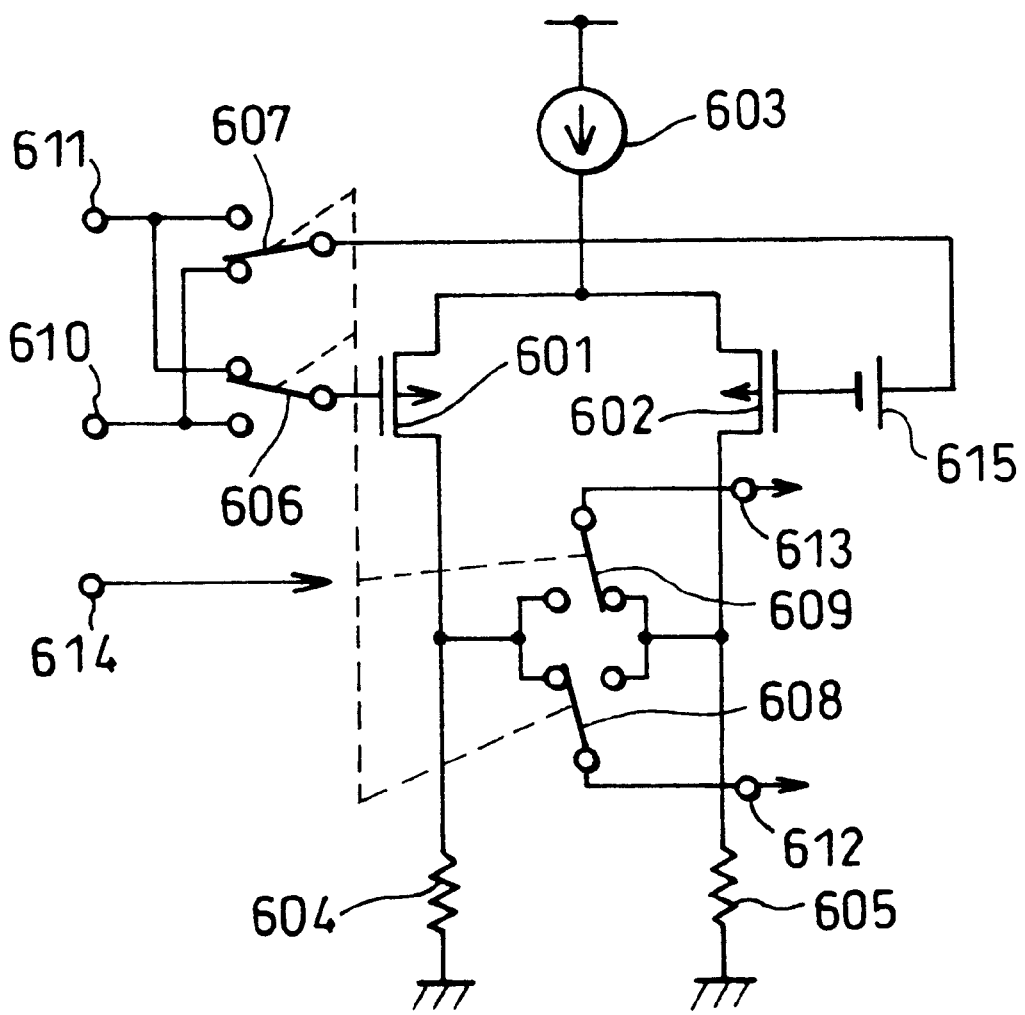
FIG. 10 is a view explaining an operation when discrepancies in material and workmanship cause incidental characteristic discrepancies between transistors and/or load resistors forming the differential amplifier of FIG. 8.

Next, the following will explain, with the reference to FIGS. 9 and 10, a case where discrepancies in material and workmanship cause incidental characteristic discrepancies somewhere between the input transistors 601 and 602 and/or the load resistors 604 and 605 which constitute the differential amplifier.

When a difference is produced between two elements in the differential amplifier, which ideally have the identical characteristics, an actual output voltage differs from an ideal output voltage, thereby causing an offset voltage. Such a difference can formulate a model as illustrated in FIGS. 9 and 10 on the assumption that a constant voltage source is connected to one of the input terminals. In the drawings, numeral 615 denotes a constant voltage source as a model formulated from the offset voltage of the differential amplifier. The switch elements shown in FIG. 9 are in the same state as that shown in FIG. 7, and the switch elements shown in FIG. 10 are in the same state as that shown in FIG. 8.

In FIG. 9, the constant voltage source 615 is connected to the differential mode input terminal 611 through the switch 607. On the other hand, in FIG. 10, the constant voltage source 615 is connected to the common mode input terminal 610 through the switch 607. Since the present differential amplifier uses the switches 606 through 609 in this manner, an offset voltage caused by incidental discrepancies of the differential amplifier can be switched between the states where the offset voltage is switched to the side of the differential mode input terminal 611 and to the side of the common mode input terminal 610. The offset voltages occurred at the common mode output terminal 610 and differential mode output terminal 611 under these two states have opposite signs and an identical absolute value.

As has been explained, even if the operational amplifier has an incidental offset voltage due to the discrepancies in material and workmanship, a deviation from the expected value voltage is the same when outputting a positive voltage and a negative voltage. Hence, a component equal to a difference between two deviations does not remain as an error voltage in an average voltage of the driving voltages applied to the liquid crystal display pixel. Consequently, when the operational amplifier is used as the liquid crystal driving circuit, the incidental offset voltage does not come out as a difference in applied voltage between the pixels of the liquid crystal display, thereby eliminating irregular display in a reliable manner.

Figure 11:
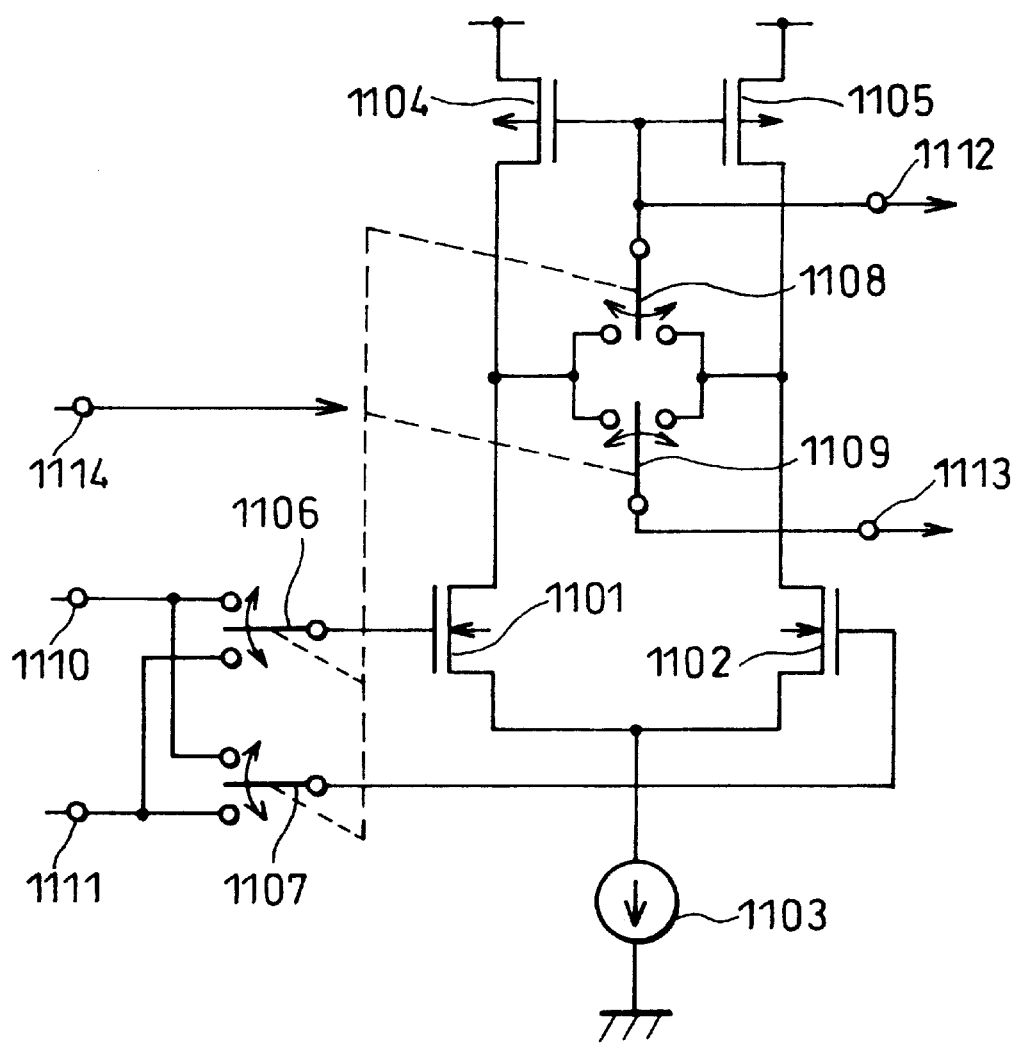
FIG. 11 is a circuit diagram showing an arrangement of a differential amplifier in accordance with a third embodiment of the present invention, and a case where N-channel MOS transistors are used as input transistors.

FIG. 11 shows a differential amplifier in accordance with a third embodiment of the present invention. FIG. 11 shows a case where N-channel MOS transistors are used as input transistors.

In the drawing, numerals 1101 and 1102 denote input transistors of N-channel MOS, numeral 1103 denotes a constant current source which supplies an operating current to the present differential amplifier, numeral 1104 denotes a load transistor composed of a P-channel MOS to be used as a load of the input transistor 1101, numeral 1105 denotes a load transistor composed of a P-channel MOS to be used as a load of the input transistor 1102, numerals 1106 and 1107 denote switches which switch input signals, numerals 1108 and 1109 denote switches which switch output signals, numeral 1110 denotes a common mode input terminal, numeral 1111 denotes a differential mode input terminal, numeral 1112 denotes a common mode output terminal, numeral 1113 denotes a differential mode output terminal, and numeral 1114 denotes a switching signal input terminal for receiving a signal that switches the switches 1106 through 1109 simultaneously.

The circuit of the present embodiment is different from its counterpart of the first embodiment shown in FIG. 1 (passive load) in that the load elements are active loads of transistors of a current mirror structure. In the state corresponding to FIG. 2, a common mode input signal is amplified by the input transistor 1101 and load transistor 1104, while a differential mode input signal is amplified by the input transistor 1102 and load transistor 1105. Contrary, in the state corresponding to FIG. 3, a common mode input signal is amplified by the input transistor 1102 and load transistor 1105, while a differential mode input signal is amplified by the input transistor 1101 and load transistor 1104.

As has been explained, in any case, since the load transistors 1104 and 1105 are of the current mirror structure, even there are characteristic discrepancies in both the load transistors 1105 and 1104, currents flowing these transistors are constantly the same. Consequently, the common mode input signal and differential mode input signal are amplified by the same amplification degree, thereby shaping a symmetrical output waveform.

Thus, in the differential amplifier arranged as shown in FIG. 11, the amplifier for the common mode input signal and the amplifier for the differential mode input signal can be switched one from the other.

Although a detailed explanation is omitted herein, even if discrepancies in material and workmanship cause incidental characteristic discrepancies somewhere between the input transistors 1101 and 1102 which constitute the differential amplifier, the same arrangement as that shown in FIG. 1 can be used. Thus, since the present differential amplifier uses the switches 1106 through 1109, an offset voltage caused by incidental discrepancies in the differential amplifier can be switched between the states where the offset voltage is switched to the side of the differential mode input terminal 1111 or to the side of the common mode input terminal 1110. The offset voltages occurred under these two states at the common mode output terminal 1110 and differential mode output terminal 1111 have opposite polarities and an identical absolute value.

As has been explained, even if the operational amplifier has an incidental offset voltage caused by discrepancies in material and workmanship, deviations from the expected value voltage are the same when outputting the positive voltage and negative voltage. Hence, a component equal to a difference between two deviations does not remain as an error voltage in an average voltage of the driving voltages applied to the liquid crystal display pixel. Consequently, when the operational amplifier is used as the liquid crystal driving circuit, the incidental offset voltage does not come out as a difference in applied voltage between the pixels of the liquid crystal display, thereby eliminating irregular display in a reliable manner.

Figure 12:
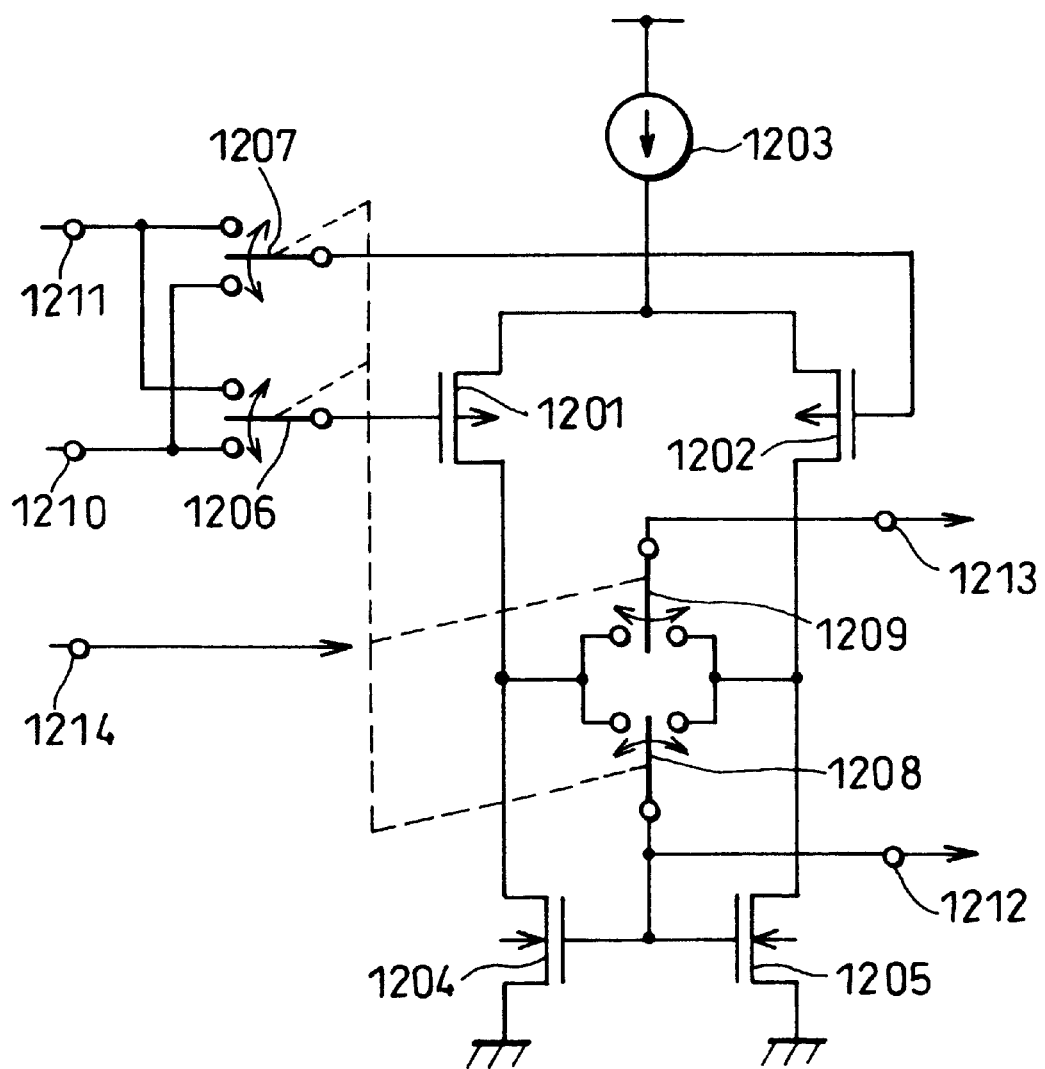
FIG. 12 is a circuit diagram showing an arrangement of a differential amplifier in accordance with a fourth embodiment of the present invention, and a case where P-channel MOS transistors are used as input transistors.

FIG. 12 shows a differential amplifier in accordance with a fourth embodiment of the present invention. FIG. 12 shows a case where a P-channel MOS transistors are used as input transistors.

In the drawing, numerals 1201 and 1202 denote input transistors of P-channel MOS, numeral 1203 denotes a constant current source which supplies an operating current to the present differential amplifier, numeral 1204 denotes a load transistor composed of an N-channel MOS to be used as a load of the input transistor 1201, numeral 1205 denotes a load transistor composed of an N-channel MOS to be used as a load of the input transistor 1202, numerals 1206 and 1207 denote switches which switch input signals, numerals 1208 and 1209 denote switches which switch output signals, numeral 1210 denotes a common mode input terminal, numeral 1211 denotes a differential mode input terminal, numeral 1212 denotes a common mode output terminal, numeral 1213 denotes a differential mode output terminal, and numeral 1214 denotes a switching signal input terminal for receiving a signal that switches the switches 1206 through 1209 simultaneously.

The circuit of the present embodiment is different from its counterpart of the second embodiment shown in FIG. 6 (passive load) in that the load elements are active loads of transistors of a current mirror structure. In a state corresponding to FIG. 7, a common mode input signal is amplified by the input transistor 1201 and load transistor 1204, while a differential mode input signal is amplified by the input transistor 1202 and load transistor 1205. Contrary, in a state corresponding to FIG. 8, the common mode input signal is amplified by the input transistor 1202 and load transistor 1205, while the differential mode input signal is amplified by the input transistor 1201 and load transistor 1204.

As has been explained, in any case, since the load transistors 1204 and 1205 are of the current mirror structure, even there are characteristic discrepancies in both the load transistors 1204 and 1205, currents flowing through the load transistors 1204 and 1205 are constantly the same. Consequently, the common mode input signal and differential mode input signal are amplified by the same amplification degree, thereby shaping a symmetrical output waveform.

Thus, in the differential amplifier arranged as shown in FIG. 12, the amplifier for the common mode input signal and the amplifier for the differential mode input signal can be switched completely.

Although a detailed explanation is omitted herein, even if discrepancies in material and workmanship cause characteristic discrepancies incidentally somewhere between the input transistors 1201 and 1202 constituting the differential amplifier, the same arrangement as that shown in FIG. 6 can be used. Thus, since the present differential amplifier uses the switches 1206 through 1209, an offset voltage caused by incidental discrepancies in the differential amplifier can be switched between the states where the offset voltage is switched to the side of the differential mode input terminal 1211 or to the side of the common mode input terminal 1210. The offset voltages occurred under these two states at the common mode output terminal 1210 and differential mode output terminal 1211 have opposite polarities and an identical absolute value.

As has been explained, even if the operational amplifier has an incidental offset voltage caused by discrepancies in material and workmanship, deviations from the expected value voltage are the same when outputting the positive voltage and negative voltage. Hence, a component equal to a difference between two deviations does not remain as an error voltage in an average voltage of the driving voltages applied to the liquid crystal display pixel. Consequently, the incidental offset voltage does not come out as a difference in applied voltages between the pixels of the liquid crystal display, thereby eliminating irregular display in a reliable manner.

Figure 13:
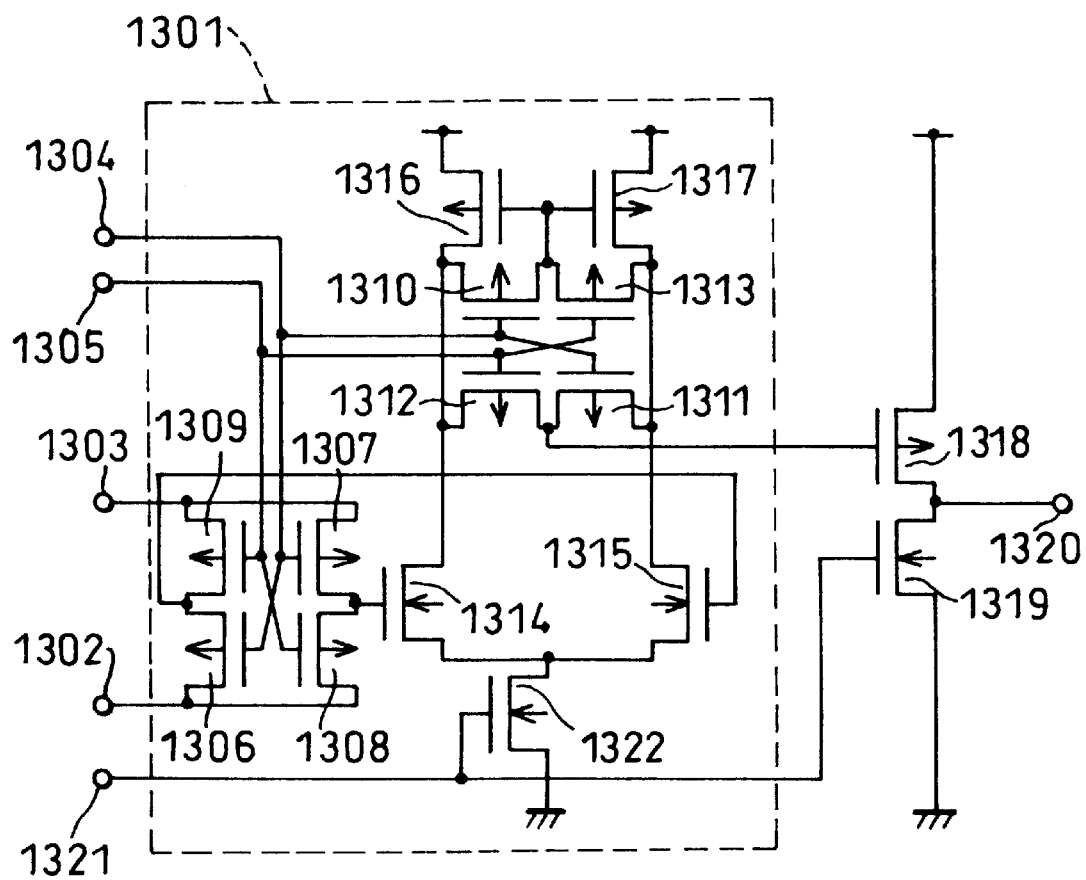
FIG. 13 is a circuit diagram showing an operational amplifier with an N-channel MOS input in accordance with a fifth embodiment of the present invention.

Next, the following will explain a fifth embodiment of the present invention with reference to FIG. 13 which illustrates an operational amplifier with an N-channel MOS input.

In the drawing, numeral 1301 denotes a differential amplifier which is equivalent to its counterpart in the third embodiment (the one shown in FIG. 11), numeral 1302 denotes a common mode input terminal, numeral 1303 denotes a differential mode input terminal, numerals 1304 and 1305 denote switch switching signal input terminals, numerals 1306 through 1309 denote switches, numerals 1310 through 1313 denote switches, numerals 1314 and 1315 denote transistors of N-channel MOS input, numerals 1316 and 1317 denote P-channel MOS load transistors used as active loads of the input transistors, numeral 1318 denotes output transistors with P-channel MOS outputs, numeral 1319 denote output transistors of N-channel MOS, numeral 1320 denotes an output terminal, and numeral 1321 denote a bias voltage input terminal which supplies an operating point to the operational amplifier. Even if the differential amplifier 1301 is replaced with the differential amplifier of the load resistor explained in the first embodiment, the resulting circuit operates in the same manner as explained below, and the detailed explanation is omitted herein.

In FIG. 13, numerals 1304 and 1305 correspond to the switch switching signal input terminal 1114 of the third embodiment, and numerals 1304 and 1305 receive signals in opposite modes, respectively. So, with reference to FIGS. 14 and 15, the following will explain an operation of the circuit in response to inputs of the switch switching signals.

In the drawing, input transistors 1314 and 1315 correspond to the input transistors 1101 and 1102 of the third embodiment, respectively, and the load transistors 1316 and 1317 correspond to the load transistors 1104 and 1105 of the third embodiment, respectively.

Also in the drawing, numerals 1307 and 1309 correspond to the switch 1106 of the third embodiment, numerals 1306 and 1308 correspond to the switch 1107 of the third embodiment, numerals 1310 and 1313 correspond to the switch 1108 of the third embodiment, numerals 1311 and 1312 correspond to the switch 1109 of the third embodiment, and the transistors 1322 corresponds to the constant current source 1103 of the third embodiment.

Figure 14:
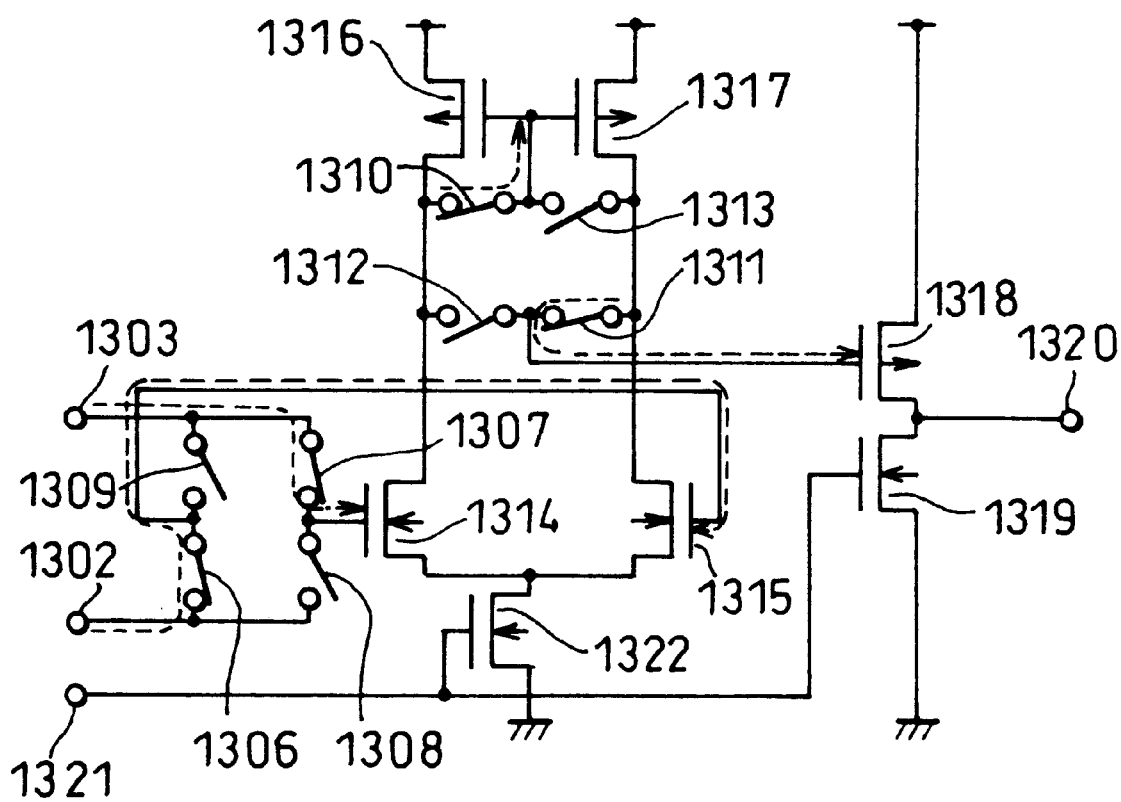
FIG. 14 is a circuit diagram showing an operation of the operational amplifier of FIG. 13.

When a low level (which is referred to as "L" level, hereinafter) is inputted into the switch switching signal input terminal 1304, as shown in FIG. 14, the switches (transistors) 1306, 1307, 1310 and 1311 are turned ON. At this point, since a high level (which is referred to as "H" level, hereinafter) is inputted into the switch switching signal input terminal 1305, the transistors (switches) 1308, 1309, 1312, and 1313 are turned OFF. Accordingly, the common mode input signal is supplied to the input transistor 1315 through the switch 1306, while the differential mode input signal is supplied to the input transistor 1314 through the switch 1307. Gates signals are separately supplied to the load transistors 1316 and 1317 through the switch 1310, and to the output transistor 1318 through the switch 1311. In case of FIG. 14, the transistor 1315 and load transistor 1317 serve as a circuit which amplifies a common mode input signal, and the transistor 1314 and load transistor 1316 serve as a circuit which amplifies a differential mode input signal.

Figure 15:
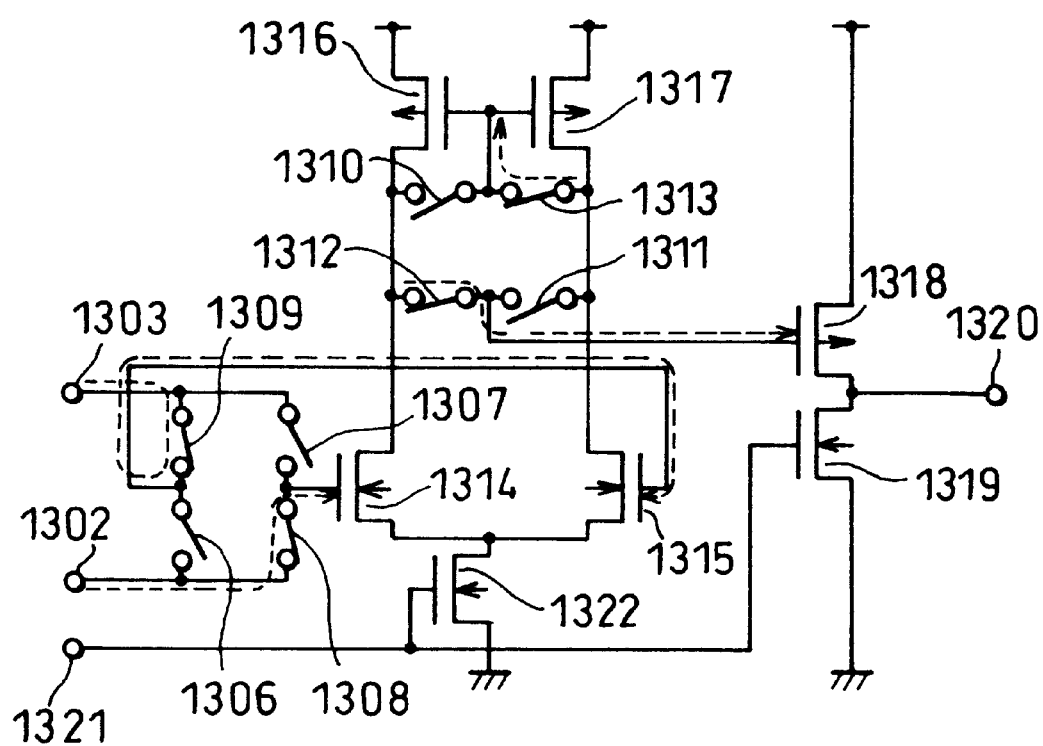
FIG. 15 is a circuit diagram showing another operation of the operational amplifier of FIG. 13.

In a state shown in FIG. 15, when an "L" level is inputted into the switch switching signal input terminal 1305, the transistors 1308, 1309, 1312, and 1313 are turned ON. At this point, since an "H" level is inputted into the switch switching signal input terminal 1304, the transistors 1306, 1307, 1310, and 1311 are turned OFF. Here, the common mode input signal is supplied to the input transistor 1314 through the transistor 1308, while the differential mode input signal is supplied to the input transistor 1315 through the transistor 1309. Also, gate signals are separately supplied to the load transistors 1316 and 1317 through the transistor 1313, and to the output transistor 1318 through the transistor 1312. In case of FIG. 15, the input transistor 1314 and load transistor 1316 serve as a circuit which amplifies a common mode input signal, and the input transistor 1315 and load transistor 1317 serve as a circuit which amplifies a differential mode input signal.

As shown in FIGS. 14 and 15, in the present differential amplifier, the amplifier of the common mode input signal and the amplifier of the differential mode input signal can be switched by switching the transistors 1306 through 1313. Consequently, as has been explained, even if an incidental offset occurs due to the characteristic discrepancies of the differential amplifier caused by discrepancies in material and workmanship, the offset voltages are opposite in polarities and identical in absolute value in the two states. Consequently, by switching the transistors 1306 through 1313, states where discrepancies of the offset voltages occurred in the operational amplifier have opposite polarities and an identical absolute value can be realized, thereby making it possible to cancel out the offset voltages.

Figure 16:
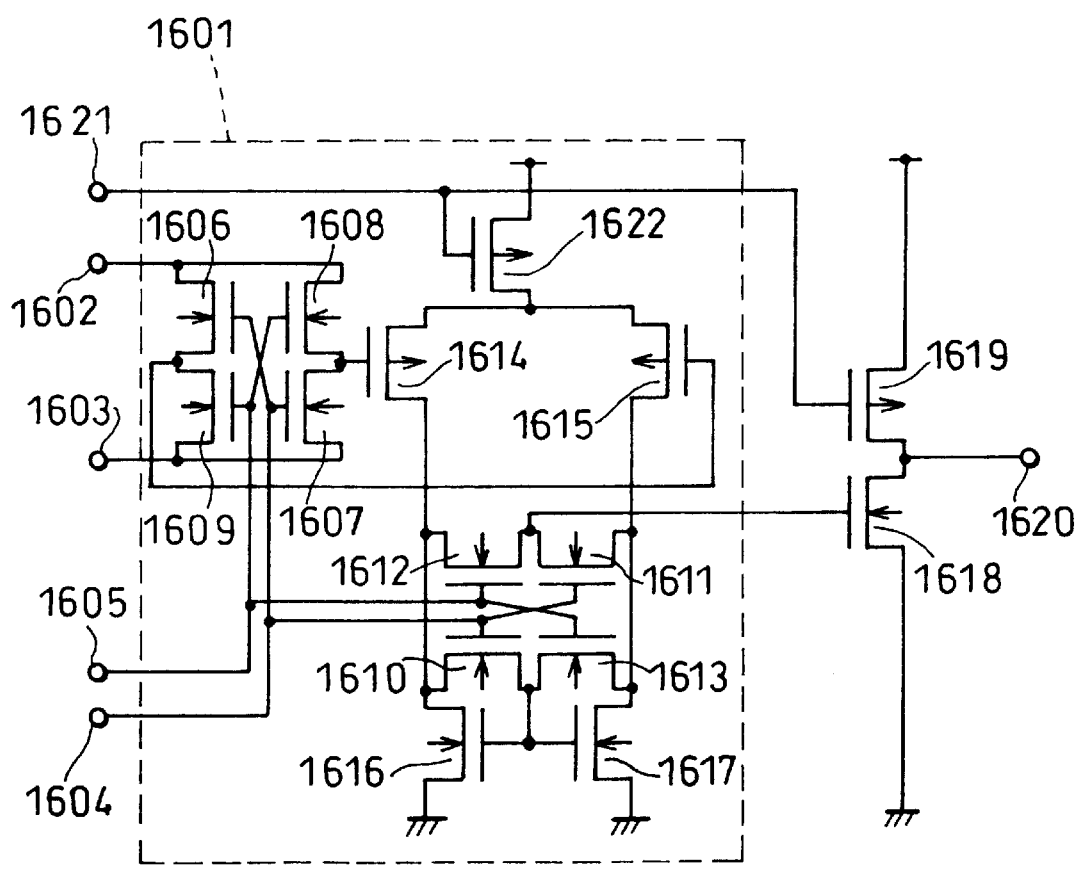
FIG. 16 is a circuit diagram showing an operational amplifier with a P-channel MOS input in accordance with a sixth embodiment of the present invention.

Next, the following will explain a sixth embodiment of the present invention with reference to FIG. 16 which illustrates an operational amplifier with a P-channel MOS input.

In the drawing, numeral 1601 denotes a differential amplifier which is equivalent to its counterpart of the fourth embodiment (the one shown in FIG. 12), numeral 1602 denotes a common mode input terminal, numeral 1603 denotes a differential mode input terminal, numerals 1604 and 1605 denote switch switching signal input terminals, numerals 1606 through 1609 denote switches, numerals 1610 through 1613 denote switches, numerals 1614 and 1615 denote input transistors of P-channel MOS, numerals 1616 and 1617 denote N-channel MOS load transistors used as active loads of the input transistors, numeral 1618 denote output transistors of N-channel MOS, numeral 1619 denotes output transistors of P-Channel MOS, numeral 1620 denotes an output terminal, and numeral 1621 denote a bias voltage input terminal which supplies an operating point to the operational amplifier. Even if the differential amplifier 1601 is replaced with the differential amplifier of the load resistor explained in the first embodiment, the resulting circuit operates in the same manner as explained below, and the detailed explanation is omitted herein.

Figure 17:
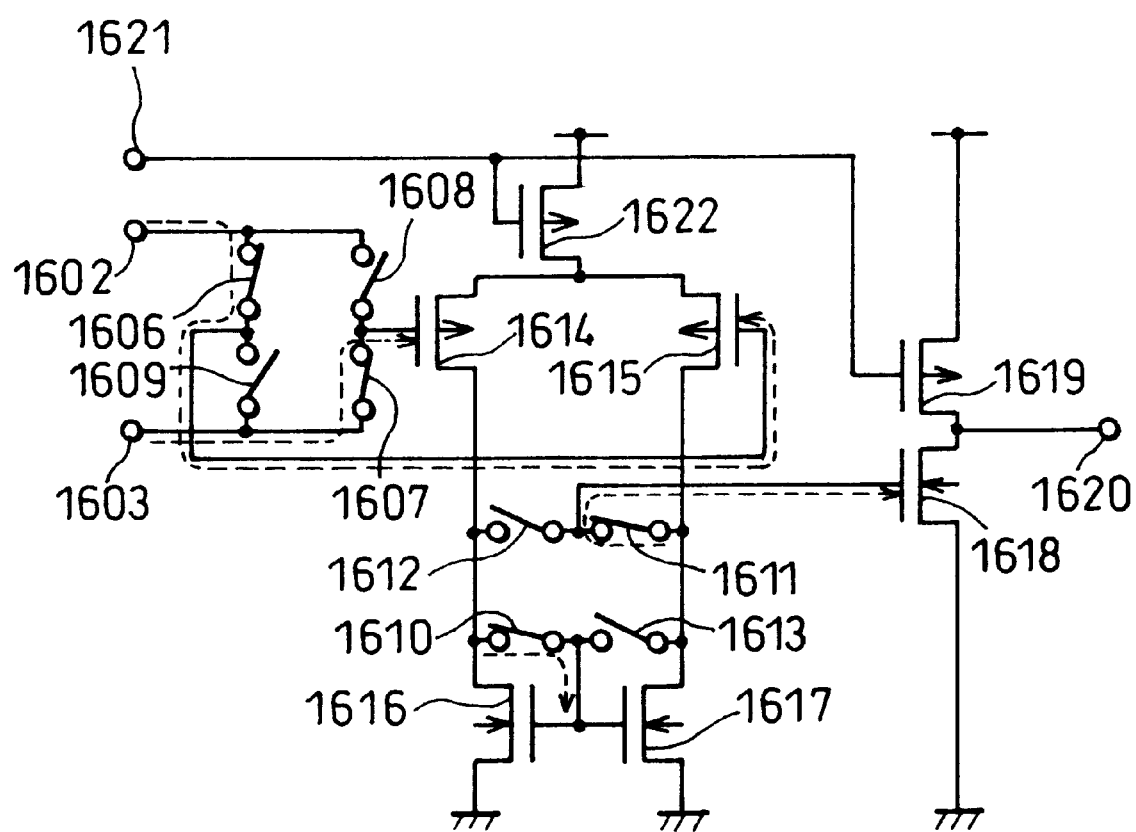
FIG. 17 is a circuit diagram showing an operation of the operational amplifier of FIG. 16.
Figure 18:
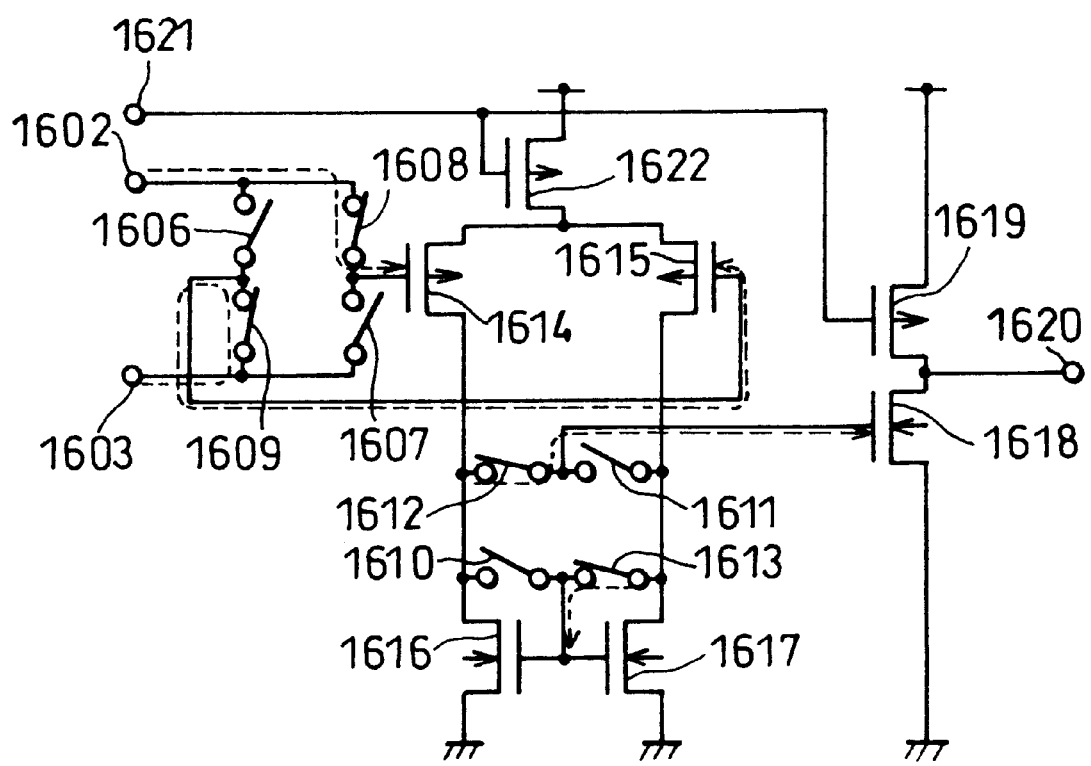
FIG. 18 is a circuit diagram showing another operation of the operational amplifier of FIG. 16.

In FIG. 16, numerals 1604 and 1605 correspond to the switch switching signal input terminal 1214 of the fourth embodiment, and numerals 1604 and 1605 receive signals in opposite modes, respectively. With reference to FIGS. 17 and 18, the following will explain an operation of the circuit in response to inputs of the switch switching signals.

In the drawing, input transistors 1614 and 1615 correspond to the input transistors 1201 and 1202 of the fourth embodiment, respectively, and the load transistors 1616 and 1617 correspond to the load transistors 1204 and 1205 of the fourth embodiment. Also in the drawing, numerals 1607 and 1609 correspond to the switch 1206 of the fourth embodiment, numerals 1606 and 1608 correspond to the switch 1207 of the fourth embodiment, numerals 1610 and 1613 correspond to the switch 1208 of the fourth embodiment, numerals 1611 and 1612 correspond to the switch 1209 of the fourth embodiment, and the transistor 1622 corresponds to the constant current source 1203 of the fourth embodiment.

When an "H" level is inputted into the switch switching signal input terminal 1604, as shown in FIG. 17, the switches 1606, 1607, 1610 and 1611 are turned ON. At this point, since an "L" level is inputted into the switch switching signal input terminal 1605, the switches 1608, 1609, 1612, and 1613 are turned OFF. Accordingly, the common mode input signal is supplied to the input transistor 1615 through the switch 1606, while the differential mode input signal is supplied to the input transistor 1614 through the switch 1607. Gate signals are separately supplied to the load transistors 1616 and 1617 through the switch 1610, and to the output transistor 1618 through the switch 1611. In case of FIG. 17, the input transistor 1615 and load transistor 1617 serve as a circuit which amplifies a common mode input signal, and the input transistor 1614 and load transistor 1616 serve as a circuit which amplifies a differential mode input signal.

In a state shown in FIG. 18, when an "H" level is inputted into the switch switching signal input terminal 1605, the switches 1608, 1609, 1612, and 1613 are turned ON. At this point, since an "L" level is inputted into the switch switching signal input terminal 1604, the switches 1606, 1607, 1610, and 1611 are turned OFF. Here, the common mode input signal is supplied to the input transistor 1614 through the switch 1608, while the differential mode input signal is supplied to the input transistor 1615 through the switch 1609. Also, gate signals are separately supplied to the load transistors 1616 and 1617 through the switch 1613, and to the output transistor 1618 through the switch 1612. In case of FIG. 18, the input transistor 1614 and load transistor 1616 serve as a circuit which amplifies a common mode input signal, and the input transistor 1615 and load transistor 1617 serve as a circuit which amplifies a differential mode input signal.

As shown in FIGS. 17 and 18, in the present differential amplifier, the amplifier of the common mode input signal and the amplifier of the differential mode input signal can be switched by switching the switches 1606 through 1613. Consequently, as has been explained, even if an incidental offset voltage occurs due to the characteristic discrepancies of the differential amplifier caused by discrepancies in material and workmanship, such offset voltages in the two states are opposite in polarities and identical in absolute value. Consequently, by switching the switches 1606 through 1613, states where discrepancies of the offset voltages occurred in the operational amplifier have opposite polarities and an identical absolute value can be realized, thereby making it possible to cancel out the offset voltages. In FIGS. 17 and 18, a dotted line represents a flow of the signal.

Figure 19:
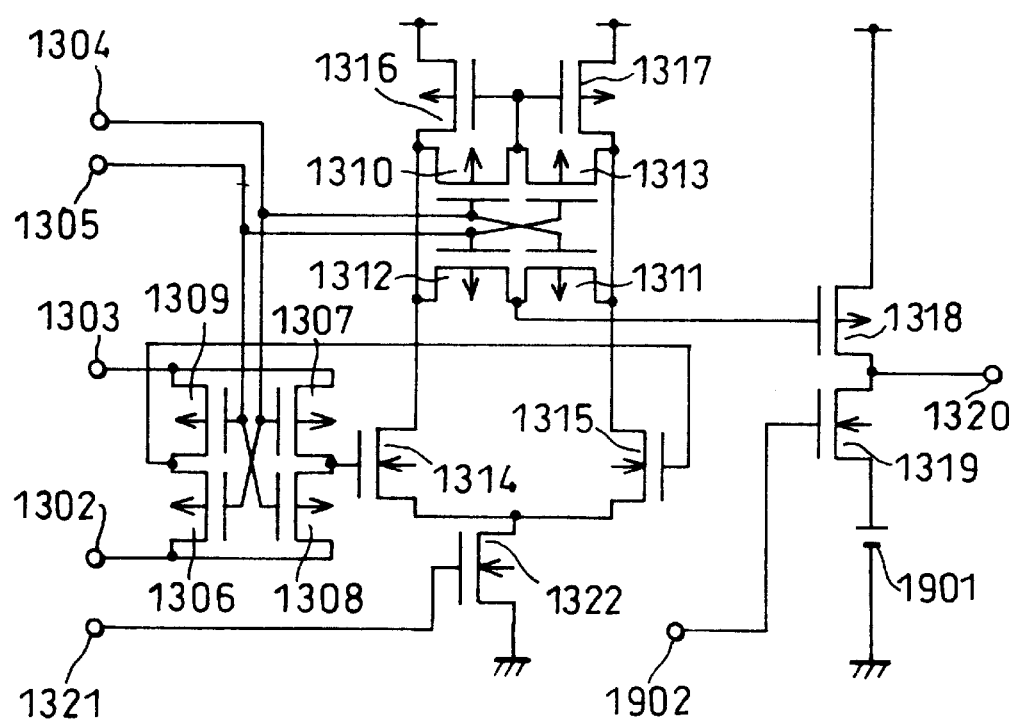
FIG. 19 is a circuit diagram showing an operational amplifier with an N-channel MOS input in accordance with a seventh embodiment of the present invention.

FIG. 19 shows a seventh embodiment of the present invention, which is an operational amplifier with an N-channel MOS input. In the drawing, numeral 1901 denotes a voltage source provided between a source electrode of the N-channel output transistor and a GND potential, and numeral 1902 denotes a bias voltage input terminal which supplies a bias current of the N-channel output transistor 1319 in response to a voltage of the voltage source 1901. The rest is the same in arrangement and operation as its counterpart shown in FIG. 13, and the detailed explanation is omitted herein.

When the present circuit is used as the voltage follower, power consumption can be saved by providing the voltage source 1901 somewhere between the output transistor 1319 and GND.

To be more specific, the present circuit uses N-channel MOS as the input transistors, and when used as enhancement mode transistors employed in a general LSI, it does not operate on an input voltage around the operating power source potential of the operational amplifier because of threshold voltage characteristics. For this reason, when the present circuit is used as the voltage follower, it is substantially operated on the output voltage at the higher potential side, and the output transistor does not have to be connected to GND. If a voltage at the voltage source 1901 is set lower than the operating power source voltage of the operational amplifier, when a current passes through the load from the operational amplifier, a potential difference in the current path is reduced by a voltage compared with a case where the voltage source 1901 is omitted. Hence, the power generated by a current having passed through the voltage source 1901 can be used to activate other circuits. Consequently, power consumption of the circuit when driving the load can be saved.

Figure 20:
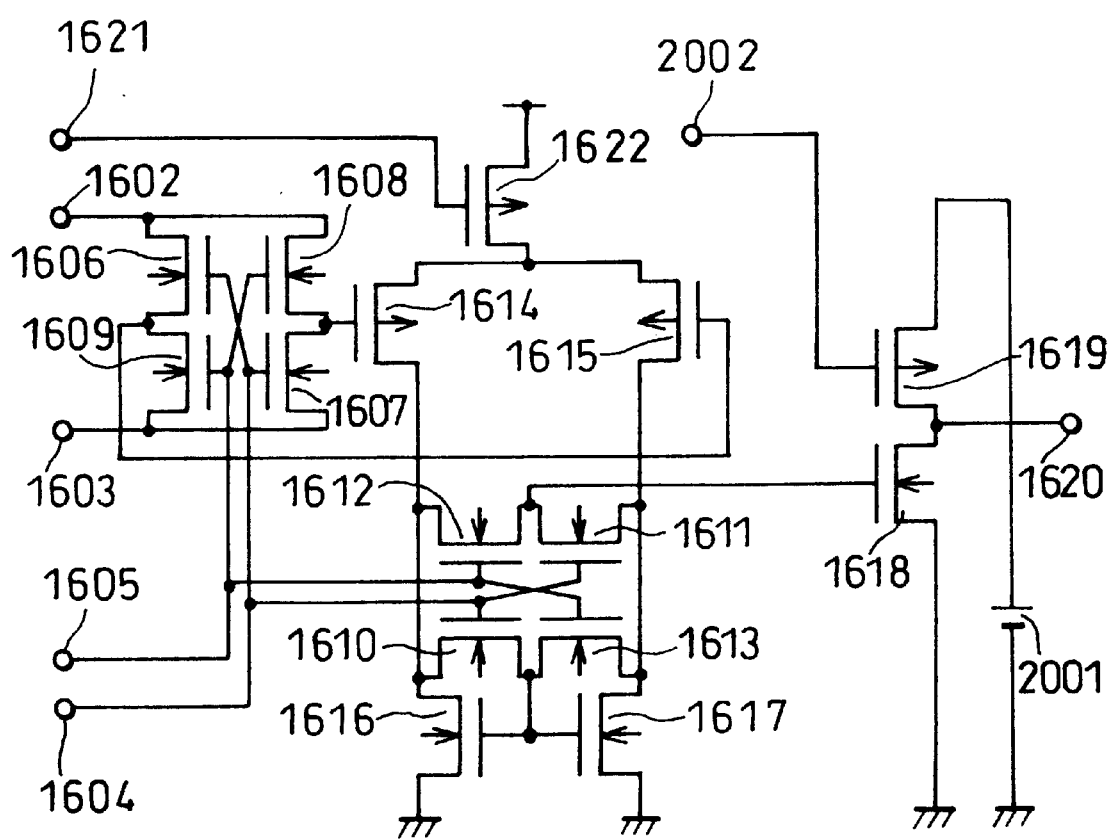
FIG. 20 is a circuit diagram showing an operational amplifier with a P-channel MOS input in accordance with an eighth embodiment of the present invention.

FIG. 20 shows an eighth embodiment of the present invention, which is an operational amplifier with a P-channel MOS input. In the drawing, numeral 2001 denotes a voltage source provided between the P-channel output transistor 1619 and a GND potential, and numeral 2002 denotes a bias voltage input terminal which supplies a bias current of the P-channel output transistor 1619 in response to a voltage of the voltage source 2001. The rest is the same in arrangement and operation as its counterpart shown in FIG. 16, and the detailed explanation is omitted herein.

When the present circuit is used as the voltage follower, power consumption can be saved by providing the voltage source 2001 somewhere between the output transistor 1619 and GND.

To be more specific, the present circuit uses P-channel MOS as the input transistors, and when used as an enhancement mode transistor employed in a general LSI, it does not operate on an input voltage around the GND potential because of the threshold voltage characteristics. For this reason, when the present circuit is used as the voltage follower, it is substantially operated on the output voltage at the lower potential side, and the output transistor does not have to be connected to the operating power source voltage. If a voltage at the voltage source 2001 is set lower than the operating power source voltage of the operational amplifier, when a current passes through the operational amplifier from the load, power can be supplied from the voltage power source 2001 having a lower voltage than the operating power source voltage. Consequently, an overall power consumption of the circuit can be saved.

Figure 21:
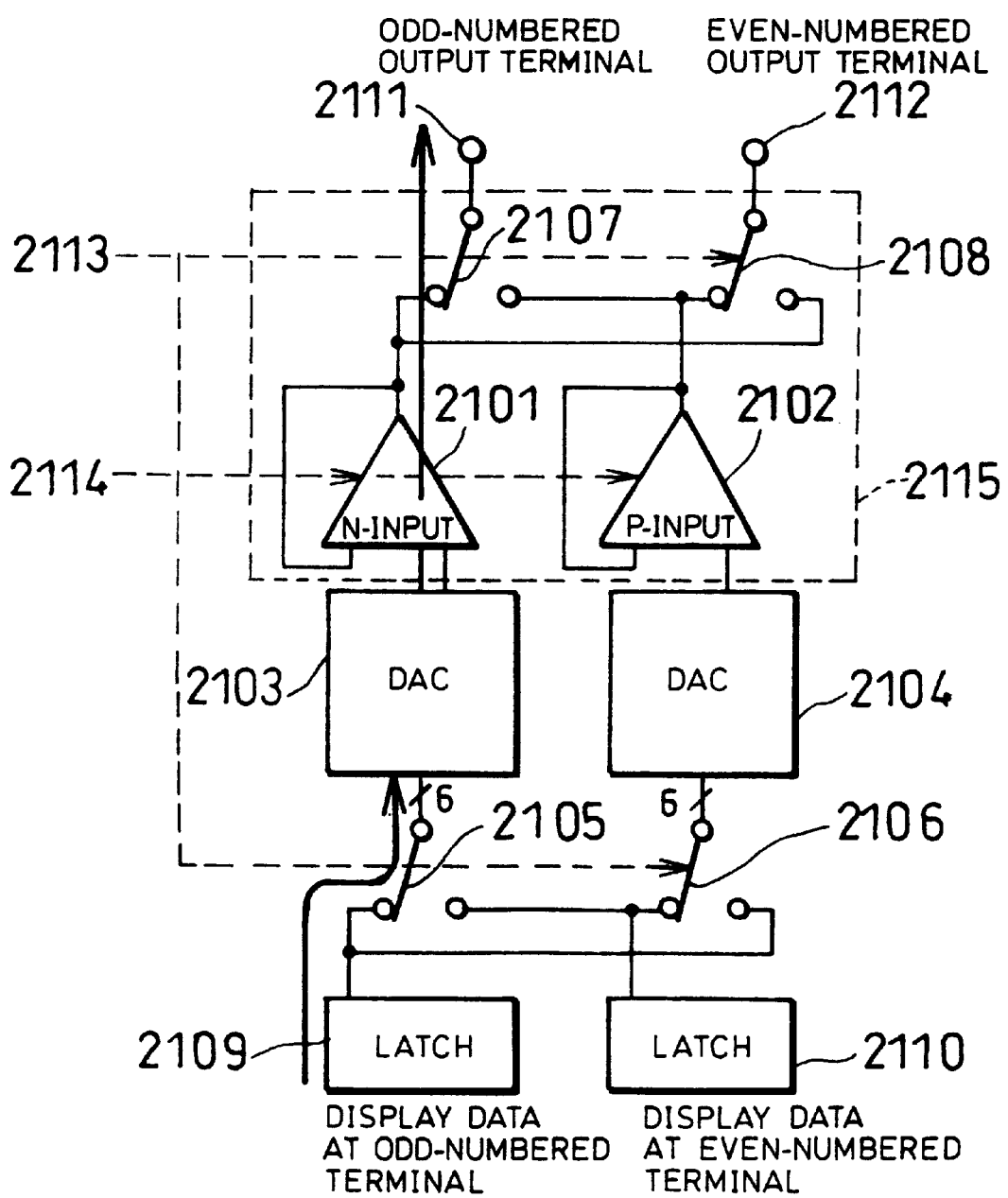
FIG. 21 is an output block diagram of a liquid crystal driving circuit which carries out dot-inverting driving in accordance with a ninth embodiment of the present invention, showing only a portion of two adjacent output circuits of a liquid crystal panel.
Figure 22:
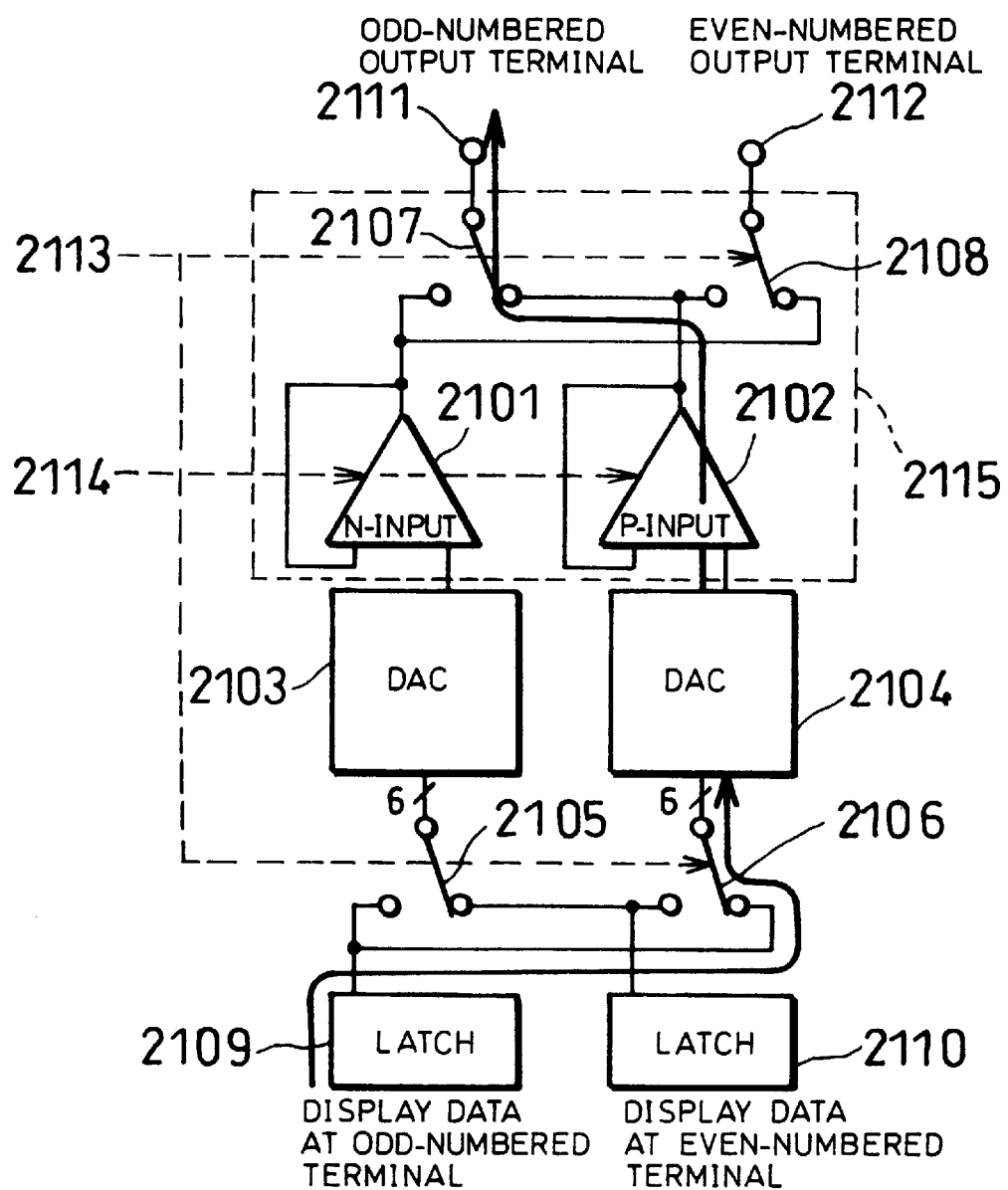
FIG. 22 is a circuit diagram showing an operation of the liquid crystal driving circuit when the polarity of the liquid crystal driving voltage is switched.
Figure 23:
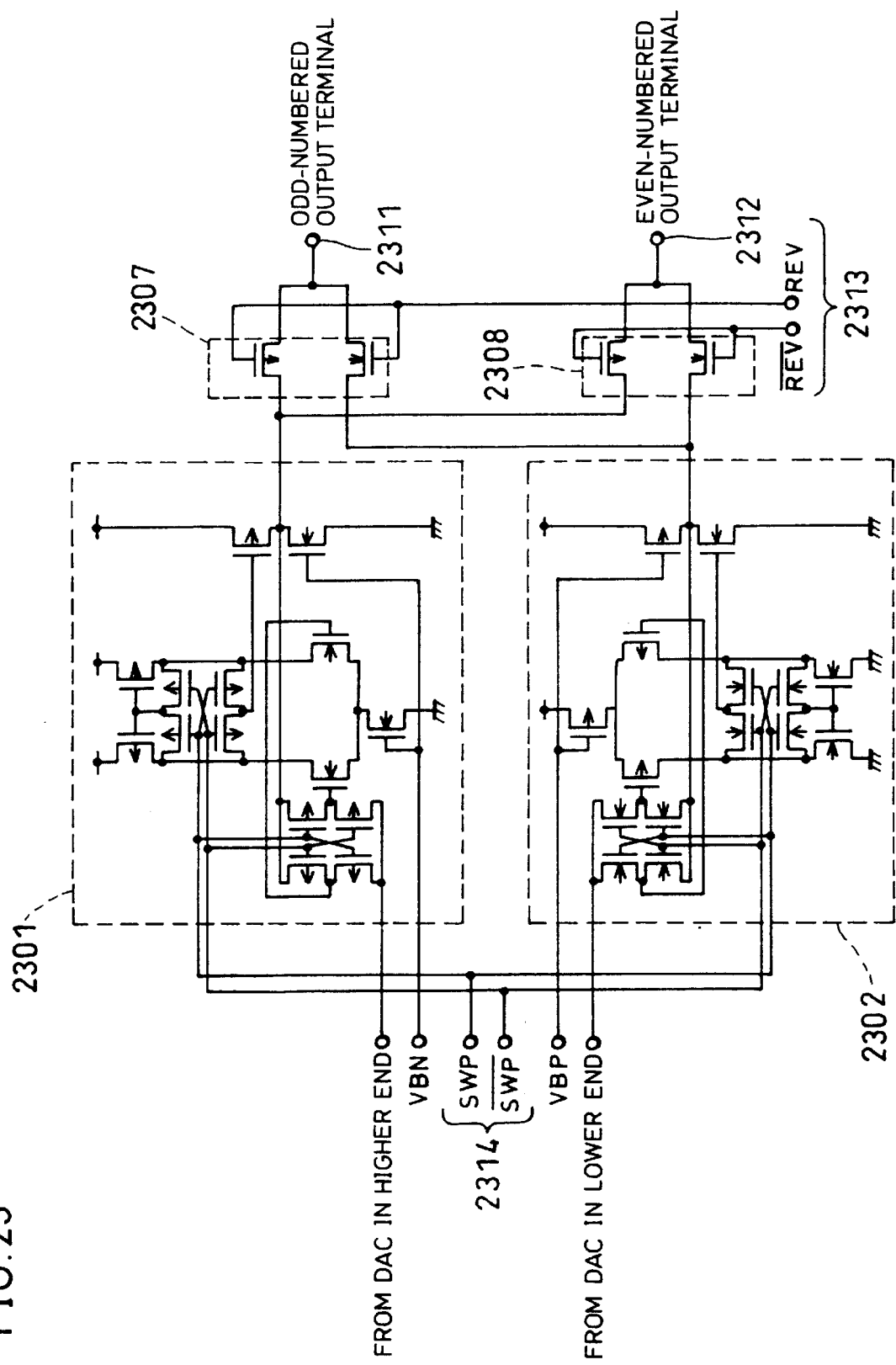
FIG. 23 is a circuit diagram showing an example arrangement of major blocks in FIGS. 21 and 22.

FIGS. 21, 22, and 23 show a ninth embodiment of the present invention, which are output block diagrams of a liquid crystal driving circuit which carries out dot-inverting driving. In these drawings, only two adjacent output circuits are shown, and FIGS. 21 and 22 show an operation when the polarity of the liquid crystal driving voltage is switched.

In FIGS. 21 and 22, numeral 2101 denotes an operational amplifier with an N-channel MOS input (see FIG. 13) explained in the fifth embodiment, numeral 2102 denotes the operational amplifier with the P-channel MOS input (see FIG. 16) explained in the sixth embodiment, numeral 2103 denotes a digital-to-analog converter which generates a positive liquid crystal driving voltage, numeral 2104 denotes a digital-to-analog converter which generates a negative liquid crystal driving voltage, numerals 2105 through 2108 denote switches used to convert the liquid crystal driving voltage to an alternating voltage, numeral 2109 denotes a latch which stores display data for an odd-numbered output terminal, numeral 2110 denotes a latch which stores display data for an even-numbered output terminal, numeral 2111 denotes an odd-numbered output terminal, numeral 2112 denotes an even-numbered output terminal, numeral 2113 denotes an alternating switch switching signal input, and numeral 2114 denotes a switch switching signal of the operational amplifier explained in the fifth and sixth embodiments. Note that the odd-numbered output terminal 2111 and even-numbered terminal 2112 correspond to a first group output terminal and a second group output terminal set forth in claims, respectively, and the operational amplifiers 2101 and 2102 correspond to an positive operational amplifier and a negative operational amplifier set forth in claims, respectively.

The following will explain an operation of the odd-numbered output terminal with reference to FIGS. 21, 22, and 23. Since the even-numbered output terminal operates in the same manner as the odd-numbered output terminal except that the polarity is reversed, the detailed explanation of which is omitted herein.

FIG. 21 shows a case where the odd-numbered output terminal 2111 outputs a positive driving voltage, while the even-numbered output terminal 2112 outputs a negative driving voltage. In this case, the display data for the odd-numbered output terminal are sent to the positive digital-to-analog converter 2103 from the latch 2109 through the switch 2105. An output from the positive digital-to-analog converter 2103 is supplied to the operational amplifier 2101, and outputted from the odd-numbered output terminal 2111 through the switch 2107 (see a bold arrow in FIG. 21).

FIG. 22 shows a case where the odd-numbered output terminal 2111 outputs a negative driving voltage, while the even-numbered output terminal 2112 outputs a positive driving voltage. In this case, the display data for the odd-numbered output terminal are sent to the negative digital-to-analog converter 2104 from the latch 2109 through the switch 2106. An output from the negative digital-to-analog converter 2104 is supplied to the operational amplifier 2102, and outputted from the odd-numbered output terminal 2111 through the switch 2107 (see a bold arrow in FIG. 22).

Next, a case where the operational amplifier has characteristics discrepancies due to discrepancies in material and workmanship, and causes an incidental offset voltage. As previously mentioned, the operational amplifier of the present circuit can invert the sign (polarity) of the offset voltage by the switch switching signal. Assume that the operational amplifier 2101 can switch an offset voltage A to −A and vice versa, and the operational amplifier 2102 can switch an offset voltage B to −B and vice versa. Then, an output voltage from the odd-numbered output terminal has an offset voltage A or −A when it is positive, and an offset voltage B or −B when it is negative. The sign of the offset voltage can be selected by the switch switching signal of the operational amplifier.

The above-explained relations are set forth in Table 1 below as a table of truth value using terminals SWP and REV of FIG. 23. FIG. 23 is an example arrangement of the block 2115 of FIGS. 21 and 22. In the drawing, numeral 2301 corresponds to the operational amplifier with the N-channel MOS input (see FIG. 13) explained in the fifth embodiment, and numeral 2302 corresponds to the operational amplifier with the P-channel MOS input (see FIG. 16) explained in the sixth embodiment. Also in the drawing, numerals 2307 and 2308 correspond to the switches 2107 and 2108 of FIGS. 21 and 22, respectively, and numerals 2311 and 2312 correspond to the output terminals 2111 and 2112 of FIGS. 21 and 22, respectively. Further in the drawing, VEN and VBP denote bias voltage input terminals which supply an operating point to the operational amplifier. Further, numeral 2313 corresponds to numeral 2113 (alternating switch switching signal input) of FIGS. 21 and 22, and numeral 2314 corresponds to numeral 2114(switch switching signal input terminal of the operational amplifier used in the fifth and sixth embodiments) of FIGS. 21 and 22.

Figure 24:
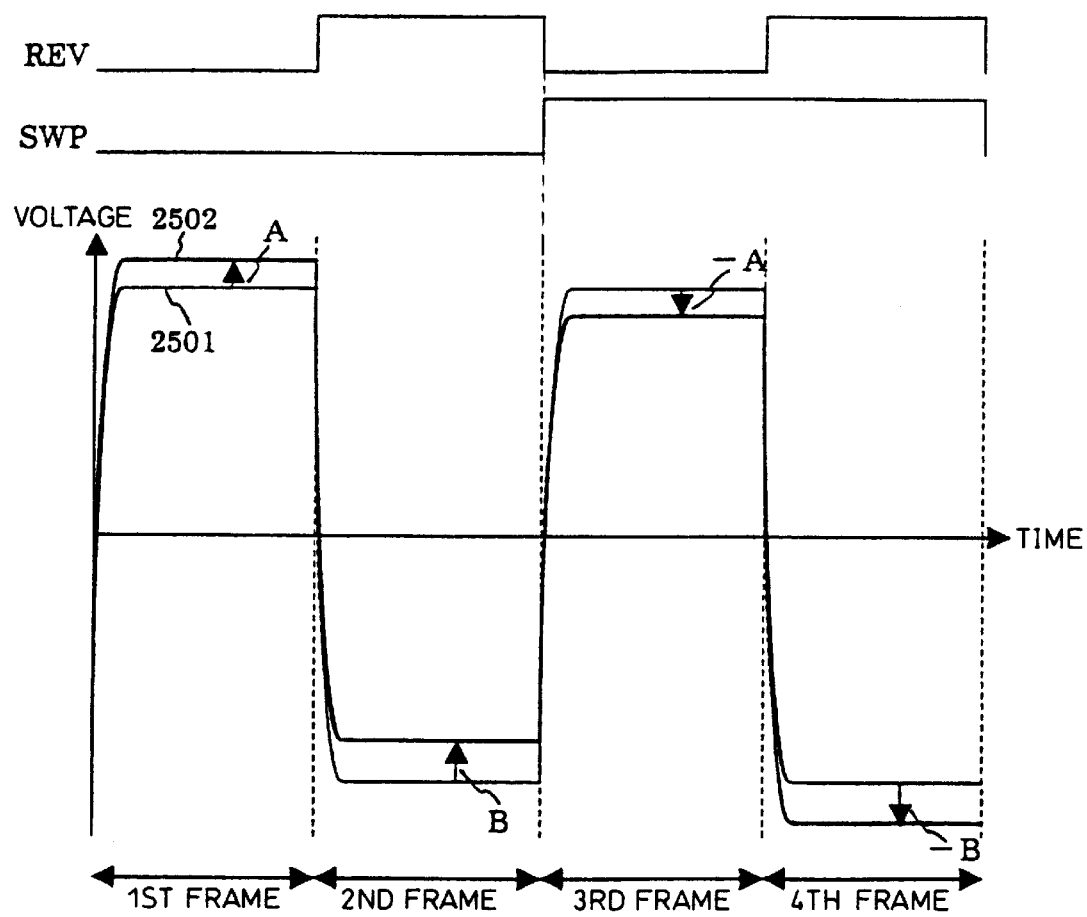
FIG. 24 is a view showing operating waveforms of the circuits in FIGS. 21 through 23.

FIG. 24 shows an example of a voltage waveform applied to a display pixel when the liquid crystal display is actually driven. In the drawing, a cycle of an operational amplifier switch switching signal SWP is extended twice as long as a cycle of the alternating switch switching signal REV.

Note that a multiple ratio of the SWP cycle with respect to the REV cycle has to be an even multiple, but is not limited to 2 as above.

TABLE 1

| INPUT SIGNAL | | OUTPUT TERMINAL(DEVIATION) | |
| --- | --- | --- | --- |
| SWP | REV | ODD-NUMBERED | EVEN-NUMBERED |
| LOW LEVEL | LOW LEVEL | POSITIVE(A) | NEGATIVE(B) |
| LOW LEVEL | HIGH LEVEL | NEGATIVE(B) | POSITIVE(A) |
| HIGH LEVEL | LOW LEVEL | POSITIVE(−A) | NEGATIVE(−B) |
| HIGH LEVEL | HIGH LEVEL | NEGATIVE(−B) | POSITIVE(−A) |

In FIG. 24, numeral 2501 represents an ideal value of a pixel voltage driven by the odd-numbered output terminal, and numeral 2502 represents an actual voltage. Here, the REV signal inverts per frame and the SWP signal inverts per two frames. Consequently, a difference between the ideal value of the pixel voltage and the actual voltage value varies per frame as "A", "B", "−A", and "−B", and this sequence is repeated for every four frames. The deviations in the first and third frames have the opposite signs and the same absolute value. Likewise, the deviations between the second and fourth frames have the opposite signs and the same absolute value.

If the cycle of the frame is sufficiently fast for a response time of the liquid crystal material, the deviations in the first and third frames are cancelled out, and the deviations in the second and fourth frames are also cancelled out. Thus, for a satisfactory long period, a variation of the deviations for each liquid crystal driving output terminal does not come out as visible display because of the cancelling out action in each display pixel.

As has been discussed above, in the liquid crystal driving circuit of the ninth embodiment, a variance of the output voltage in each liquid crystal driving terminal can be cancelled out with a variance in the opposite direction.

Figure 25:
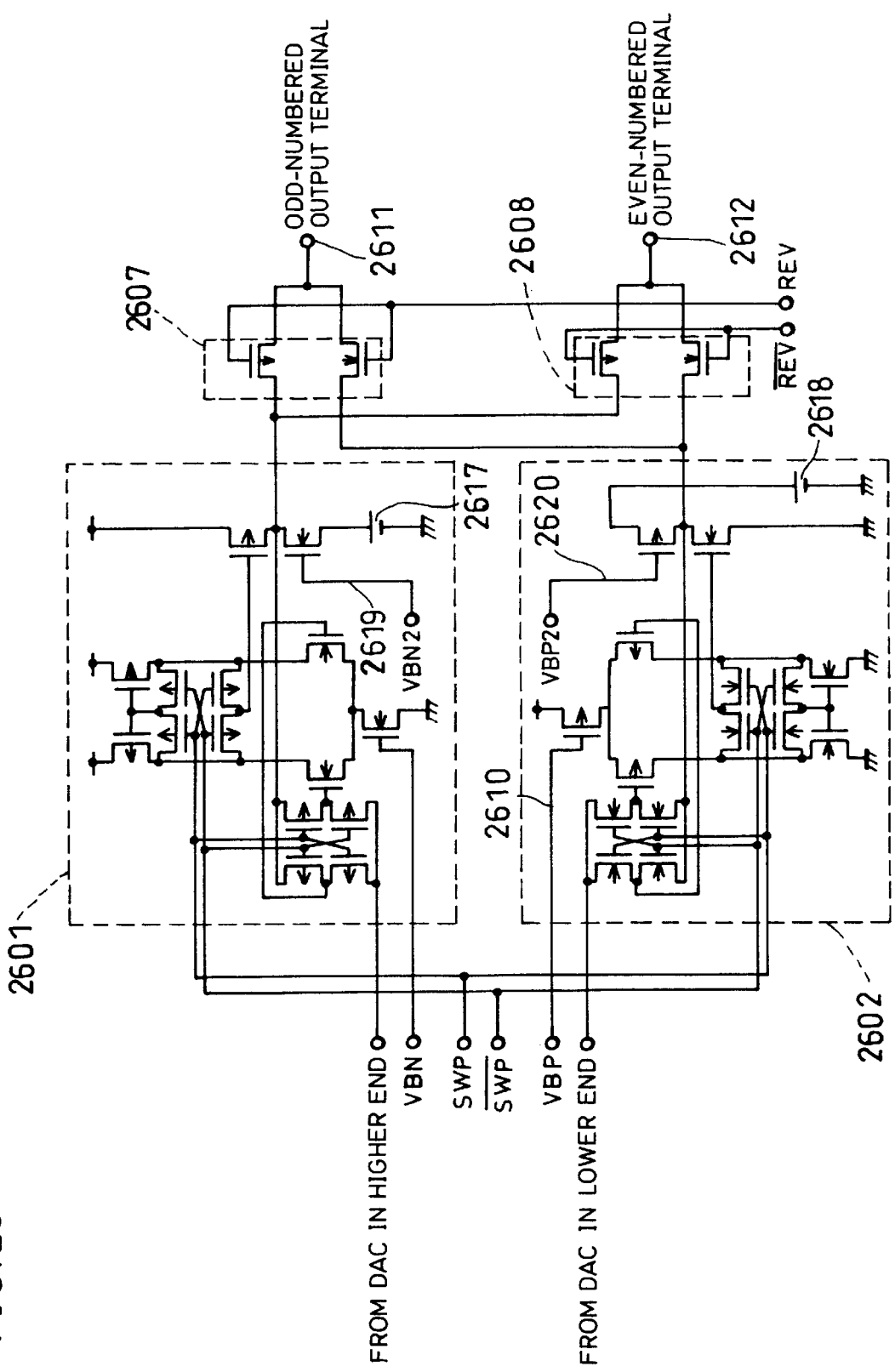
FIG. 25 is a circuit diagram showing an example arrangement in accordance with a tenth embodiment of the present invention.

FIG. 25 shows another example circuitry arrangement of the block 2115 of FIG. 21 as a tenth embodiment of the present invention. FIG. 25 corresponds to FIG. 23 and the arrangement is identical with the arrangement of FIG. 21 except for the portion shown in FIG. 25, and the explanation is not repeated herein.

In the drawing, numeral 2601 denotes the operational amplifier (see FIG. 19) explained in the seventh embodiment, and a voltage source 2617 is inserted to a source electrode of the output transistor of N-channel MOS. Numeral 2619 denotes a bias input entered through a terminal VBN2 to supply a bias voltage to the output transistor of N-channel MOS. Numeral 2602 denotes the operational amplifier (see FIG. 20) explained in the eighth embodiment, and a voltage source 2618 is inserted into a source electrode of the output transistor of P-channel MOS. Numeral 2620 denotes a bias input entered through a terminal VBP2 to supply a bias voltage to the output transistor of P-channel MOS. The voltage sources 2617 and 2618 can save the power consumption of the circuit as previously mentioned. The rest of the operation is identical with the operation explained in the ninth embodiment, and a detailed explanation thereof is omitted herein.

In FIG. 25, numeral 2611 denotes an odd-numbered output terminal and numeral 2612 denotes an even-numbered output terminal.

Figure 26:
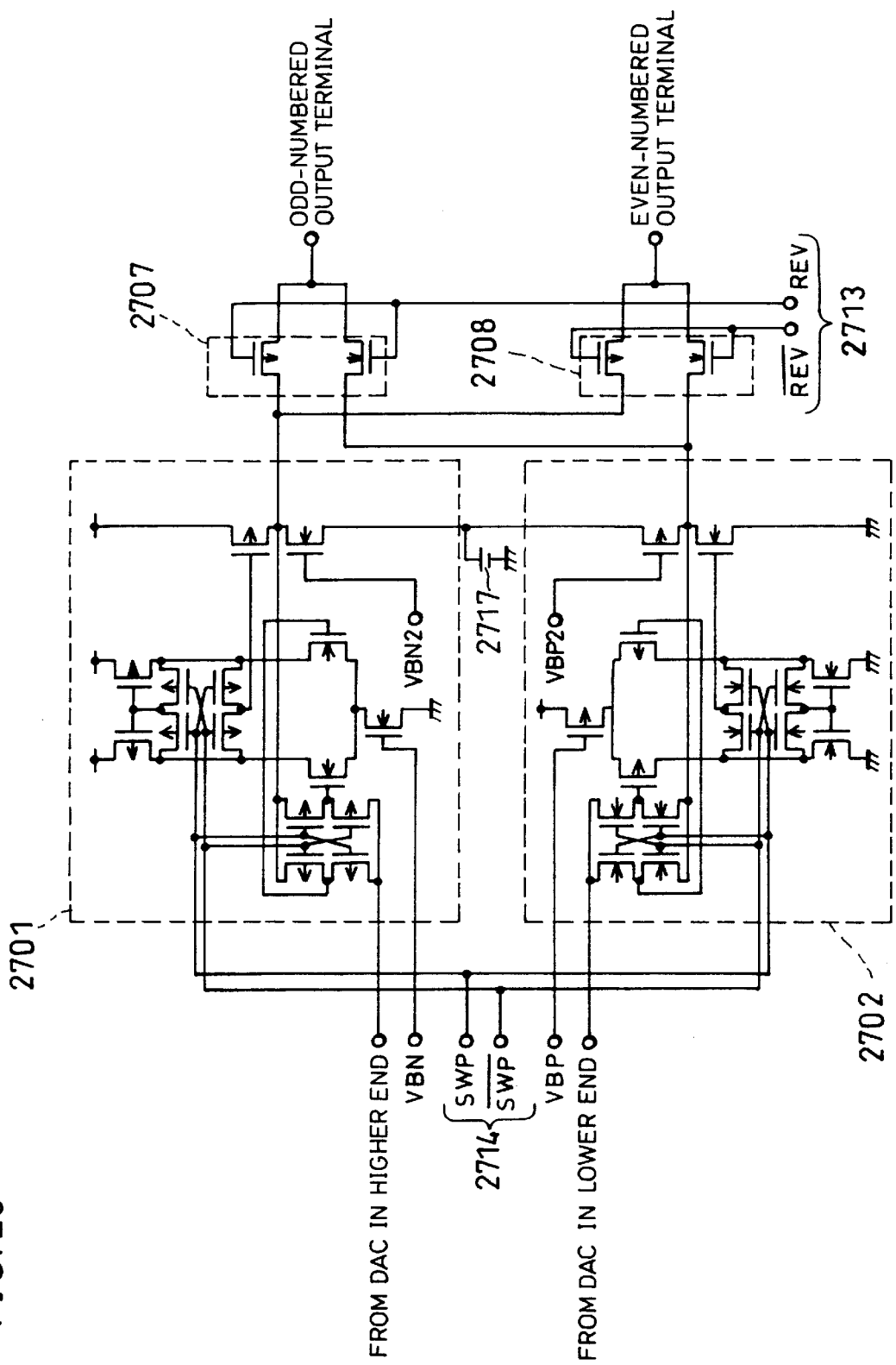
FIG. 26 is a circuit diagram showing an example arrangement of a liquid crystal driving circuit in accordance with an eleventh embodiment of the present invention.

FIG. 26 shows still another example circuitry arrangement of the block 2115 of FIG. 21 as an eleventh embodiment of the present invention. FIG. 26 corresponds to FIG. 23, and is identical with FIG. 21 except for the portion shown in FIG. 26, and the explanation is not repeated herein.

In the drawing, numeral 2717 denotes a voltage source connected to source electrodes of the output transistors of the operational amplifiers, which is in effect the voltage sources 2617 and 2618 of FIG. 25 combined together. Consequently, compared with a case where the voltage sources 2617 and 2618 are provided separately, the space can be saved. The effect of providing the voltage source 2717 is the same as the case shown in FIG. 25. A dot-inverting driven liquid crystal display can use a voltage source of the counter electrode of the liquid crystal panel directly as the voltage source 2717. The rest of the operation is identical with the operation explained in the ninth embodiment, and a detailed explanation thereof is omitted herein.

Also, in the drawing, numerals 2707 and 2708 denote output alternating switches which switch the polarity of the output voltage of the liquid crystal driving output.

Figure 27:
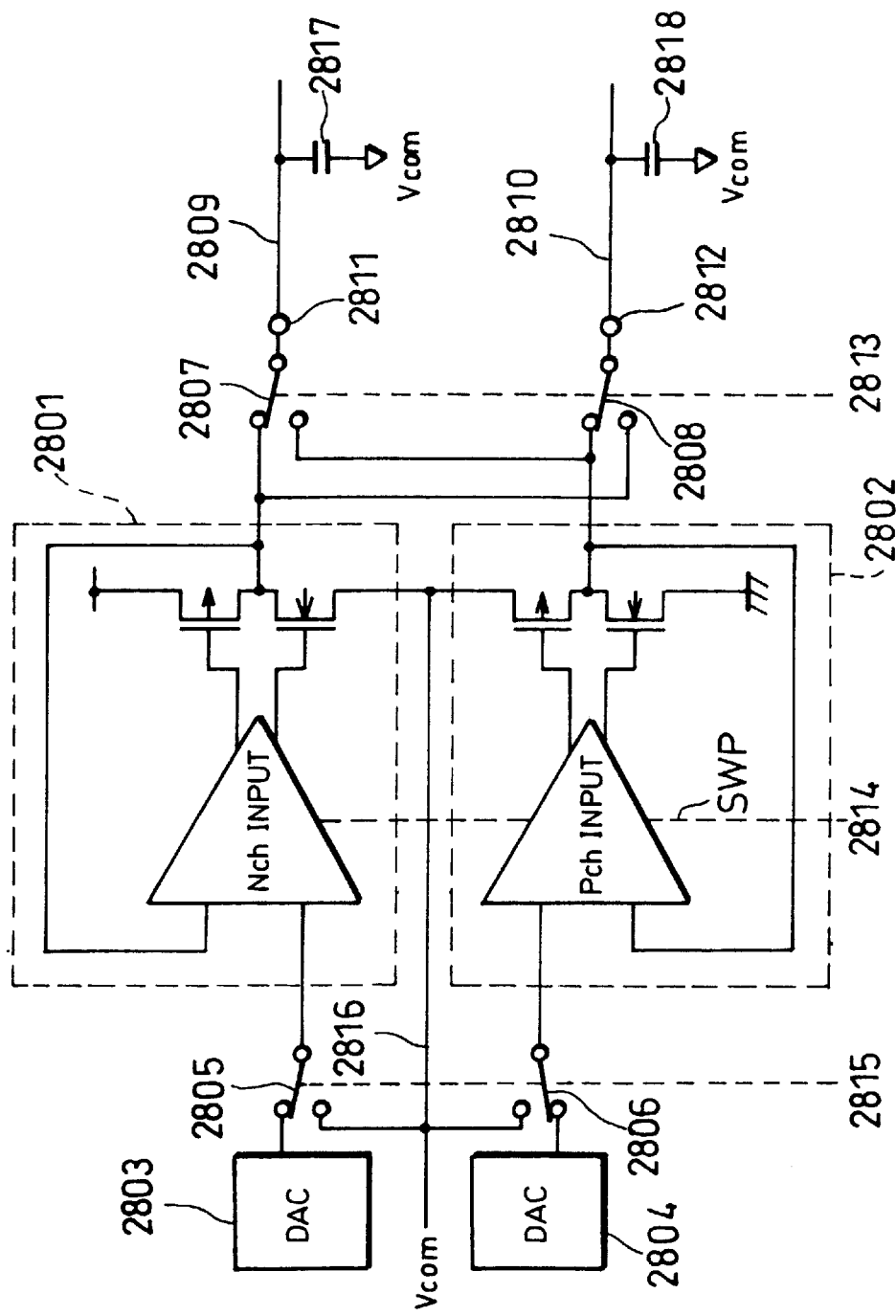
FIG. 27 is a circuit diagram showing an example arrangement of a liquid crystal driving circuit in accordance with a twelfth embodiment of the present invention.

FIG. 27 shows another example circuitry arrangement of the output circuit of FIG. 26 as a twelfth embodiment of the present invention. In the drawing, numeral 2801 corresponds to the operational amplifier 2701 of FIG. 26. Likewise, numeral 2802 corresponds to numeral 2702 of FIG. 26, numeral 2807 corresponds to numeral 2707 of FIG. 26, numeral 2808 corresponds to numeral 2708 of FIG. 26, numeral 2811 denotes an odd-numbered output terminal, numeral 2812 denotes an even-numbered output terminal, and numerals 2813 and 2814 correspond to numerals 2713 and 2714 of FIG. 26, respectively.

Numeral 2803 denotes a digital-to-analog converter which generates a positive liquid crystal driving voltage, numeral 2804 denotes a digital-to-analog converter which generates a negative liquid crystal driving voltage, numerals 2805 and 2806 denote switches which switch a connection of the input terminals of the operational amplifiers between the output terminal of the digital-to-analog converters and a power source terminal of an intermediate voltage, numerals 2809 and 2810 denote signal lines of the liquid crystal panel, numeral 2815 denotes a switching signal which switches the switches 2805 and 2806, numeral 2816 represents an intermediate voltage outputted from the same power source of a voltage (counter electrode voltage) applied to the counter electrode of the liquid crystal panel and corresponds to numeral 2717 in FIG. 26, which is expressed as Vcom herein. Numerals 2817 and 2818 denote adjacent two load capacitances of the liquid crystal panel.

Figure 28:
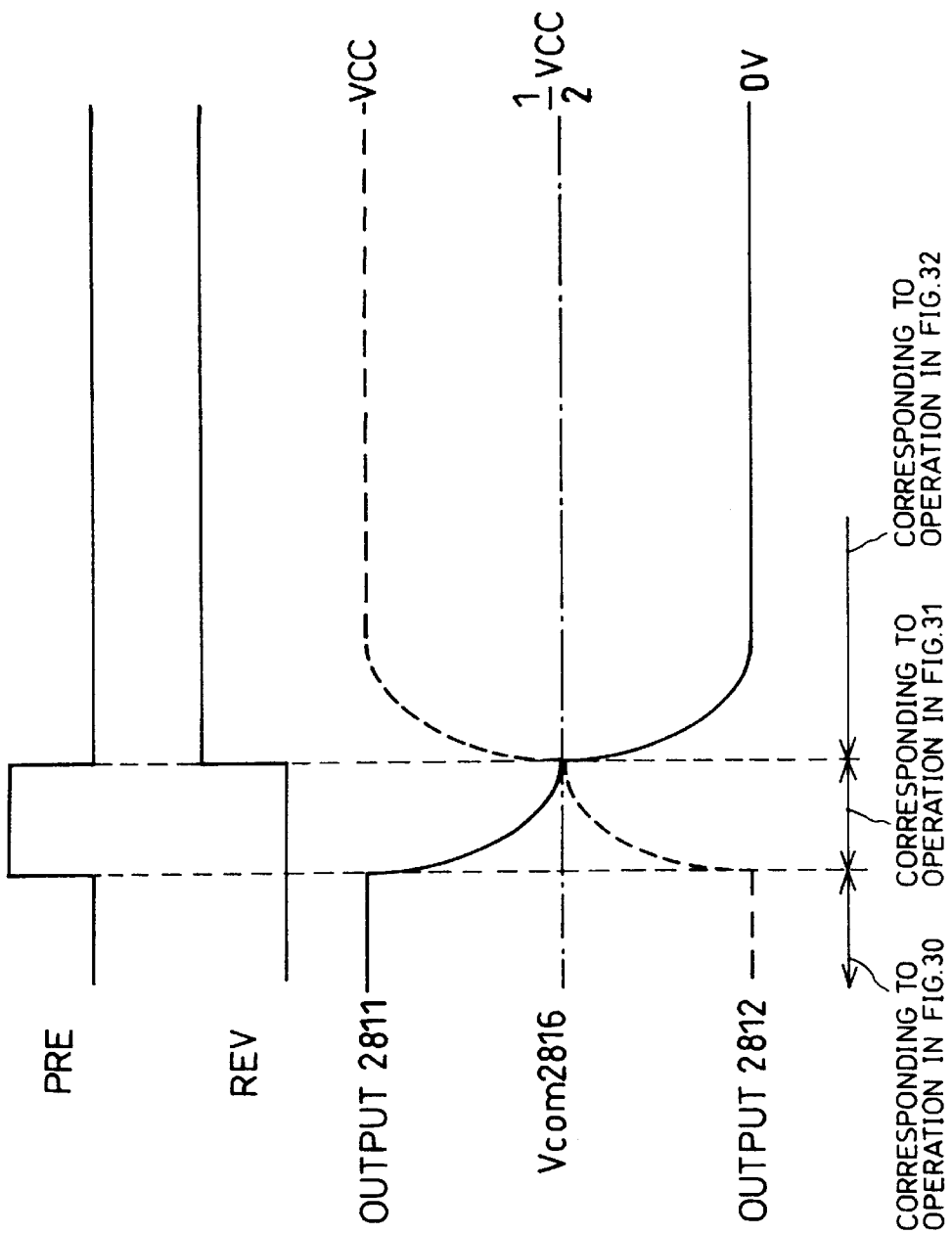
FIG. 28 is a view showing operating waveforms of a major portion of FIG. 27.

FIG. 28 shows a view of operating waveforms of the circuit shown in FIG. 27. Here, the alternating switch switching signal 2813 is represented by REV, and the input switching signal 2815 of the operational amplifier is represented by PRE. The switching signal 2814 which switches the switches in the operational amplifier is omitted herein, because it does not directly affect the operation of the circuit.

Figure 29:
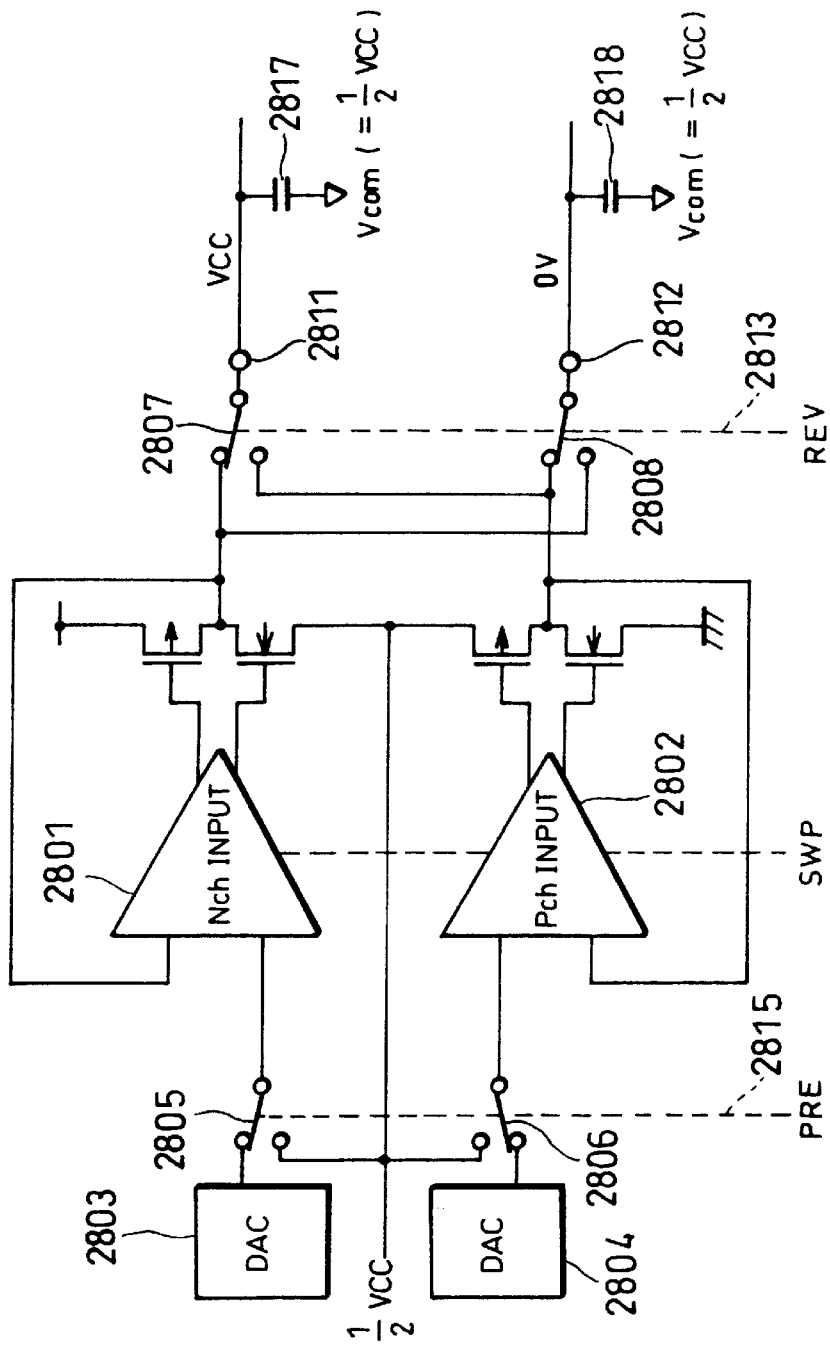
FIG. 29 is a circuit diagram explaining an operation in accordance with the twelfth embodiment based on the operating waveforms of FIG. 28, and showing an initial state of the operation.
Figure 30:
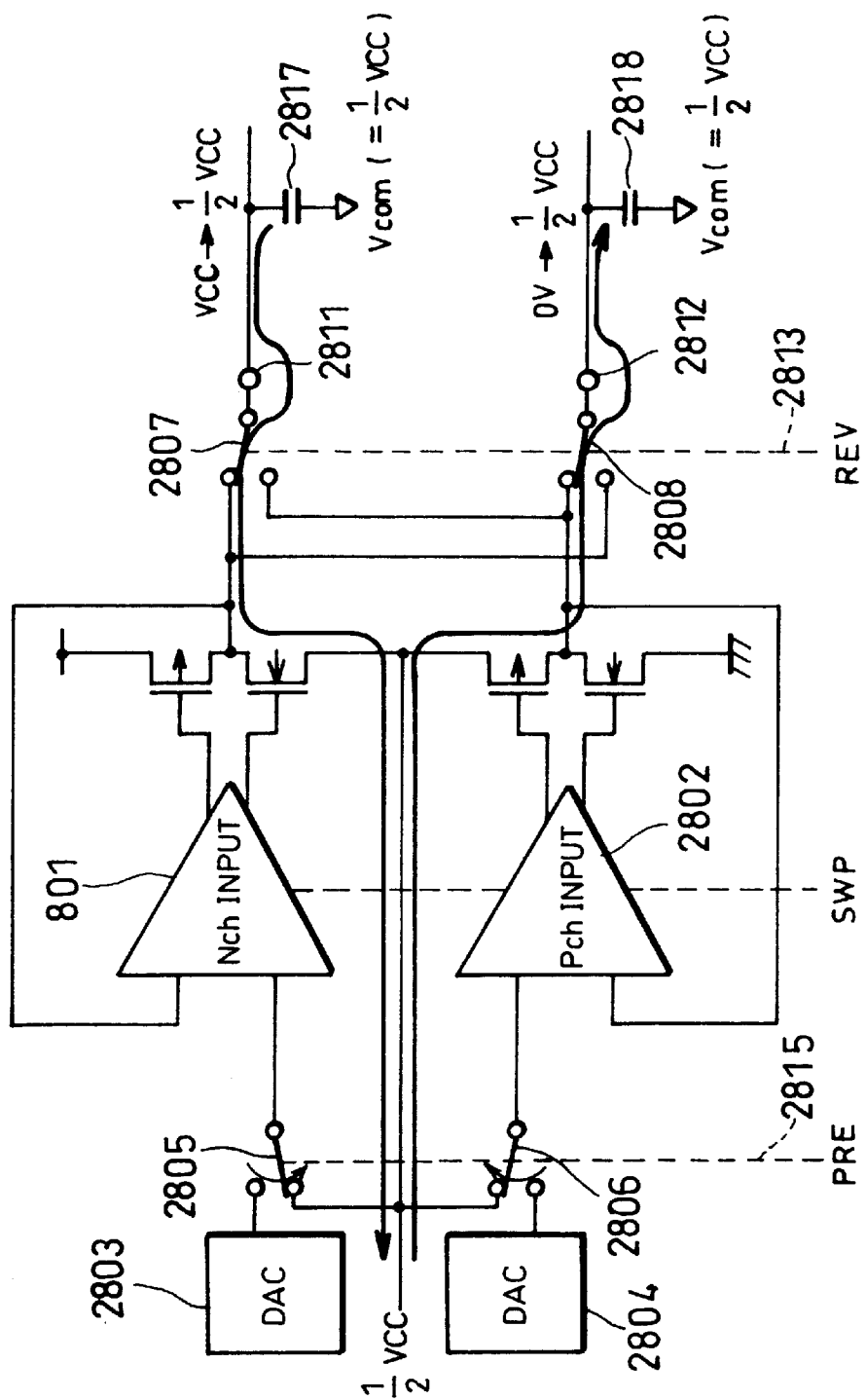
FIG. 30 is a circuit diagram explaining a state where an intermediate voltage is applied to an input terminal of the operational amplifier, and showing an operation as a voltage follower.
Figure 31:
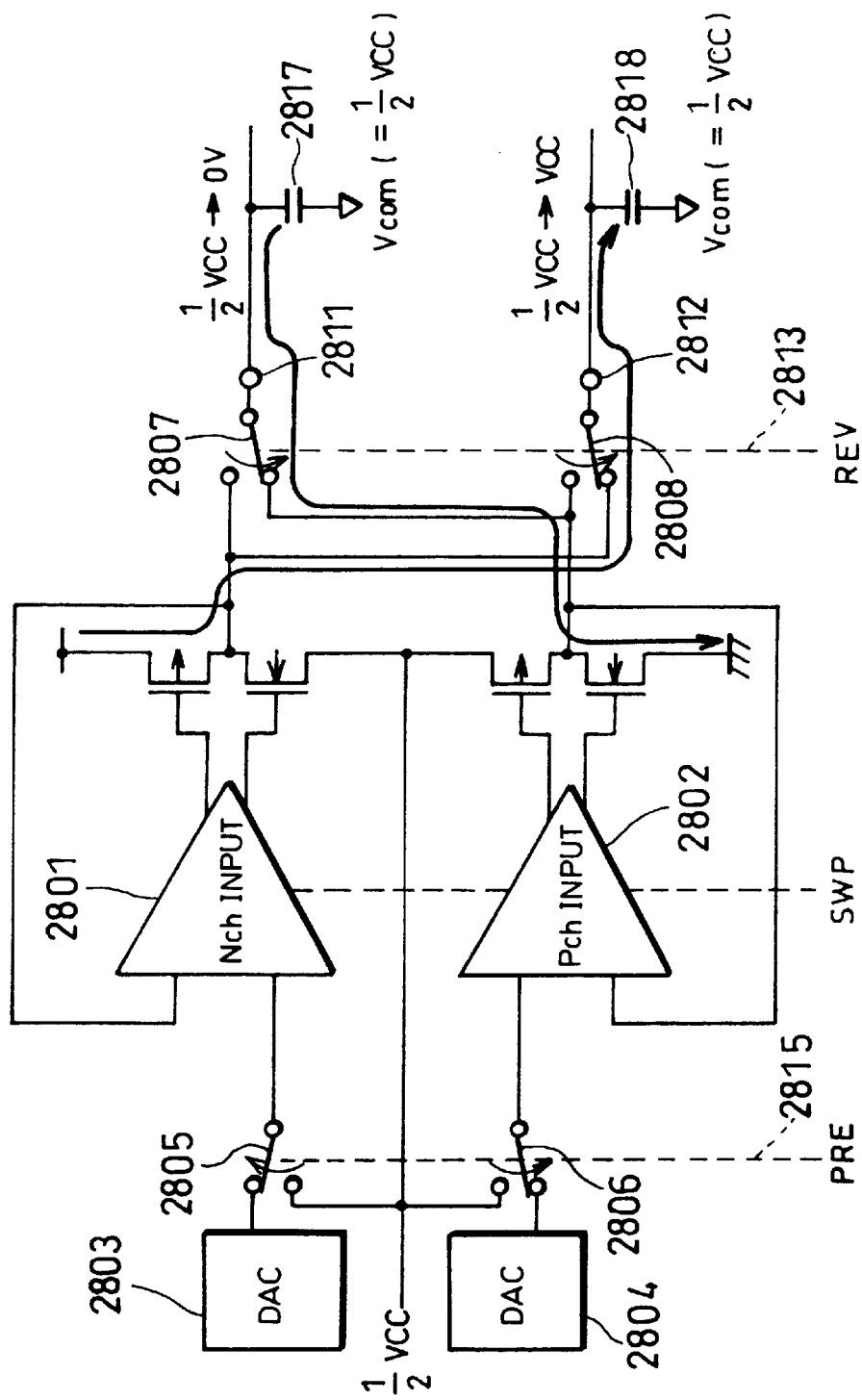
FIG. 31 is a circuit diagram explaining an operation of the operational amplifier when a liquid crystal driving voltage is inputted into the input terminal thereof.

The following will explain, with reference to FIGS. 29, 30, and 31, an operation in accordance with the present embodiment based on the operating waveforms shown in FIG. 28. Here, the intermediate voltage Vcom is half the power source voltage VCC for ease of explanation.

FIG. 29 shows an initial state, in which, assume that the positive digital-to-analog converter 2803 outputs VCC and the negative digital-to-analog converter 2804 outputs 0V. In this case, the load capacitance 2817 is charged by the operational amplifier 2801 to the power source voltage VCC, while the load capacitance 2818 is released to GND potential (0V) by the operational amplifier 2802.

Next, the PRE signal is switched, and an intermediate voltage Vcom (=VCC/2) is supplied to the input terminal of the operational amplifier by the switches 2805 and 2806 (state shown in FIG. 30), whereupon the operational amplifiers 2801 and 2802 start to operate as the voltage followers, thereby outputting intermediate voltages Vcom which are equal to the input voltage. Consequently, charges of the load capacitance 2817 are released to the intermediate voltage Vcom in a route indicated by a bold arrow, while at the same time, the load capacitance 2818 is charged from the intermediate voltage Vcom. The charges migrates in directions such that cancel out each other in terms of inbound and outbound with respect to the intermediate voltage Vcom. For this reason, a transient current of FIG. 30 does not consume power. When the transient current is controlled and stabilized, both the voltages of the two load capacitances are Vcom, that is, half of VCC.

Then, the PRE signal is switched, and outputs from the digital-to-analog converters are connected to the input terminals of the operational amplifiers, while at the same time, when the alternating switch switching signal is switched, currents start to flow in routes indicated by bold arrows in FIG. 31. In other words, the load capacitance 2817 is released to 0V by the operational amplifier 2802, while the load capacitance 2818 is charged to VCC by the operational amplifier 2801. As has been discussed, in the present embodiment, since only the operation shown in FIG. 31 consumes power, power necessary to charge the load is reduced to half compared with the conventional circuit. Consequently, power consumption when alternating the output voltage in the liquid crystal display element can be saved markedly.

Figure 32:
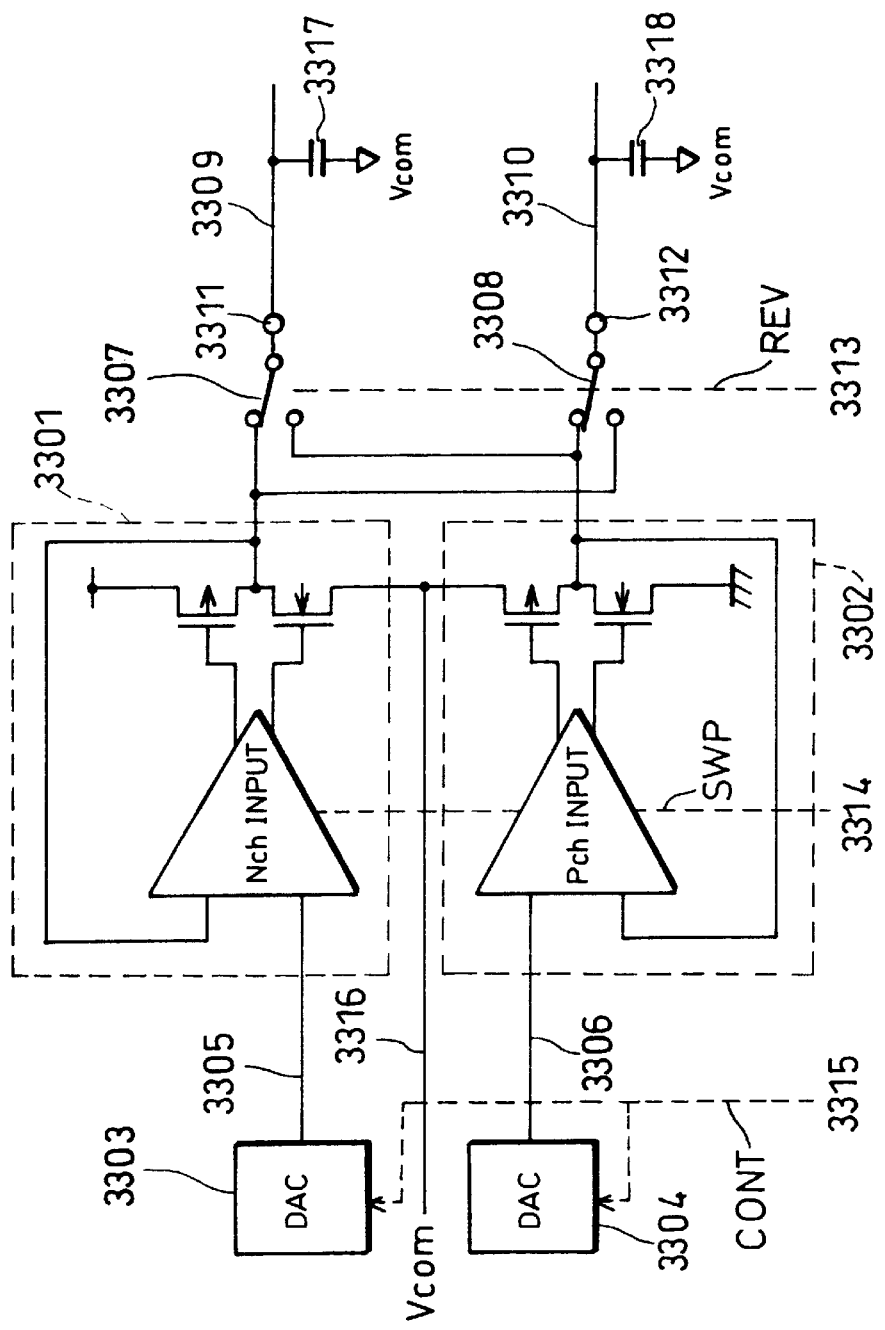
FIG. 32 is a circuit diagram showing an example arrangement of a liquid crystal driving circuit in accordance with a thirteenth embodiment of the present invention.

FIG. 32 shows another example circuitry arrangement employing the output circuit of FIG. 26 as a thirteenth embodiment. In the drawing, numeral 3301 corresponds to the operational amplifier 2701 of FIG. 26. Likewise, numeral 3302 corresponds to numeral 2702 of FIG. 26, numeral 3307 corresponds to numeral 2707 of FIG. 26, numeral 3308 corresponds to numeral 2708 of FIG. 26, numeral 3311 denotes an odd-numbered output terminal, numeral 3312 denotes an even-numbered output terminal, numeral 3313 corresponds to numeral 2713 of FIG. 26, and numeral 3314 corresponds to numeral 2714 of FIG. 26.

Numeral 3303 denotes a digital-to-analog converter which generates a positive liquid crystal driving voltage, numeral 3304 denotes a digital-to-analog converter which generates a negative liquid crystal driving voltage, numeral 3305 denotes an output signal from the positive digital-to-analog converter, numeral 3306 denotes an output signal from the negative digital-to-analog converter, numerals 3309 and 3310 denote signal lines of the liquid crystal panel, numeral 3315 denotes a control signal of the digital-to-analog converters, which is furnished with a function for fixing the output voltages from the two digital-to-analog converters to an approximation of the intermediate voltage. Numeral 3316 denotes the intermediate voltage (Vcom) outputted from the same power source as the voltage applied to the counter electrode of the liquid crystal panel, which corresponds to the voltage source 2717 of FIG. 26. Numerals 3317 and 3318 denote two adjacent load capacitances in the liquid crystal panel.

Figure 33:
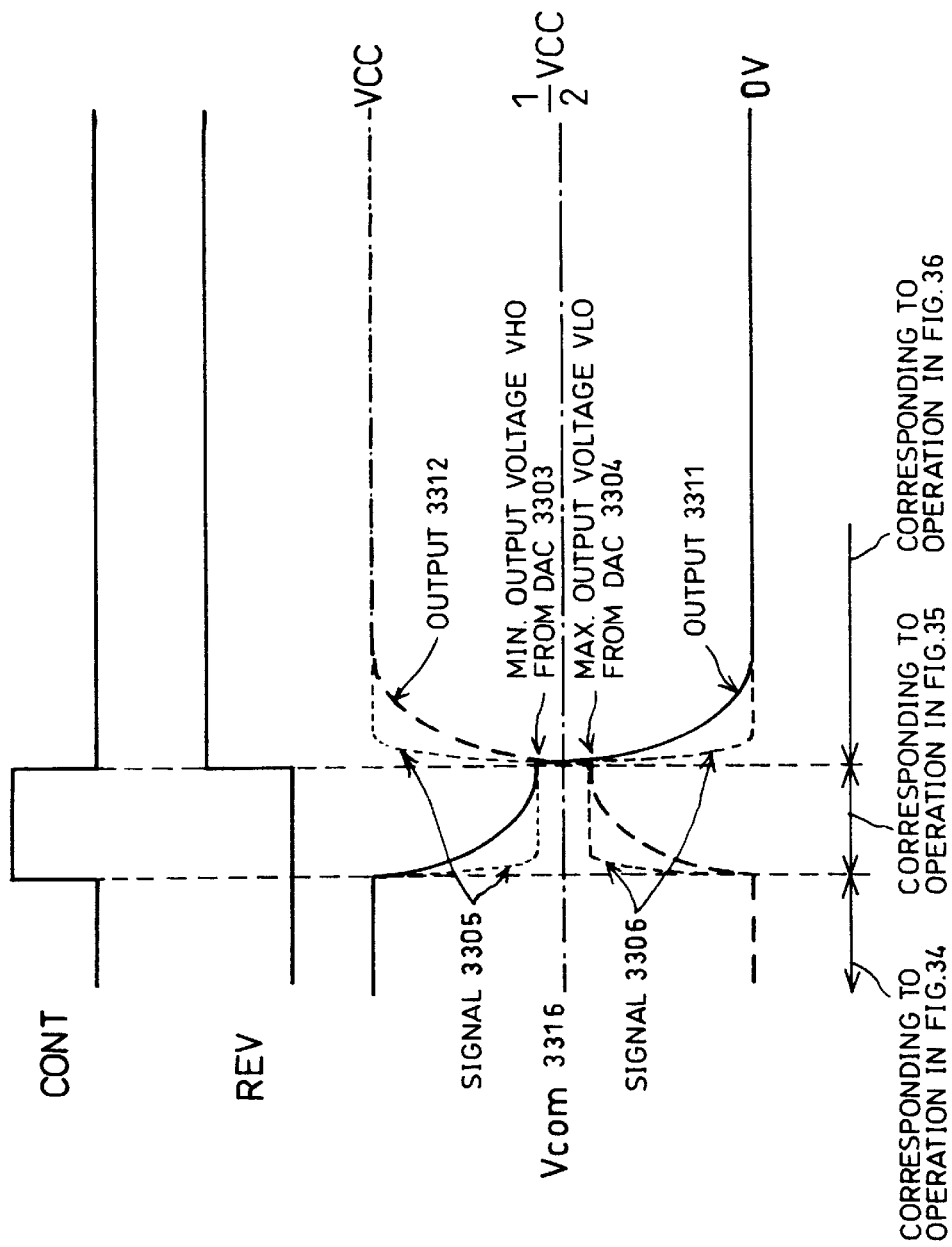
FIG. 33 is a view showing operating waveforms of a major portion of FIG. 32.

FIG. 33 shows a view of operating waveforms of major signals for the circuit of FIG. 32. Here, the alternating switch switching signal 3313 is referred to as REV, and a digital-to-analog conversion control signal 3315 is referred to as CONT. Also, a switching signal 3314 which switches the switches provided in the operational amplifiers is referred to as SWP, but explanation of SWP is omitted herein because it does not affect the operation explained below.

In FIG. 33, the lowest output voltage from the positive digital-to-analog converter 3303 is indicated as VH0, and the highest output voltage from the negative digital-to-analog converter 3304 is indicated as VL0. Generally, VH0 is far higher than Vcom, and VL0 is slightly lower than Vcom, but VH0 and VL0 can be the same.

Figure 34:
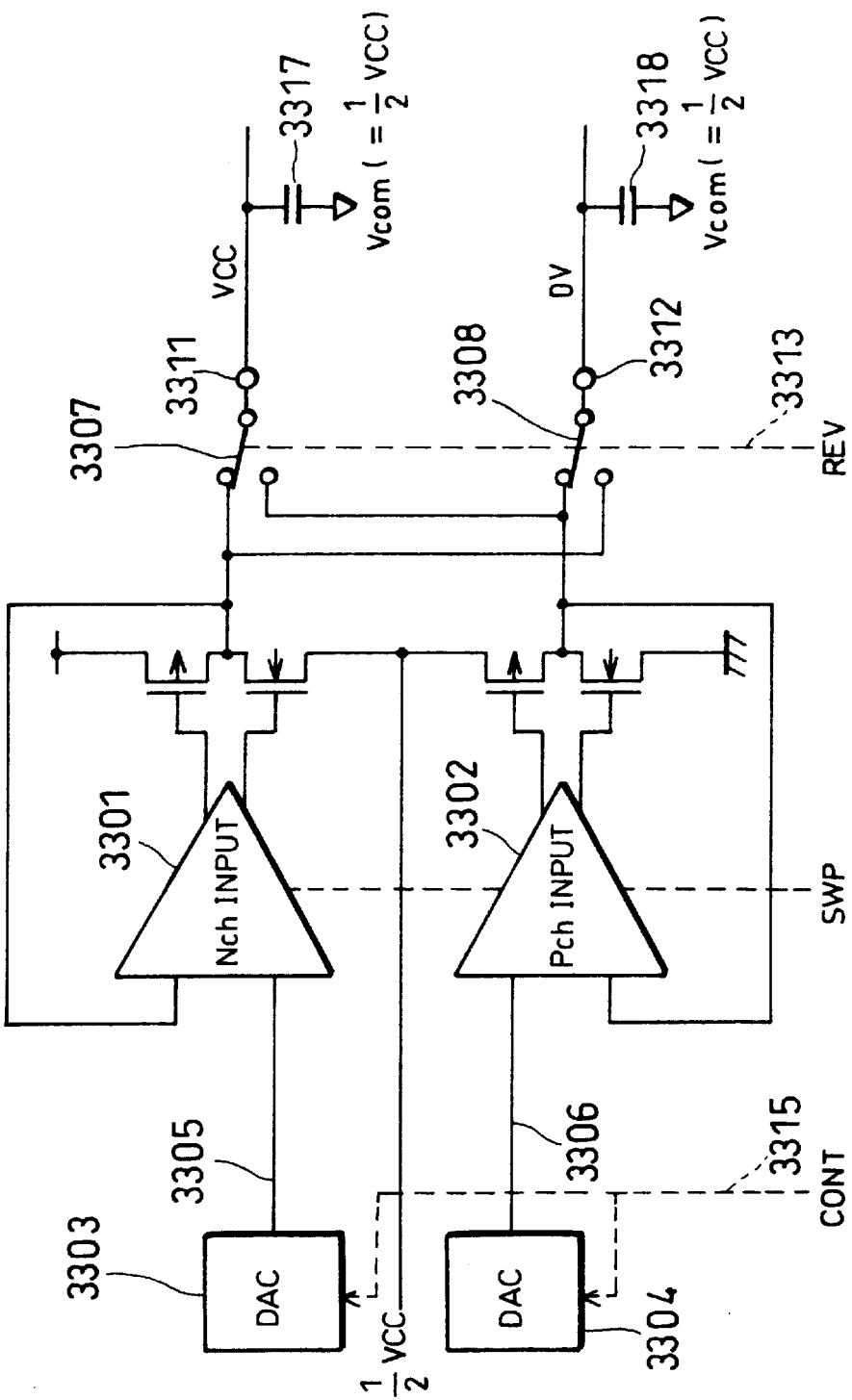
FIG. 34 is a circuit diagram explaining an operation in accordance with the thirteenth embodiment based on the operating waveforms of FIG. 33, and showing an initial state of the operation.
Figure 35:
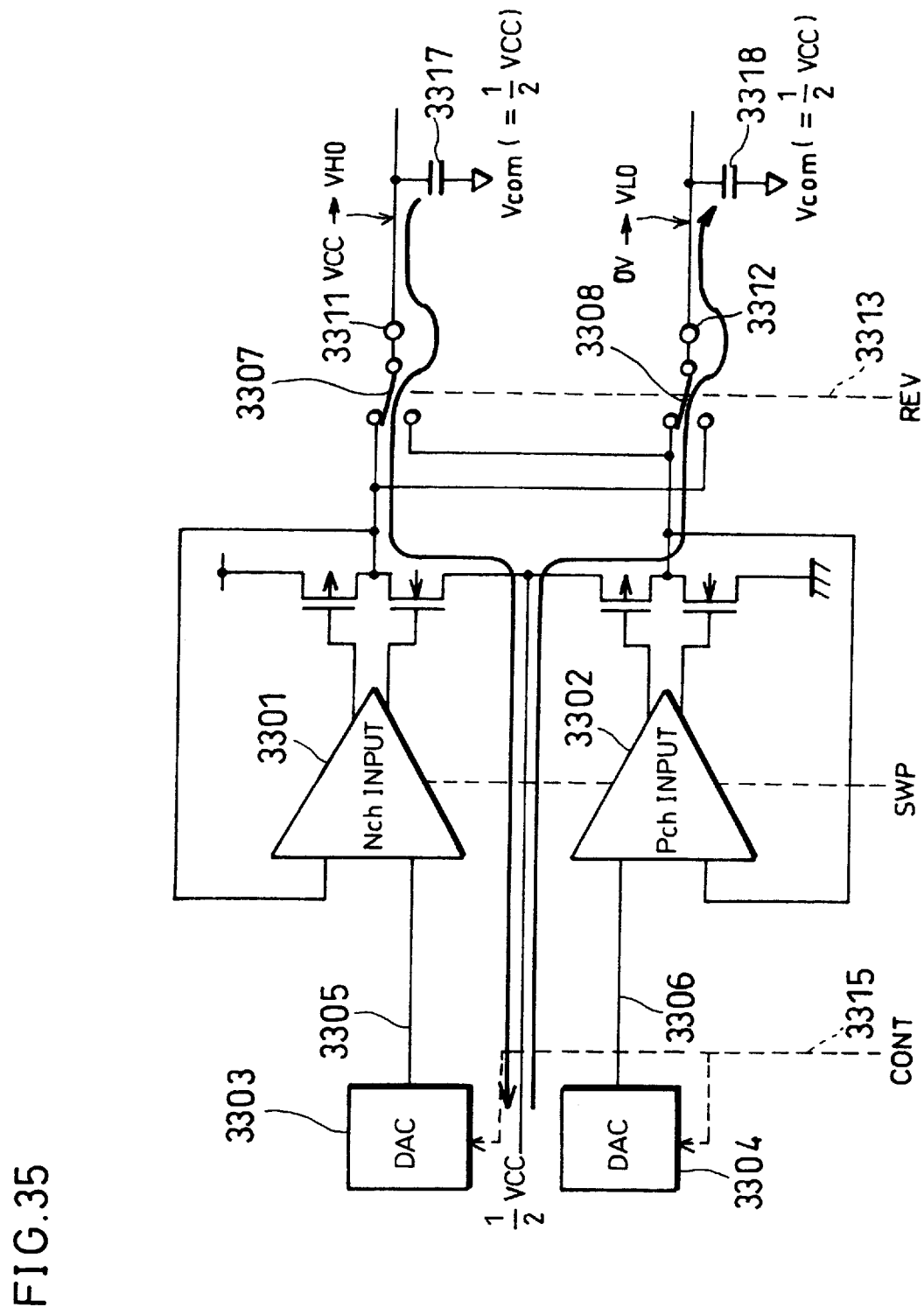
FIG. 35 is a circuit diagram showing an operation of the operational amplifier when a voltage half the operating voltage of FIG. 34 is inputted thereto.
Figure 36:
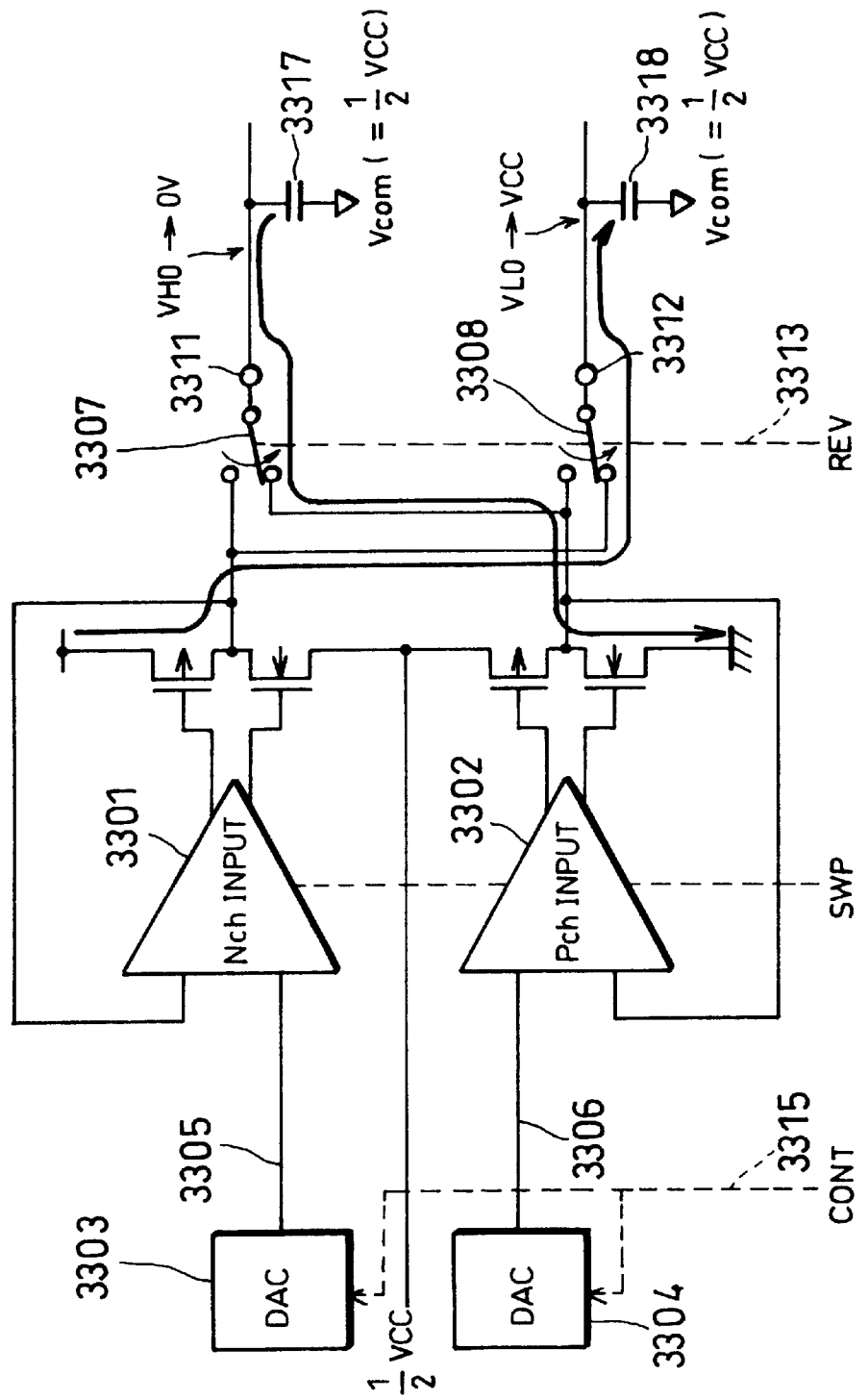
FIG. 36 is a circuit diagram showing an operation of the operational amplifier when a voltage other than half the operating voltage of FIG. 34 is inputted thereto.
Figure 37:
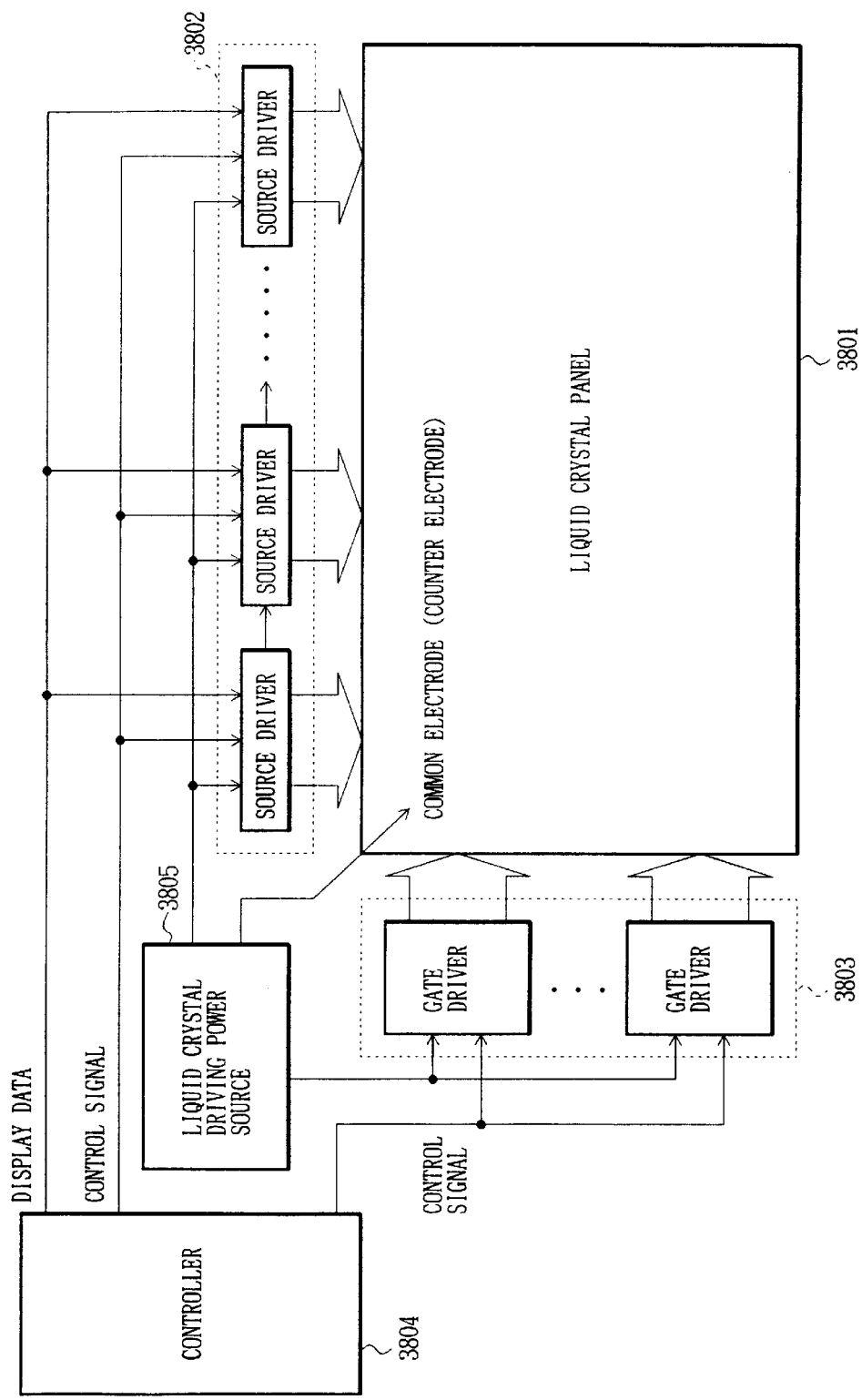
FIG. 37 is a view explaining a block diagram of a conventional TFT liquid crystal display representing liquid crystal displays of an active matrix method.
Figure 38:
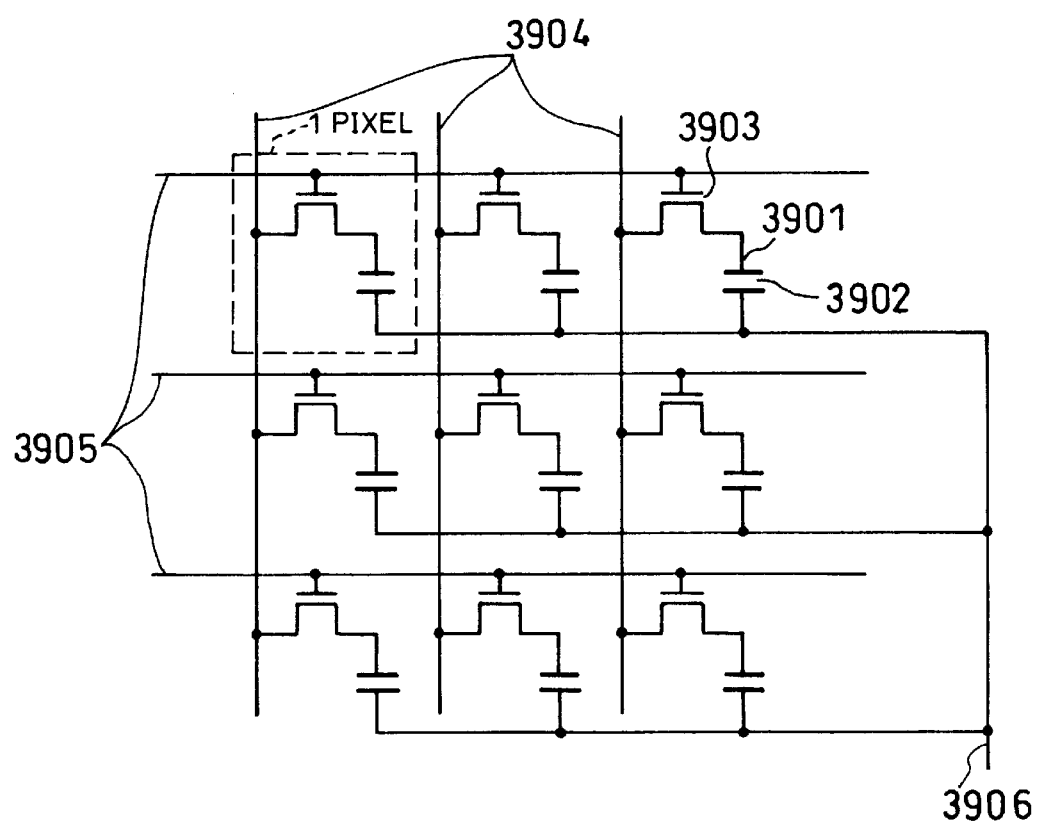
FIG. 38 is a view explaining an arrangement of a conventional TFT liquid crystal panel.
Figure 39:
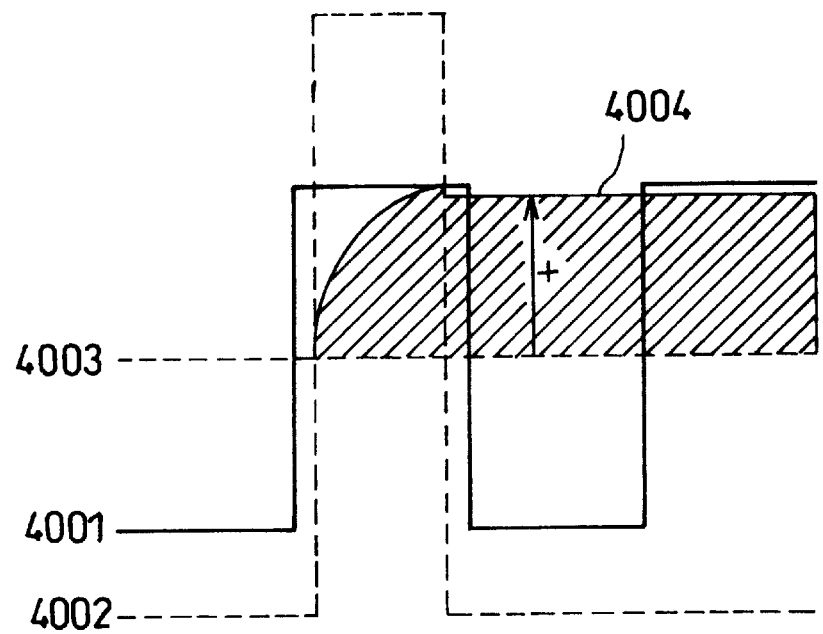
FIG. 39 is a view showing an example of a conventional liquid crystal driving waveform, and a case where the TFT is turned ON by an output from a gate driver when an output voltage of a source driver is higher than an output voltage of a counter electrode, so that a positive voltage with respect to the counter electrode is applied to a pixel electrode.
Figure 40:
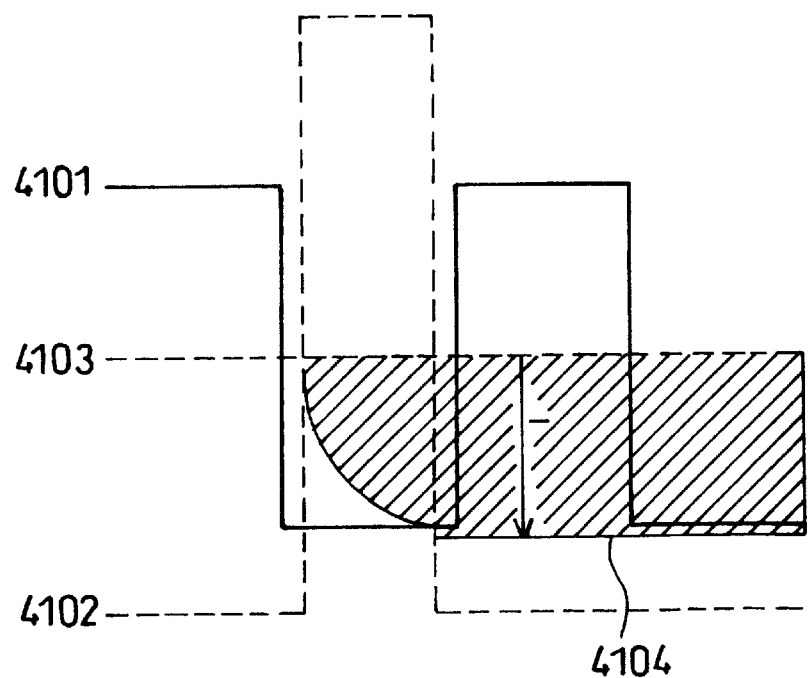
FIG. 40 is a view showing an example of a conventional liquid crystal driving waveform, and a case where the TFT is turned ON by an output from a gate driver when an output voltage of a source driver is lower than an output voltage of a counter electrode, so that a negative voltage with respect to the counter electrode is applied to a pixel electrode.
Figure 41:
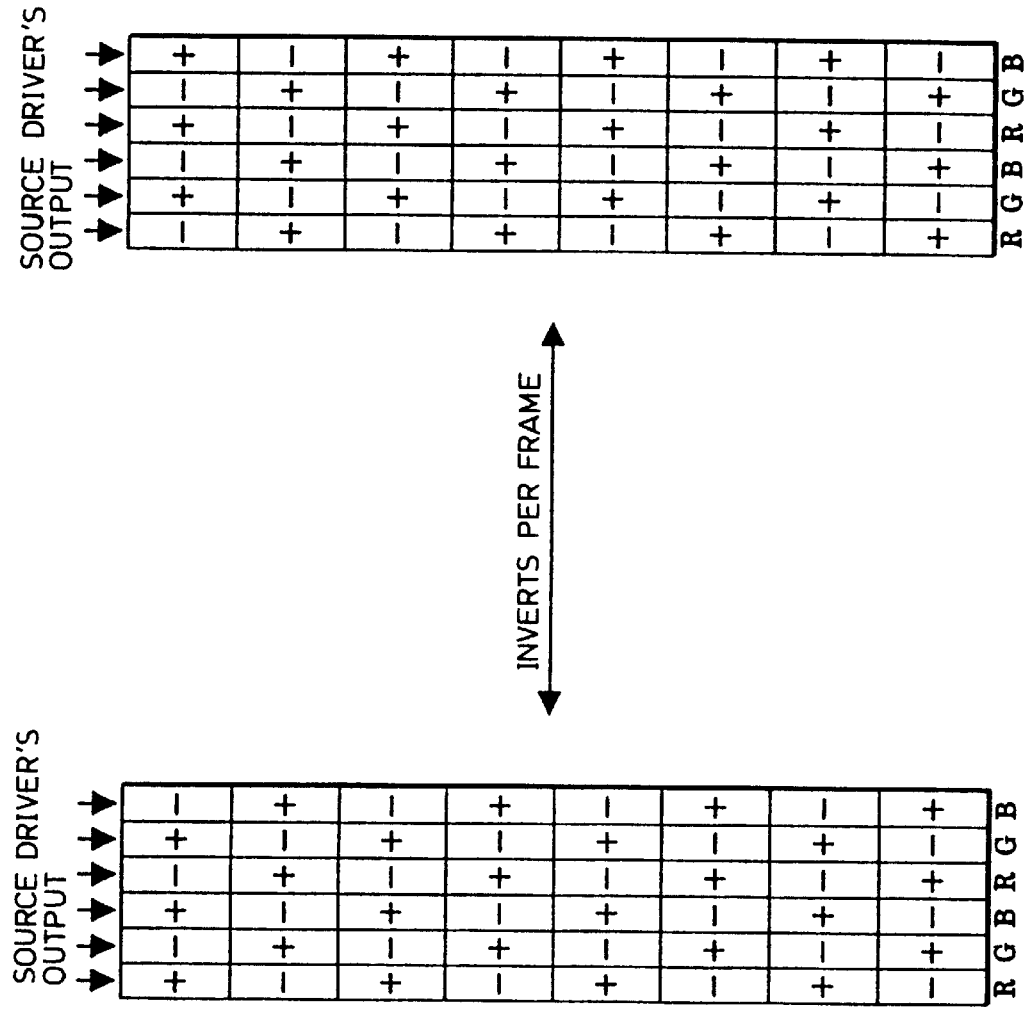
FIG. 41 is a view explaining an example of alignment of polarities on a liquid crystal panel when converting a liquid crystal driving voltage to an alternating voltage in a conventional case.
Figure 42:
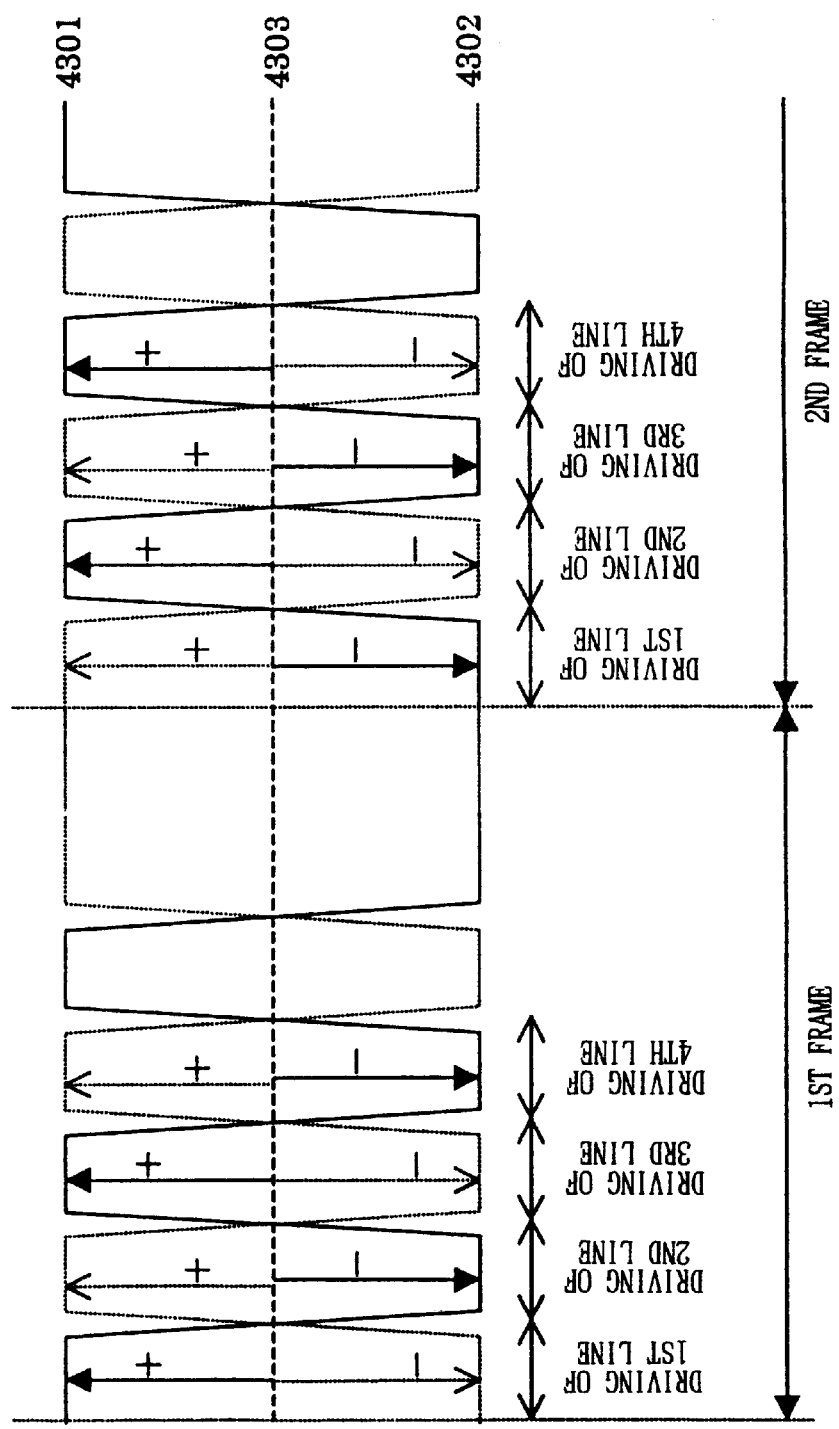
FIG. 42 is a view explaining an example of a driving waveform of a source driver by conventional dot-inverting driving.
Figure 43:
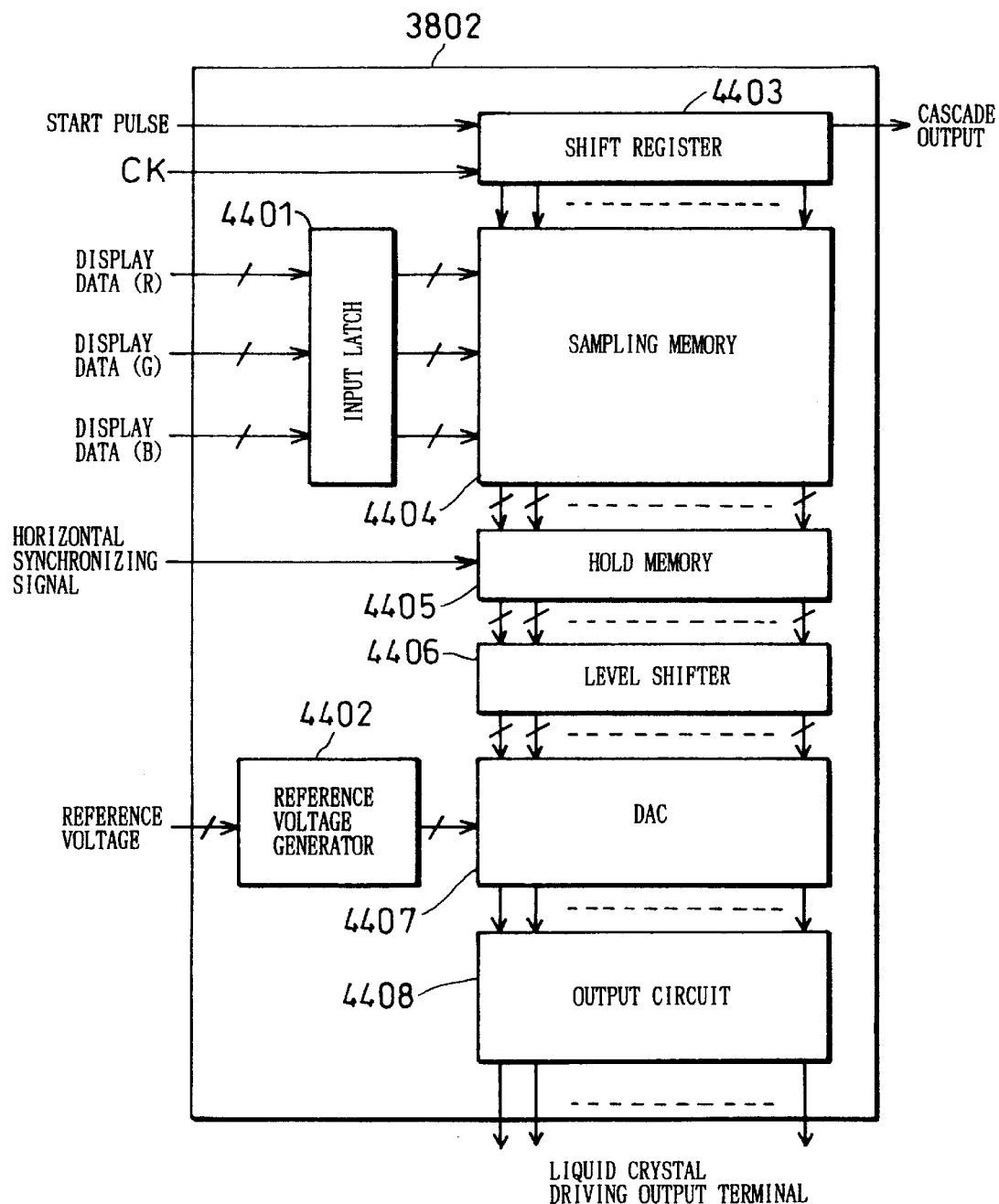
FIG. 43 is a block diagram showing an example arrangement of a conventional source driver IC.
Figure 45A:
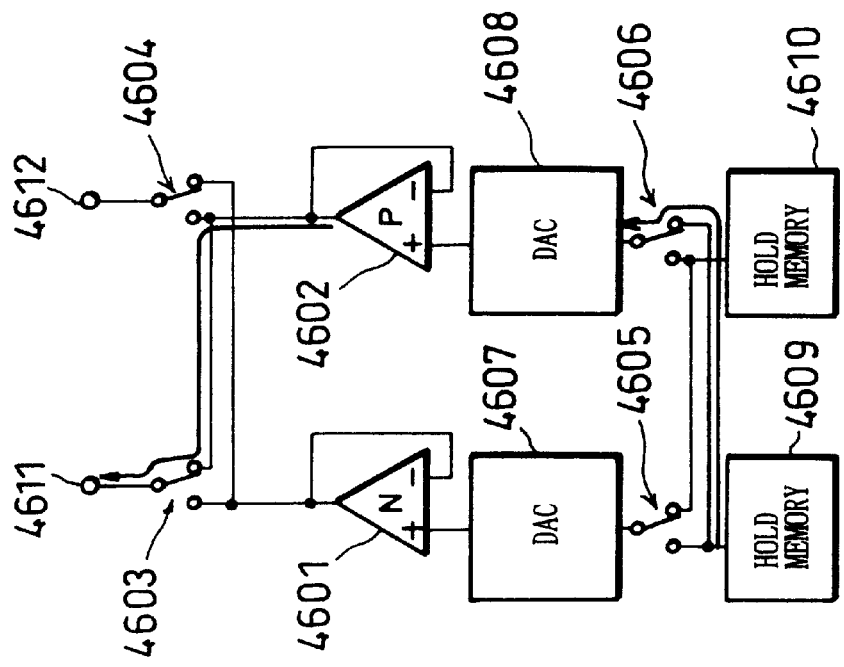
FIGS. 45(*a*) and 45(*b*) are block diagrams showing source driver IC output circuits which carry out dot-inverting driving of the second prior art.
Figure 45B:
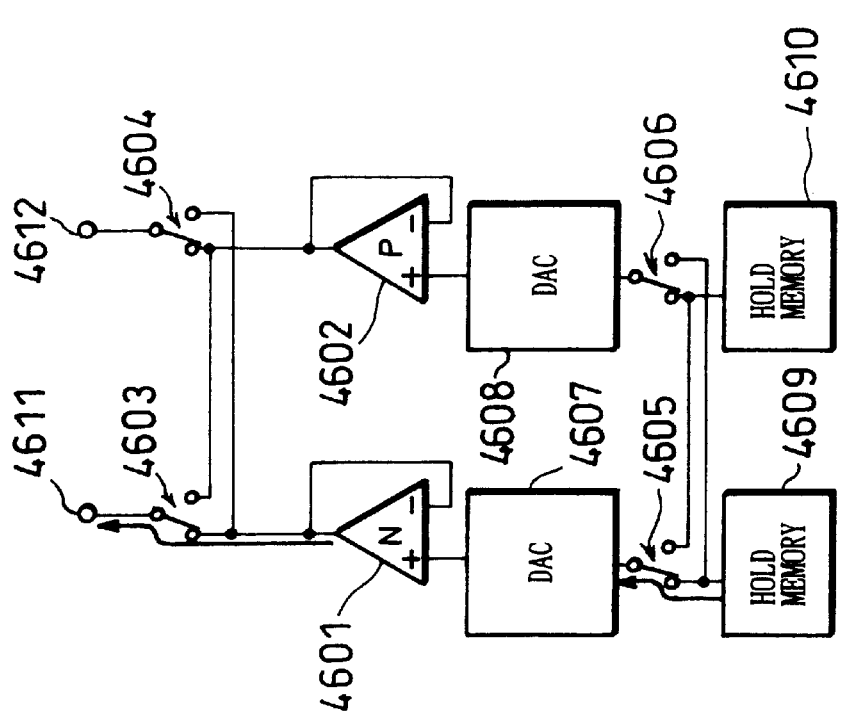
Figure 46:
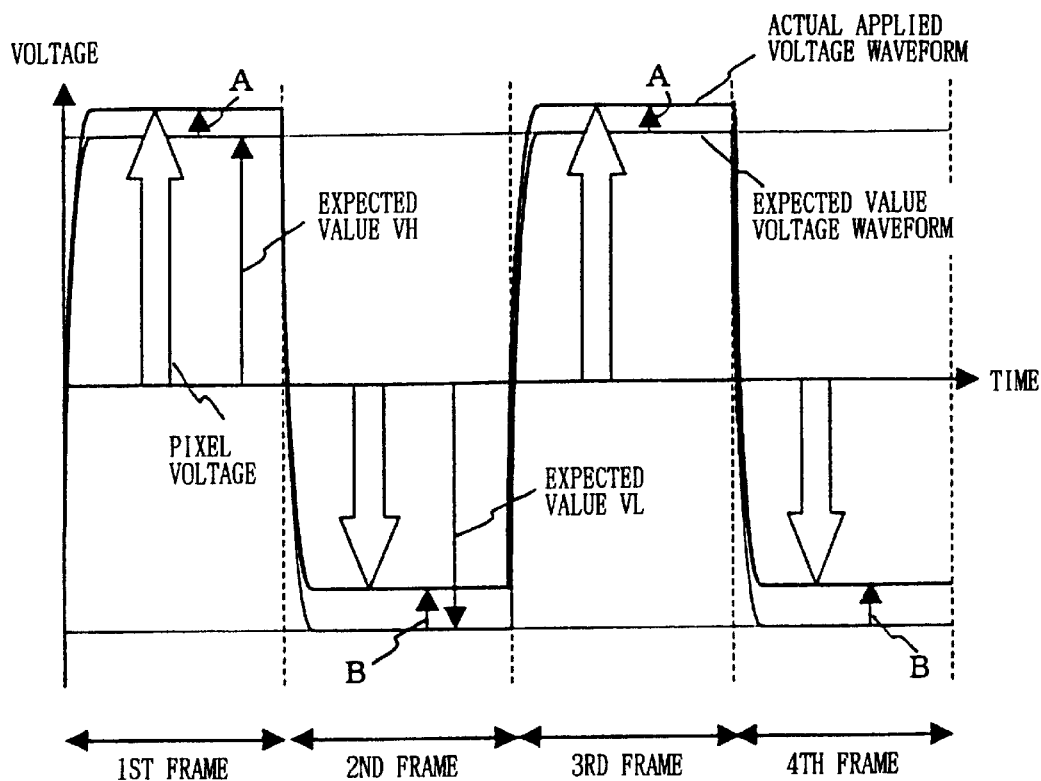
FIG. 46 is a view showing example waveforms of a liquid crystal driving voltage when a conventional operational amplifier has an incidental offset voltage.
Figure 47:
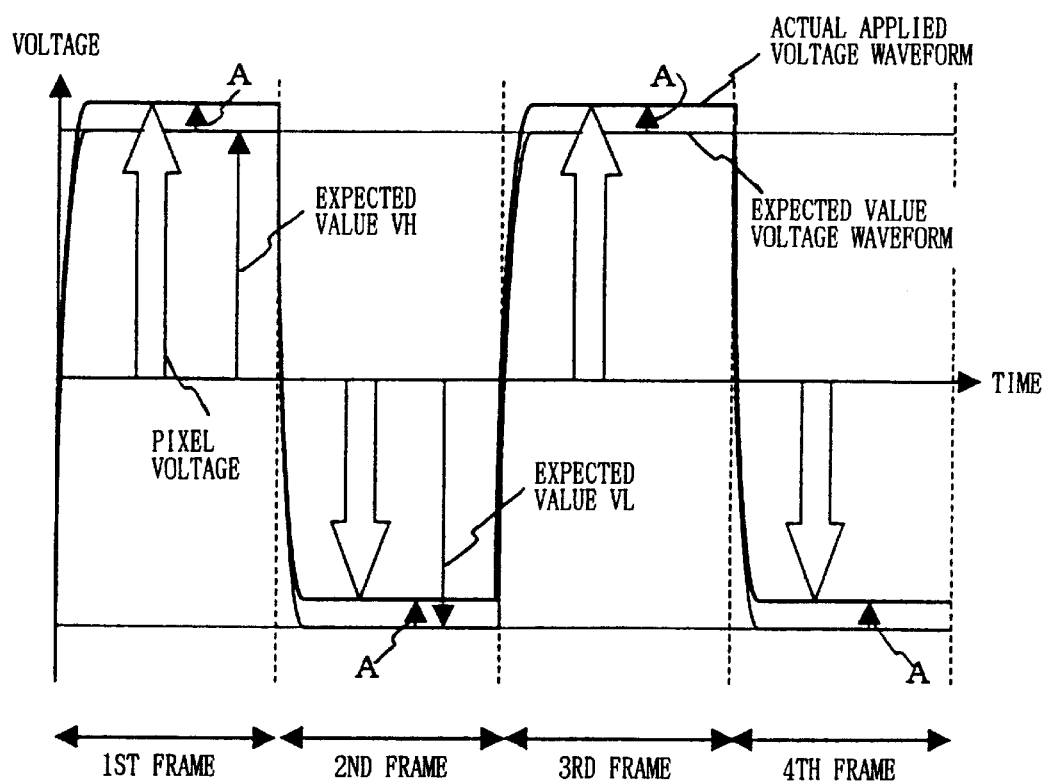
FIG. 47 is a view showing a waveform of a liquid crystal driving voltage when the arrangement of FIGS. 44(*a*) and 44(*b*) is adopted.

FIGS. 34, 35, and 36 are views which explain an operation of the present embodiment based on the operating waveforms shown in FIG. 33. FIG. 34 shows an initial state, which is the same as the state shown in FIG. 29 of the twelfth embodiment.

FIG. 35 shows a next state, where CONT signal is switched, whereupon the positive digital-to-analog converter 3303 outputs a voltage VH0 and the negative digital-to-analog converter 3304 outputs a voltage VL0. Since the two operational amplifiers 3301 and 3302 operate as the voltage followers, the operational amplifier 3301 outputs VH0 and the operational amplifier 3302 outputs VL0. Hence, the charges in the load capacitance 3317 are released to the intermediate voltage Vcom, while at the same time, the load capacitance 3318 is charged from the intermediate voltage Vcom in routes shown in FIG. 35.

The charges migrates in directions such that cancel out each other in terms of inbound and outbound with respect to the intermediate voltage Vcom (see the bold arrows in FIG. 35). For this reason, a transient current of FIG. 35 does not consume power. When the transient current is controlled and stabilized, a potential of the load capacitance 3317 stays at VH0, and a potential of the load capacitance 3318 stays at VL0. When the CONT signal is switched next, the two digital-to-analog converters 3303 and 3304 output their respective initial display voltages, while at the same time, currents start to flow in routes indicated by the bold arrows in FIG. 35 when the alternating switch switching signal is switched.

In other words, the load capacitance 3317 is released to 0V by the operational amplifier 3302, while the load capacitance 3318 is charged to VCC by the operational amplifier 3301. As has been discussed, in the present embodiment, it is the operation shown in FIG. 36 alone that consumes power, and power necessary to charge the load is reduced to half compared with the conventional circuit. Consequently, power consumption when converting the output voltage of the liquid crystal display element to an alternating voltage can be saved considerably.

As has been discussed, the differential amplifier of the present invention is a differential amplifier with a MOS transistor input which includes a pair of source-coupled pair MOS transistors, two input terminals which supply gate signals to the two transistors, two resistor elements used as loads for the two transistors, and two output terminals which take out output signals from the two resistor elements, and further includes a switching element which switches the two input terminals, and another switching element which switches the two output terminals, and a switching signal input terminal which switches the switching elements. The load element is composed of a resistor element, for example.

Another differential amplifier of the present invention is a differential amplifier with a MOS transistor input which includes a pair of source-coupled pair MOS transistors, two input terminals which supply gate signals to the two transistors, a pair of MOS transistors forming a current mirror which will be used as active loads of the source-coupled pair transistors, and two output terminals which take out output signals from the two load transistors, and further includes a switching element which switches the two input terminals, another switching element which switches the two output terminals, and a switching signal input terminal which switches the switching elements.

A CMOS operational amplifier with an N-channel MOS transistor input of the present invention employs the above differential amplifier in its input circuit.

Also, a CMOS operational amplifier with a P-channel MOS transistor input of the present invention employs the above differential amplifier in its input circuit.

In the CMOS operational amplifier of the present invention, the source electrode of the N-channel MOS transistor in the output stage of the operational amplifier with the N-channel MOS transistor input is connected to a third potential which is higher than a GND potential and lower than a power source potential.

In the CMOS operational amplifier of the present invention, in the operational amplifier of the input transistors of P-channel MOS, the source electrode of the input transistor of P-channel MOS in the output stage is connected to a third potential which is higher than a GND potential and lower than a power source potential.

A liquid crystal driving circuit of the present invention includes one of the above-mentioned operational amplifiers with the N-channel MOS transistor inputs, one of the above-mentioned operational amplifiers with the P-channel MOS transistor inputs, two liquid crystal driving output terminals through which output signals of the above-mentioned two operational amplifiers are outputted, a switching element which switches a connection of the output terminals of the above-mentioned two operational amplifiers to the above-mentioned two liquid crystal driving output terminals somewhere therebetween, and a switching signal input terminal which switches the switching elements.

The liquid crystal driving circuit preferably further includes a switching element which temporarily connects an input terminal of the operational amplifier with the N-channel input to a third potential which is higher than a GND potential and lower than a power source potential. Additionally, it preferably includes a switching element which temporarily connects an input terminal of the operational amplifier with the P-channel input to the third potential which is higher than the GND potential and lower than the power source voltage.

According to the above invention, by switching the input transistors of the differential amplifier, incidental offset voltages caused by discrepancies in material and workmanship can be averaged on the liquid crystal display element, thereby making it possible to assemble a liquid crystal display capable of showing high quality display.

According to the above invention, a high-quality liquid crystal display can be realized without using an output operational amplifier of a full dynamic range, and therefore, compared with a case using an output circuit of a full dynamic range, a low-power-consuming liquid crystal display can be assembled with an inexpensive, compact liquid crystal driving circuit.

Further, according to the above invention, power charged to the liquid crystal pixel can be collected to a voltage source having an intermediate voltage, so that it can be used for the other circuits or the liquid crystal driving circuit itself later. Consequently, a low-power-consuming liquid crystal display can be realized.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A differential amplifier for amplifying two kinds of input signals including a common mode input signal and a differential mode input signal, comprising:
   first and second amplifiers for amplifying said two kinds of input signals; and
   control means for selectively switching said two kinds of input signals to be inputted to said first and second amplifiers, said control means also outputting the common mode input signal amplified by one of said first and second amplifiers as a differential mode output signal and the differential mode input signal amplified by the other amplifier as a common mode output signal.

2. The differential amplifier of claim 1, wherein said control means includes:
   a first input switch for selecting one of a common mode input terminal to which the common mode input signal is inputted and a differential mode input terminal to which the differential mode input signal is inputted, so that one of said two kinds of input signals is inputted to said first amplifier circuit;
   a second input switch for selecting the other input terminal to input one of said two kinds of input signals to said second amplifier;
   a first output switch for selecting an output from said second amplifier while said first input switch is selecting said common mode input terminal, so that said common mode output signal is outputted from a common mode output terminal, and while said first input switch is selecting said differential mode input terminal, said first output switch selecting an output from said first amplifier, so that said common mode signal is outputted from said common mode output terminal; and
   a second output switch for selecting an output from said first amplifier while said first input switch is selecting said common mode input terminal, so that said differential mode output signal is outputted from said differential mode output terminal, and while said first input switch is selecting said differential mode input terminal, said second output switch selecting an output from said second amplifier, so that said differential mode signal is outputted from said differential mode output terminal.

3. The differential amplifier of claim 1, wherein:
   each of said first and second amplifiers includes one input MOS transistor, the input MOS transistors of said first and second amplifiers forming a pair of source-coupled input MOS transistors;
   a gate of each of said input MOS transistors receives said two kinds of input signals; and
   a drain of each of said input MOS transistors is connected to a load element used as a load.

4. The differential amplifier of claim 3, wherein said load element is a resistor connected to the drain of each of said input MOS transistors.

5. The differential amplifier of claim 3, wherein each of said load elements is composed of a MOS transistor, and the MOS transistors of said load elements are connected to each other to form a current mirror structure.

6. The differential amplifier of claim 5, wherein said control means includes:
   a first input switch for selecting one of a common mode input terminal to which the common mode input signal is inputted and a differential mode input terminal to which the differential mode input signal is inputted, so that one of said two kinds of input signals is inputted to said first amplifier circuit;
   a second input switch for selecting the other input terminal to input one of said two kinds of input signals to said second amplifier;
   a first output switch for selecting an output from said second amplifier while said first input switch is selecting said common mode input terminal, so that said common mode output signal is outputted from a common mode output terminal, and while said first input switch is selecting said differential mode input terminal, said first output switch selecting an output from said first amplifier, so that said common mode signal is outputted from said common mode output terminal; and
   a second output switch for selecting an output from said first amplifier while said first input switch is selecting said common mode input terminal, so that said differential mode output signal is outputted from said differential mode output terminal, and while said first input switch is selecting said differential mode input terminal, said second output switch selecting an output from said second amplifier, so that said differential mode signal is outputted from said differential mode output terminal, and wherein the gates of said MOS transistors of the current mirror structure are connected to said common mode output terminal.

7. The differential amplifier as set forth in claim 1, wherein said control means alternatively selects one of said first and second amplifiers, which receives the differential mode input signal.

8. An operational amplifier comprising:

an input circuit including a differential amplifier for amplifying two kinds of input signals including a common mode input signal and a differential mode input signal; and an output circuit of a CMOS structure for outputting a voltage based on an output from said input circuit, wherein said differential amplifier includes:

first and second amplifiers for amplifying said two kinds of input signals; and control means for selectively switching said two kinds of input signals to be inputted to said first and second amplifiers, said control means also outputting the common mode input signal amplified by one of said first and second amplifiers as a differential mode output signal and the differential mode input signal amplified by the other amplifier as a common mode output signal.

9. The operational amplifier of claim 8, wherein:

said first and second amplifiers are composed of a pair of source-coupled input MOS transistors; and a power source is provided to a source of one of MOS transistors in an output stage of said output circuit having a same channel of said input MOS transistors, said power source outputting a voltage which is higher than a ground potential and lower than an operating power source voltage of said operational amplifier.

10. The operational amplifier of claim 9, wherein an output from said output circuit is fed back as the differential mode input signal, so that said operational amplifier is used as a voltage follower circuit.

11. The operational amplifier of claim 9, wherein each of said MOS transistors in the output stage is an enhancement mode MOS transistor.

12. The operational amplifier of claim 8, wherein said control means includes:

a first input switch for selecting one of a common mode input terminal to which the common mode input signal is inputted and a differential mode input terminal to which the differential mode input signal is inputted, so that one of said two kinds of input signals is inputted to said first amplifier circuit;

a second input switch for selecting the other input terminal to input one of said two kinds of input signals to said second amplifier;

a first output switch for selecting an output from said second amplifier while said first input switch is selecting said common mode input terminal, so that said common mode output signal is outputted from a common mode output terminal, and while said first input switch is selecting said differential mode input terminal, said first output switch selecting an output from said first amplifier, so that said common mode signal is outputted from said common mode output terminal; and a second output switch for selecting an output from said first amplifier while said first input switch is selecting said common mode input terminal, so that said differential mode output signal is outputted from said differential mode output terminal, and while said first input switch is selecting said differential mode input terminal, said second output switch selecting an output from said second amplifier, so that said differential mode signal is outputted from said differential mode output terminal.

13. The operational amplifier of claim 8, wherein:

each of said first and second amplifiers includes one input MOS transistor, the input MOS transistors of said first and second amplifiers forming a pair of source-coupled input MOS transistors;

a gate of each of said input MOS transistors receives said two kinds of input signals; and a drain of each of said input MOS transistors is connected to a load element used as a load.

14. The operational amplifier of claim 13, wherein said load element is a resistor connected to the drain of each of said input MOS transistors.

15. The operational amplifier of claim 13, wherein each of said load elements is composed of a MOS transistor, and the MOS transistors of said load elements are connected to each other to form a current mirror structure.

16. The operational amplifier of claim 15, wherein said control means includes:

a first input switch for selecting one of a common mode input terminal to which the common mode input signal is inputted and a differential mode input terminal to which the differential mode input signal is inputted, so that one of said two kinds of input signals is inputted to said first amplifier circuit;

a second input switch for selecting the other input terminal to input one of said two kinds of input signals to said second amplifier;

a first output switch for selecting an output from said second amplifier while said first input switch is selecting said common mode input terminal, so that said common mode output signal is outputted from a common mode output terminal, and while said first input switch is selecting said differential mode input terminal, said first output switch selecting an output from said first amplifier, so that said common mode signal is outputted from said common mode output terminal; and a second output switch for selecting an output from said first amplifier while said first input switch is selecting said common mode input terminal, so that said differential mode output signal is outputted from said differential mode output terminal, and while said first input switch is selecting said differential mode input terminal, said second output switch selecting an output from said second amplifier, so that said differential mode signal is outputted from said differential mode output terminal, and wherein the gates of said MOS transistors of the current mirror structure are connected to said common mode output terminal.

17. The operational amplifier as set forth in claim 8, wherein said control means alternatively selects one of said first and second amplifiers, which receives the differential mode input signal.

18. A liquid crystal driving circuit having an operational amplifier for amplifying an input liquid crystal driving voltage, comprising output alternating switching means for converting an amplified liquid crystal driving voltage to an alternating voltage by switching a polarity of said amplified liquid crystal driving voltage with a switching action of an output from said operational amplifier, wherein said operational amplifier includes:

an input circuit including a differential amplifier for amplifying two kinds of input signals including a common mode input signal and a differential mode input signal; and an output circuit of a CMOS structure for outputting a voltage based on an output from said input circuit, wherein said differential amplifier includes:

first and second amplifiers for amplifying said two kinds of input signals; and control means for selectively switching said two kinds of input signals to be inputted to said first and second amplifiers, said control means also outputting the common mode input signal amplified by one of said first and second amplifiers as a differential mode output signal and the differential mode input signal amplified by the other amplifier as a common mode output signal.

19. The liquid crystal driving circuit of claim 18, further comprising:

at least one output terminal of a first group;

an output terminal of a second group, provided in a matching number with the output terminal of said first group, for outputting a voltage of a polarity different from a polarity of a voltage simultaneously outputted from the output terminal of said first group;

a positive operational amplifier, provided in a matching number with the output terminal of said first group and corresponding to one output terminal of said first group and one output terminal of said second group, for amplifying a positive liquid crystal driving voltage; and a negative operational amplifier, provided in a matching number with the output terminal of said first group and corresponding to one output terminal of said first group and one output terminal of said second group, for amplifying a negative liquid crystal driving voltage, said positive and negative operational amplifiers being provided as said operational amplifier, wherein said output alternating switching means selects one of following actions:

(1) to connect said positive operational amplifier to the output terminal of said first group individually and connect said negative operational amplifier to the output terminal of said second group individually; and (2) to connect said negative operational amplifier to the output terminal of said first group individually and connect said positive operational amplifier to the output terminal of said second group individually.

20. The liquid crystal driving circuit of claim 19, wherein:

said first and second amplifiers are composed of a pair of source-coupled input MOS transistors; and a power source is provided to a source of one of MOS transistors in an output stage of said output circuit having a same channel as said input MOS transistors, said power source outputting a voltage which is higher than a ground potential and lower than an operating power source voltage of said operational amplifier, said power source being used commonly by said positive operational amplifier and negative operational amplifier.

21. The liquid crystal driving circuit of claim 19, wherein:

said first and second amplifiers are composed of a pair of source-coupled input MOS transistors;

a source of one of MOS transistors in an output stage of said output circuit having a same channel of said input MOS transistors is connected to a counter electrode voltage line to which said counter electrode voltage is applied so as to be applied further to said counter electrode of said liquid crystal panel; and said counter electrode voltage line is used commonly by said positive operational amplifier and negative operational amplifier.

22. The liquid crystal driving circuit of claim 18, wherein:

said first and second amplifiers are composed of a pair of source-coupled input MOS transistors; and a power source is provided to a source of one of MOS transistors in an output stage of said output circuit having a same channel of said input MOS transistors, said power source outputting a voltage which is higher than a ground potential and lower than an operating power source voltage of said operational amplifier.

23. The liquid crystal driving circuit of claim 22, wherein an output from said output circuit is fed back as the differential mode input signal, so that said operational amplifier is used as a voltage follower circuit.

24. The liquid crystal driving circuit of claim 22, wherein each of said MOS transistors in the output stage is an enhancement mode MOS transistor.

25. The liquid crystal driving circuit of claim 18, further comprising switching means for selectively switching the liquid crystal driving voltage and a counter electrode voltage applied to a counter electrode of a liquid crystal panel to be supplied to said differential amplifier of said operational amplifier, wherein:

said first and second amplifiers are composed of a pair of source-coupled input MOS transistors;

said counter electrode voltage is applied to a source of one of MOS transistors in an output stage of said output circuit having a same channel of said input MOS transistors; and said output alternating switching means converts the amplified liquid crystal driving voltage to an alternating voltage by switching the polarity of said amplified liquid crystal driving voltage in such a manner that, when said counter electrode voltage is inputted to said differential amplifier by said switching means, charges migrate between adjacent load capacitances in said liquid crystal panel and said counter electrode voltage, and when said liquid crystal driving voltage is inputted to said differential amplifier by said switching means, the charges migrate between the adjacent load capacitances and an operating power source of said operational amplifier.

26. The liquid crystal driving circuit of claim 25, wherein said switching means includes:

a driving voltage output circuit for outputting said liquid crystal driving voltage; and a switch for selecting one of an output from said driving voltage output circuit and a counter electrode voltage line to which said counter electrode voltage is applied.

27. The liquid crystal driving circuit of claim 18, wherein a cycle at which said control means selectively switches said two kinds of input signal is set to an even multiple of a cycle at which said output alternating switching means switches the polarity of the amplified liquid crystal driving voltage.

28. The liquid crystal driving circuit of claim 18, wherein said control means includes:

a first input switch for selecting one of a common mode input terminal to which the common mode input signal is inputted and a differential mode input terminal to which the differential mode input signal is inputted to input one of said two kinds of input signals to said first amplifier circuit;

a second input switch for selecting the other input terminal to input one of said two kinds of input signals to said second amplifier;

a first output switch for selecting an output from said second amplifier while said first input switch is selecting said common mode input terminal, so that said common mode output signal is outputted from a common mode output terminal, and while said first input switch is selecting said differential mode input terminal, said first output switch selecting an output from said first amplifier, so that said common mode signal is outputted from said common mode output terminal; and a second output switch for selecting an output from said first amplifier while said first input switch is selecting said common mode input terminal, so that said differential mode output signal is outputted from said differential mode output terminal, and while said first input switch is selecting said differential mode input terminal, said second output switch selecting an output from said second amplifier, so that said differential mode signal is outputted from said differential mode output terminal.

29. The liquid crystal driving circuit of claim 18, wherein:

each of said first and second amplifiers includes one input MOS transistor, the input MOS transistors of said first and second amplifiers forming a pair of source-coupled input MOS transistors;

a gate of each of said input MOS transistors receives said two kinds of input signals; and a drain of each of said input MOS transistors is connected to a load element used as a load.

30. The liquid crystal driving circuit of claim 29, wherein said load element is a resistor connected to the drain of each of said input MOS transistors.

31. The liquid crystal driving circuit of claim 29, each of said load elements is composed of a MOS transistor, and the MOS transistors of said load elements are connected to each other to form a current mirror structure.

32. The liquid crystal driving circuit of claim 31, wherein said control means includes:

a first input switch for selecting one of a common mode input terminal to which the common mode input signal is inputted and a differential mode input terminal to which the differential mode input signal is inputted to input one of said two kinds of input signals to said first amplifier circuit;

a second input switch for selecting the other input terminal to input one of said two kinds of input signals to said second amplifier;

a first output switch for selecting an output from said second amplifier while said first input switch is selecting said common mode input terminal, so that said common mode output signal is outputted from a common mode output terminal, and while said first input switch is selecting said differential mode input terminal, said first output switch selecting an output from said first amplifier, so that said common mode signal is outputted from said common mode output terminal; and a second output switch for selecting an output from said first amplifier while said first input switch is selecting said common mode input terminal, so that said differential mode output signal is outputted from said differential mode output terminal, and while said first input switch is selecting said differential mode input terminal, said second output switch selecting an output from said second amplifier, so that said differential mode signal is outputted from said differential mode output terminal, and wherein the gates of said MOS transistors of the current mirror structure are connected to said common mode output terminal.

33. The liquid crystal driving circuit as set forth in claim 18, wherein said control means alternatively selects one of said first and second amplifiers, which receives the differential mode input signal.

* * * * *